(12) United States Patent
Noda et al.

(10) Patent No.: US 7,851,296 B2
(45) Date of Patent: Dec. 14, 2010

(54) NONVOLATILE SEMICONDUCTOR MEMORY DEVICE

(75) Inventors: Kosei Noda, Kanagawa (JP); Nanae Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 326 days.

(21) Appl. No.: 12/076,522

(22) Filed: Mar. 19, 2008

(65) Prior Publication Data
US 2008/0230831 A1  Sep. 25, 2008

(30) Foreign Application Priority Data
Mar. 23, 2007 (JP) .............................. 2007-077930

(51) Int. Cl.
*H01L 21/8239* (2006.01)
*H01L 21/8247* (2006.01)

(52) U.S. Cl. .............................. 438/216; 257/E21.423; 438/791

(58) Field of Classification Search ................ 438/216, 438/591, 593, 791; 257/E21.423
See application file for complete search history.

(56) References Cited

U.S. PATENT DOCUMENTS

| | | | |
|---|---|---|---|
| 5,714,399 A * | 2/1998 | Hisatomi et al. ............. | 438/261 |
| 6,005,270 A | 12/1999 | Noguchi | |
| 6,388,291 B1 | 5/2002 | Zhang et al. | |
| 6,417,538 B1 | 7/2002 | Choi | |
| 6,433,361 B1 | 8/2002 | Zhang et al. | |
| 6,906,390 B2 | 6/2005 | Nomoto et al. | |
| 7,372,113 B2 * | 5/2008 | Tanaka et al. ............... | 257/411 |
| 7,510,935 B2 * | 3/2009 | Lee et al. .................... | 438/261 |
| 2003/0222318 A1 | 12/2003 | Tanaka et al. | |
| 2004/0070020 A1 | 4/2004 | Fujiwara et al. | |
| 2005/0145898 A1 * | 7/2005 | Nomoto et al. .............. | 257/288 |
| 2006/0118858 A1 | 6/2006 | Jeon et al. | |

(Continued)

FOREIGN PATENT DOCUMENTS

JP  53-057771  5/1978

(Continued)

OTHER PUBLICATIONS

Colinge, "Chapter 4: SOI CMOS Technology", Silicon-On Insulator Technology: Materials to VLSI $2^{nd}$ Edition, 1991, pp. 108-109.

(Continued)

*Primary Examiner*—Kenneth A Parker
*Assistant Examiner*—Paul A Budd
(74) *Attorney, Agent, or Firm*—Eric J. Robinson; Robinson Intellectual Property Law Office, P.C.

(57) ABSTRACT

A charge retention characteristic of a nonvolatile memory transistor is improved. A first insulating film that functions as a tunnel insulating film, a charge storage layer, and a second insulating film are sandwiched between a semiconductor substrate and a conductive film. The charge storage layer is formed of two silicon nitride films. A silicon nitride film which is a lower layer is formed using $NH_3$ as a nitrogen source gas by a CVD method and contains a larger number of N—H bonds than the upper layer. A second silicon nitride film which is an upper layer is formed using $N_2$ as a nitrogen source gas by a CVD method and contains a larger number of Si—H bonds than the lower layer.

25 Claims, 47 Drawing Sheets

U.S. PATENT DOCUMENTS

| | | | |
|---|---|---|---|
| 2007/0228420 A1 | 10/2007 | Takano et al. | |
| 2007/0228449 A1 | 10/2007 | Takano et al. | |
| 2007/0278563 A1 | 12/2007 | Takano et al. | |
| 2008/0083946 A1* | 4/2008 | Fang et al. | 257/324 |
| 2008/0182374 A1* | 7/2008 | Mori | 438/264 |

FOREIGN PATENT DOCUMENTS

| | | |
|---|---|---|
| JP | 60-060770 | 4/1985 |
| JP | 63-205965 | 8/1988 |
| JP | 03-009571 | 1/1991 |
| JP | 03-226068 | 10/1991 |
| JP | 06-314785 | 11/1994 |
| JP | 07-176753 | 7/1995 |
| JP | 08-018055 | 1/1996 |
| JP | 2000-058685 | 2/2000 |
| JP | 2002-203917 | 7/2002 |
| JP | 2004-247581 | 9/2004 |
| JP | 2006-013534 | 1/2006 |

OTHER PUBLICATIONS

International Search report (Application No. PCT/JP2008/055619) dated Jul. 1, 2008.
Written Opinion (Application No. PCT/JP2008/055619) dated Jul. 1, 2008.

* cited by examiner

FIG. 22A "0" WRITING
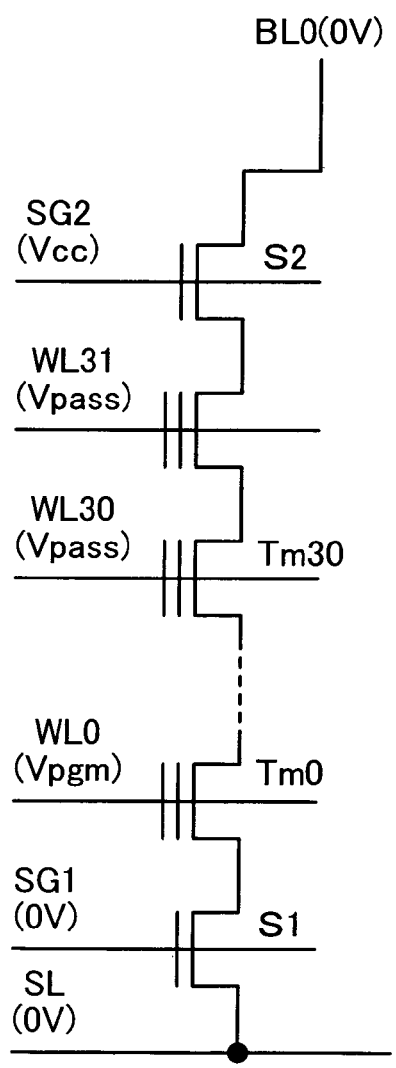
FIG. 22B "1" WRITING
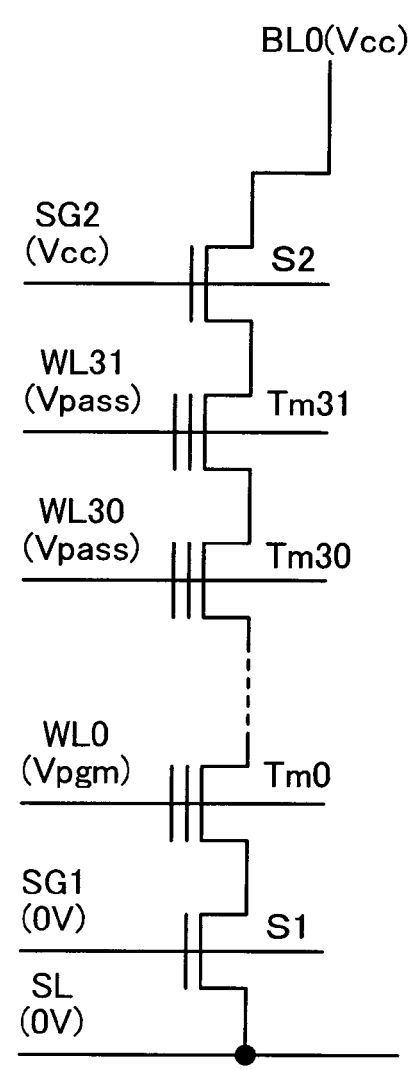

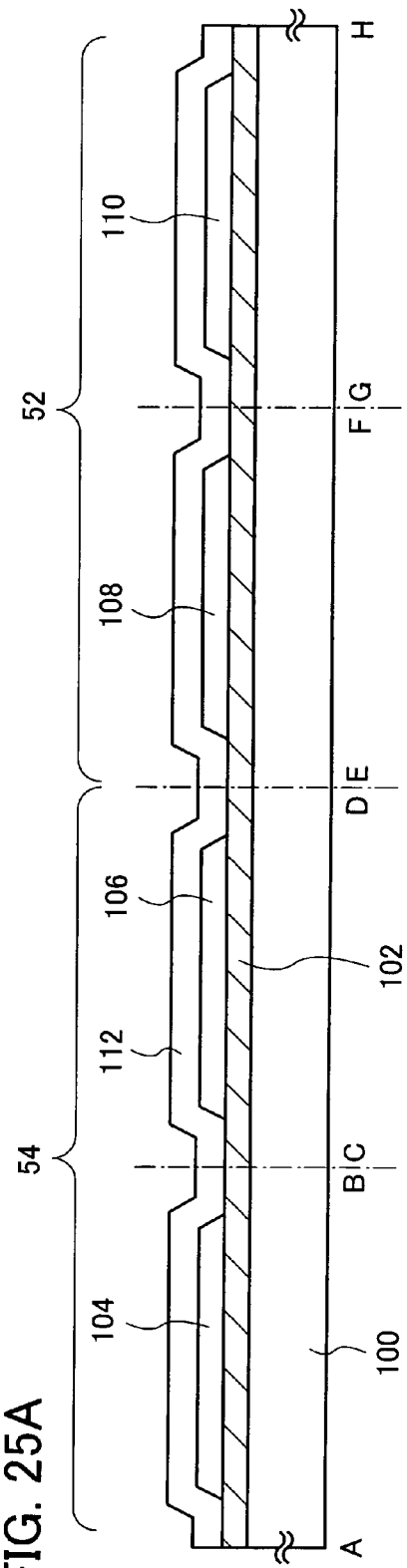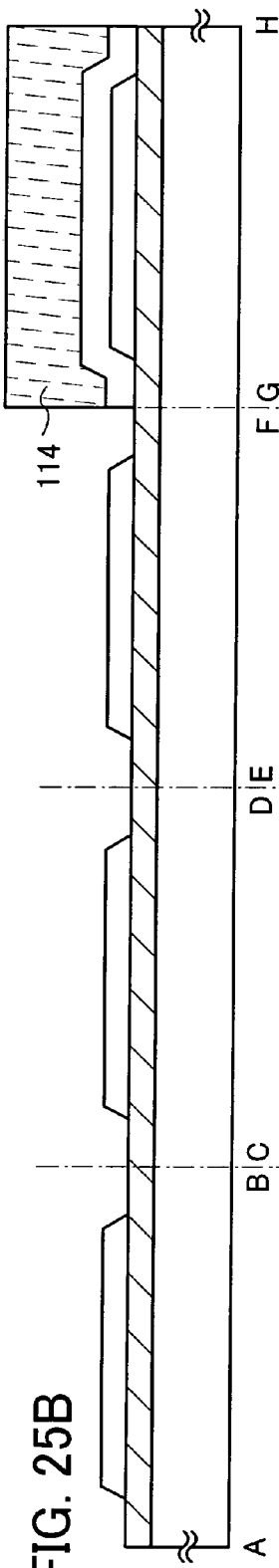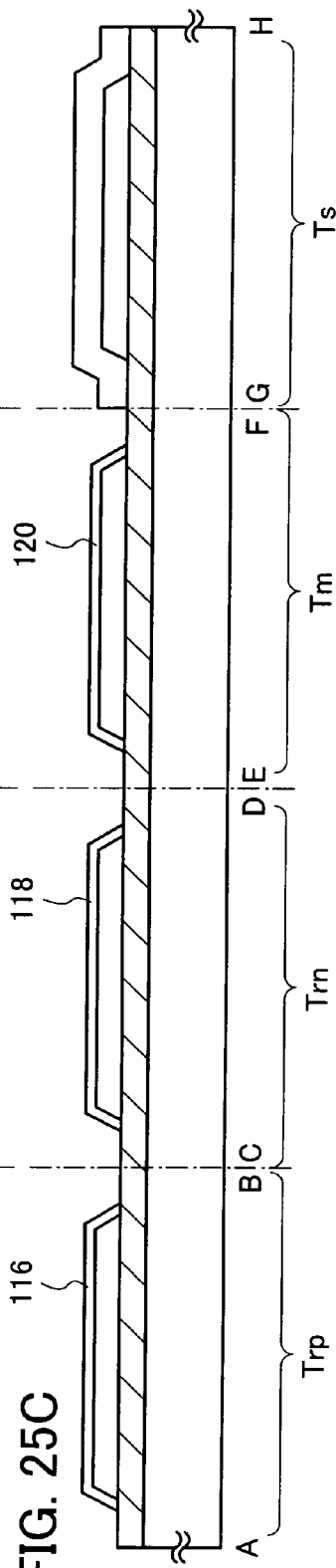

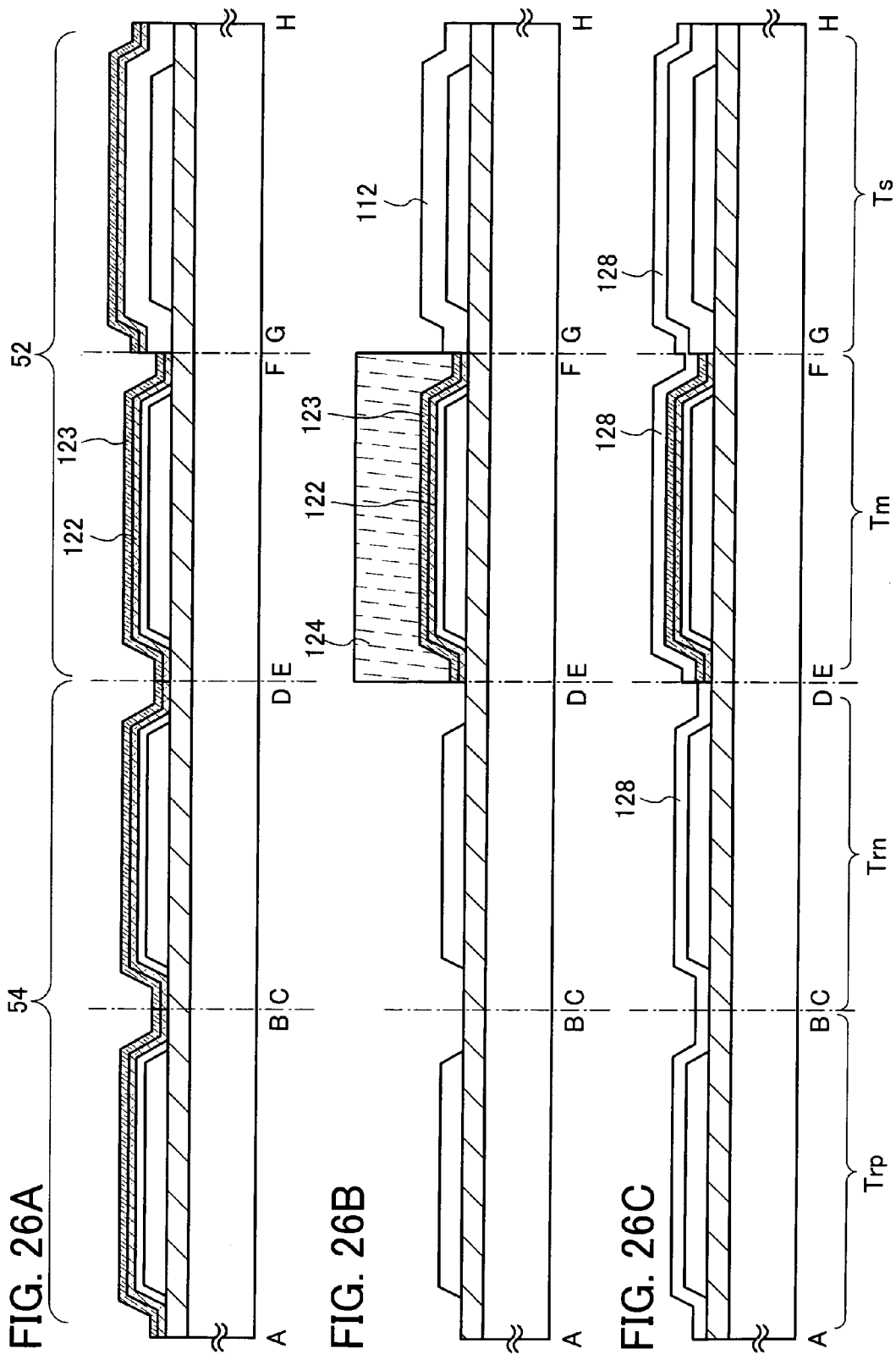

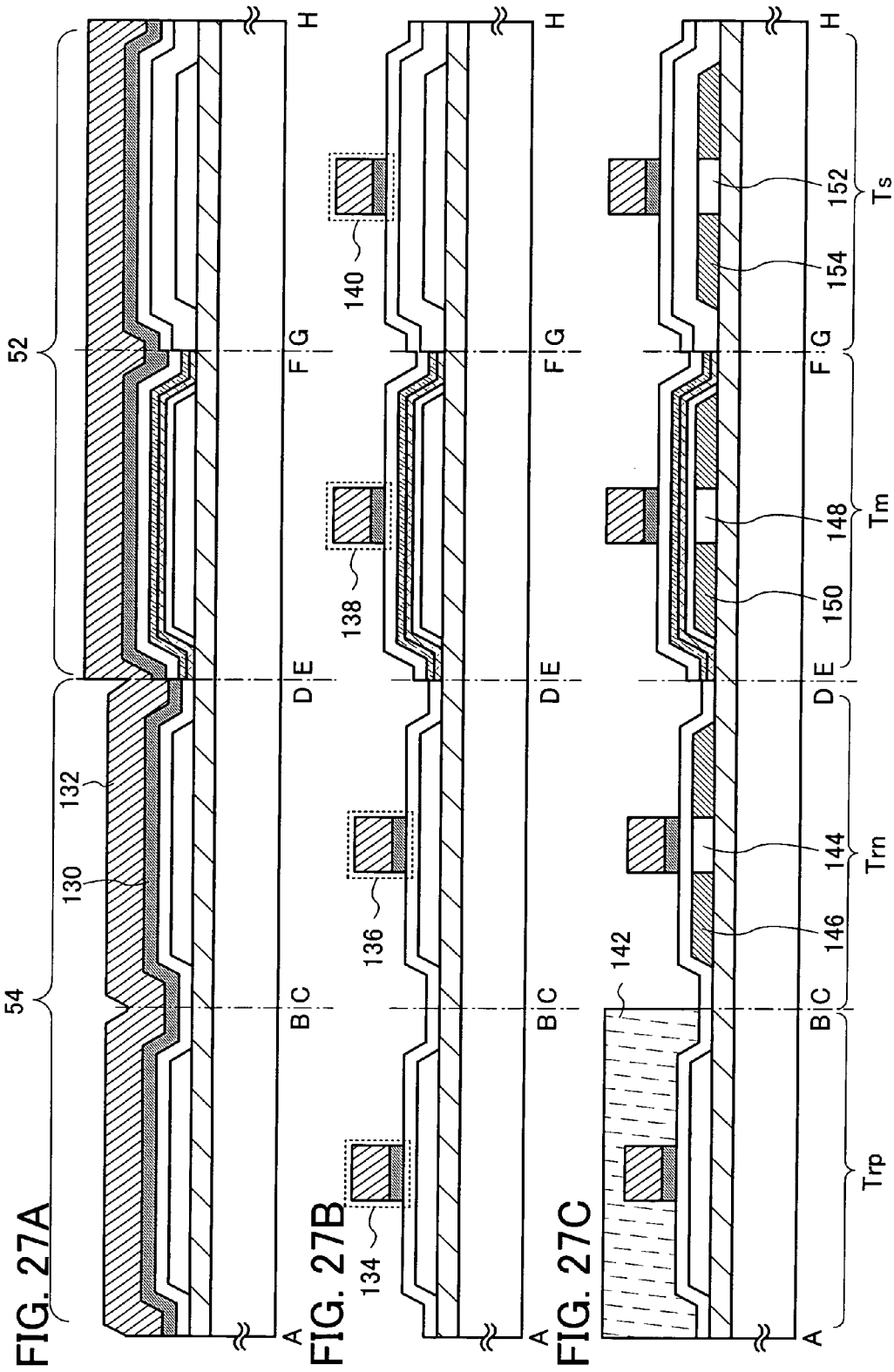

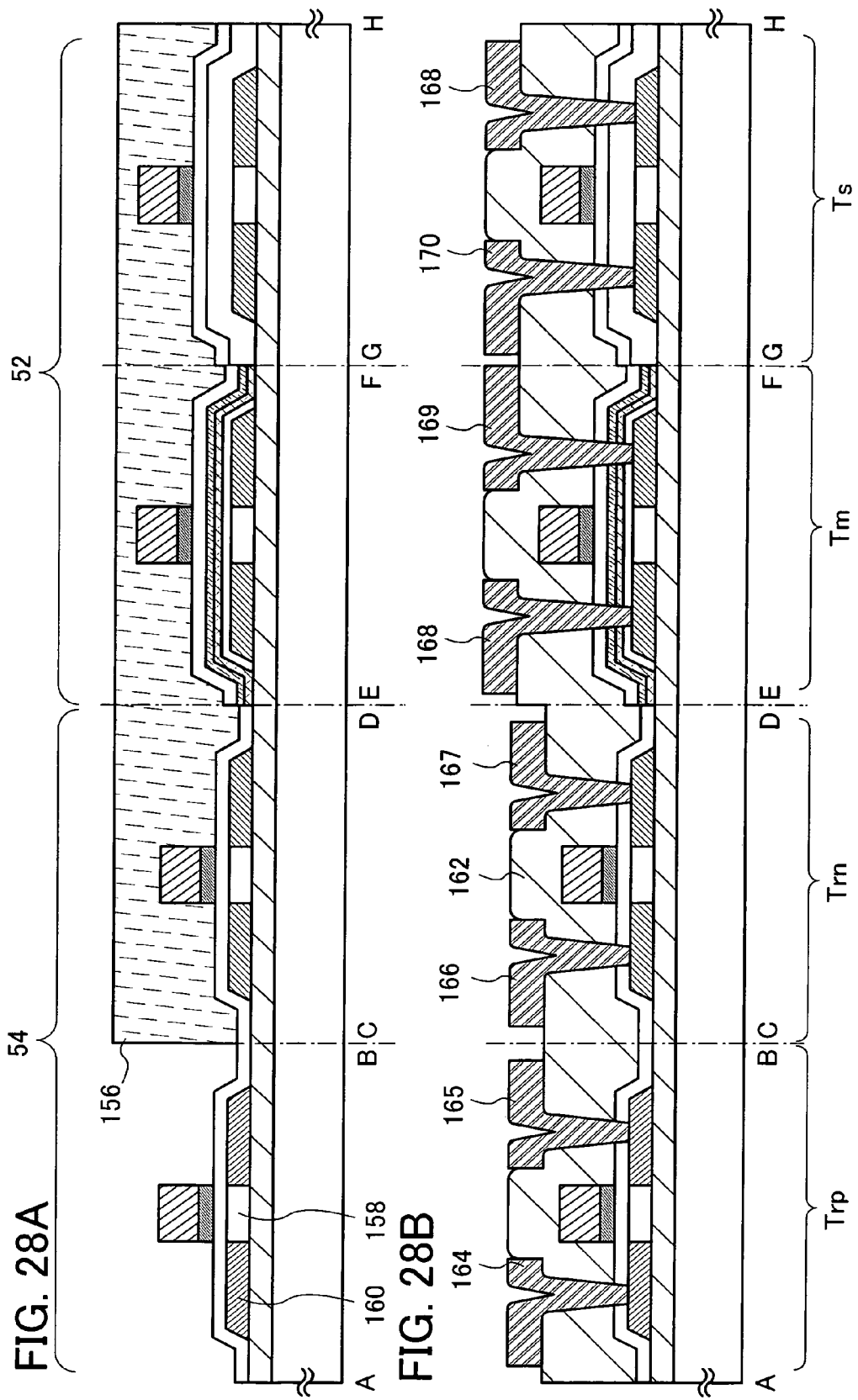

FIG. 29
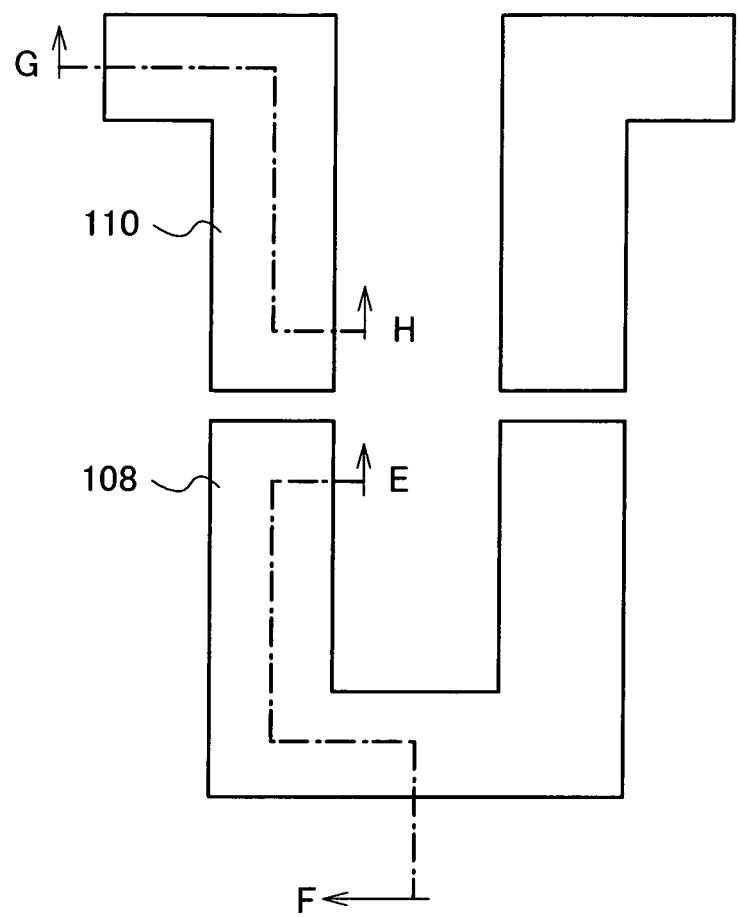
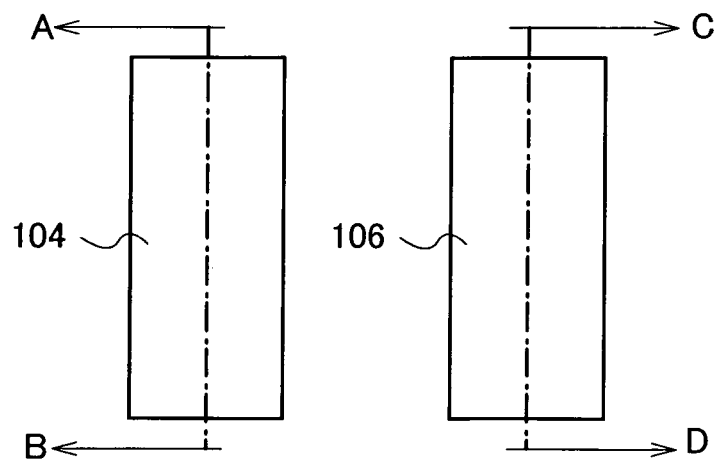

FIG. 30
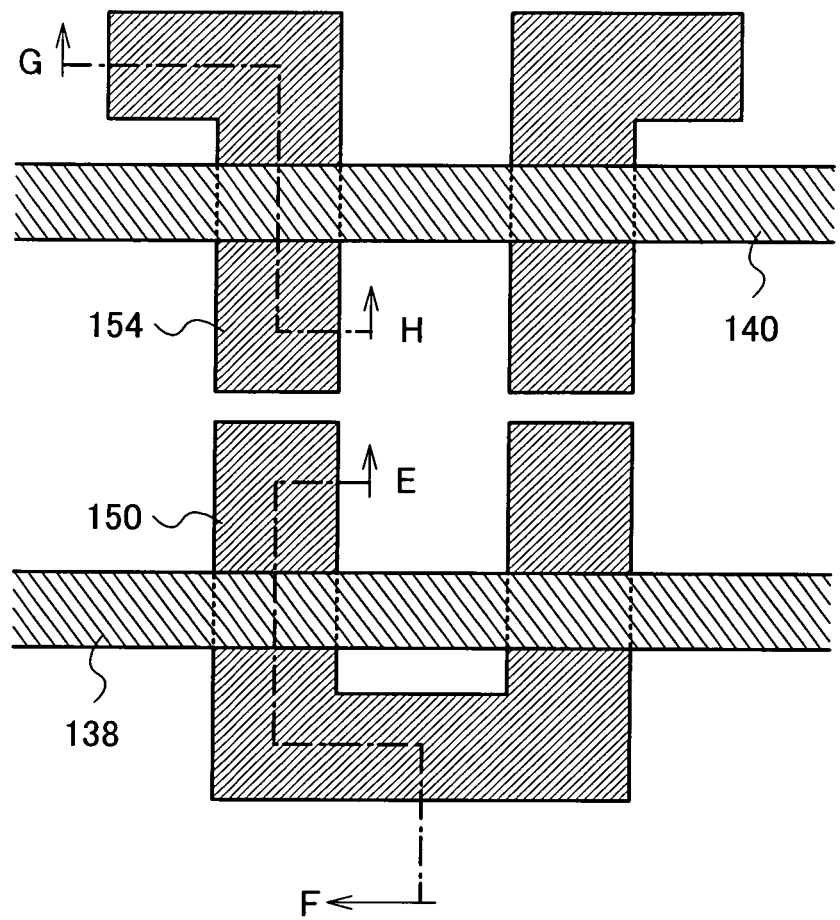
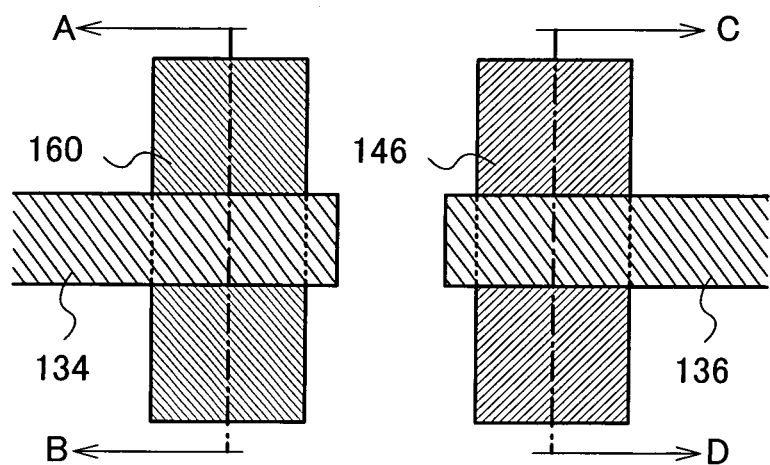

FIG. 31
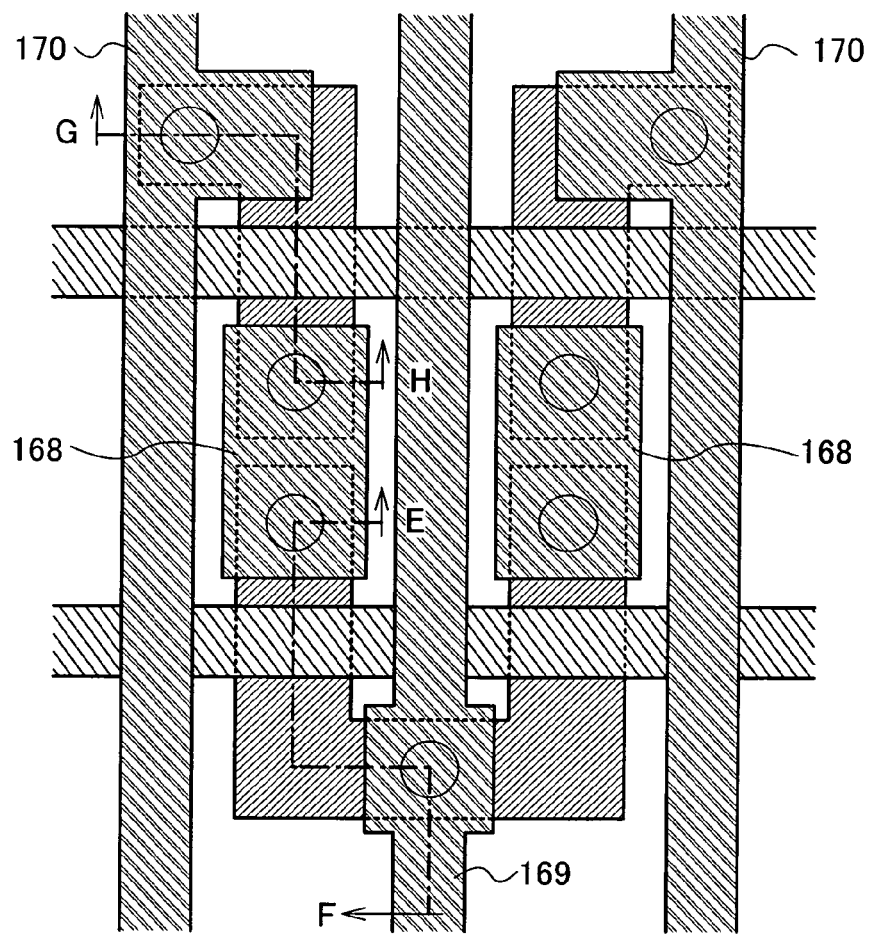
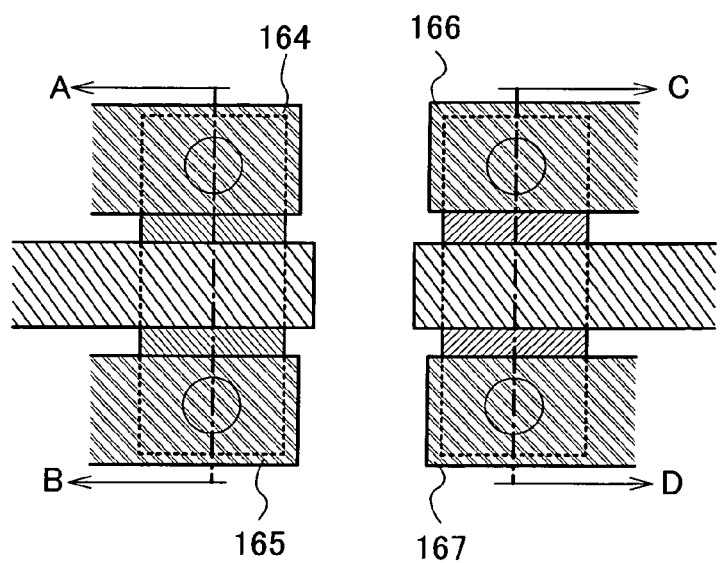

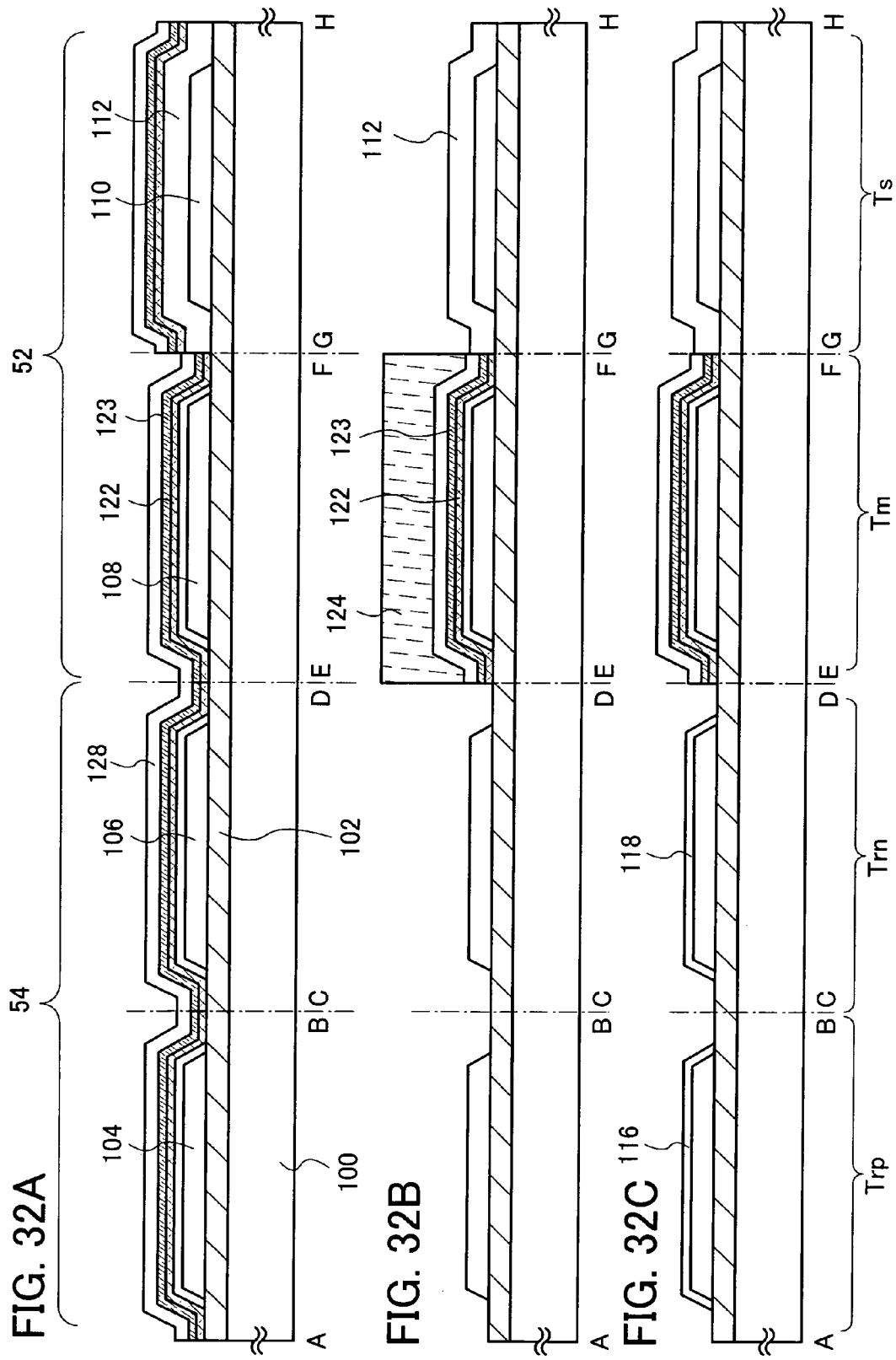

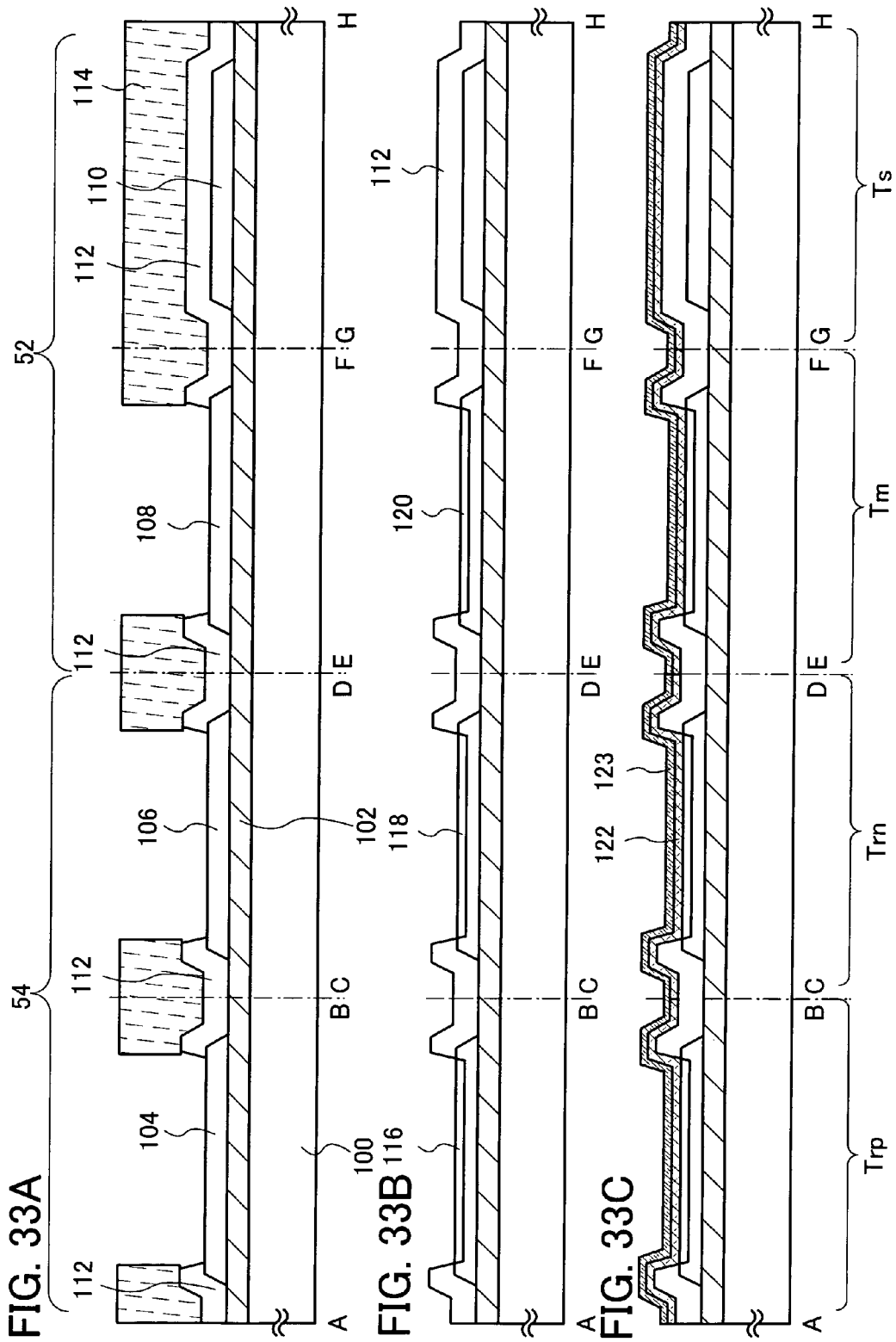

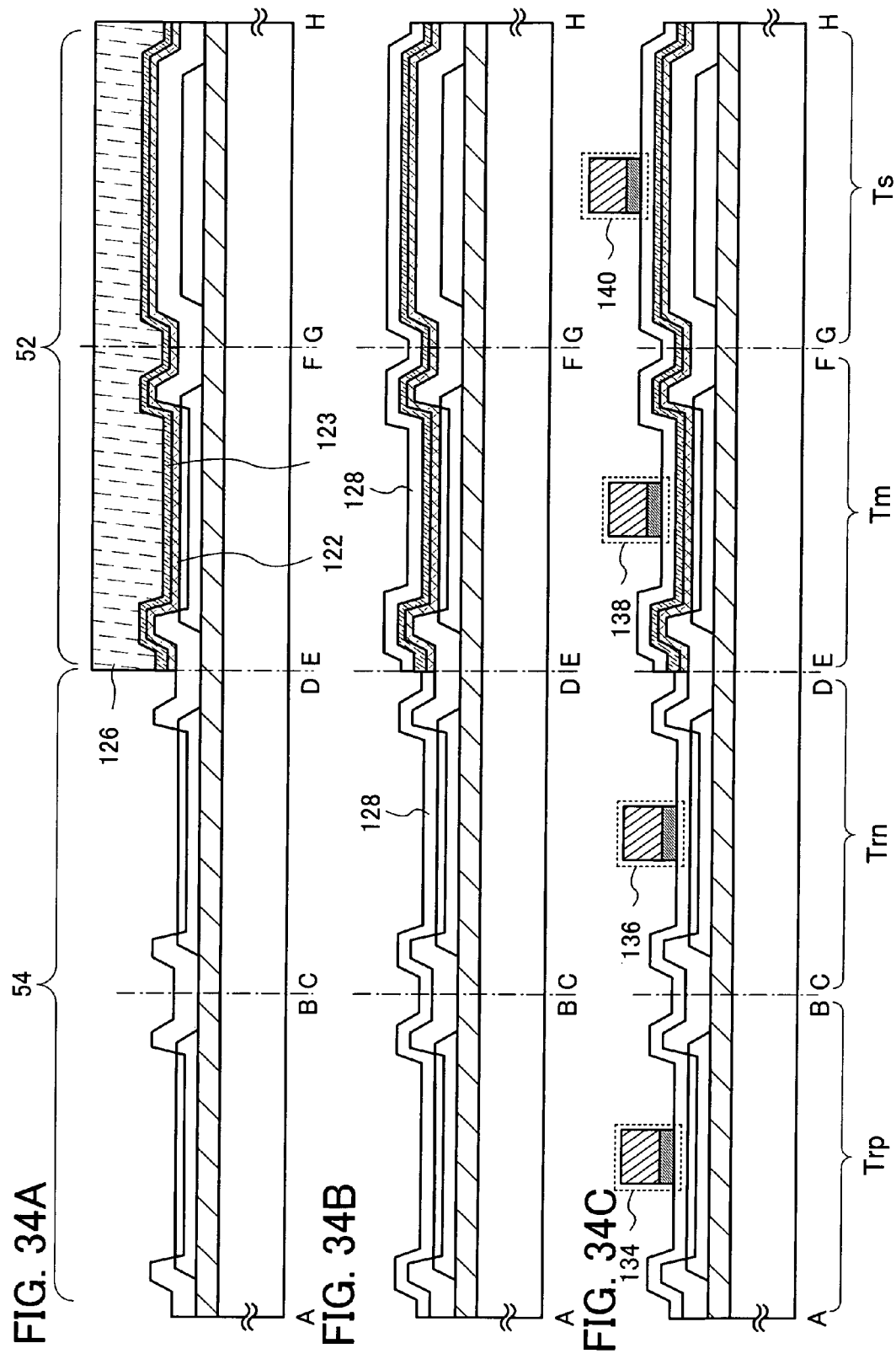

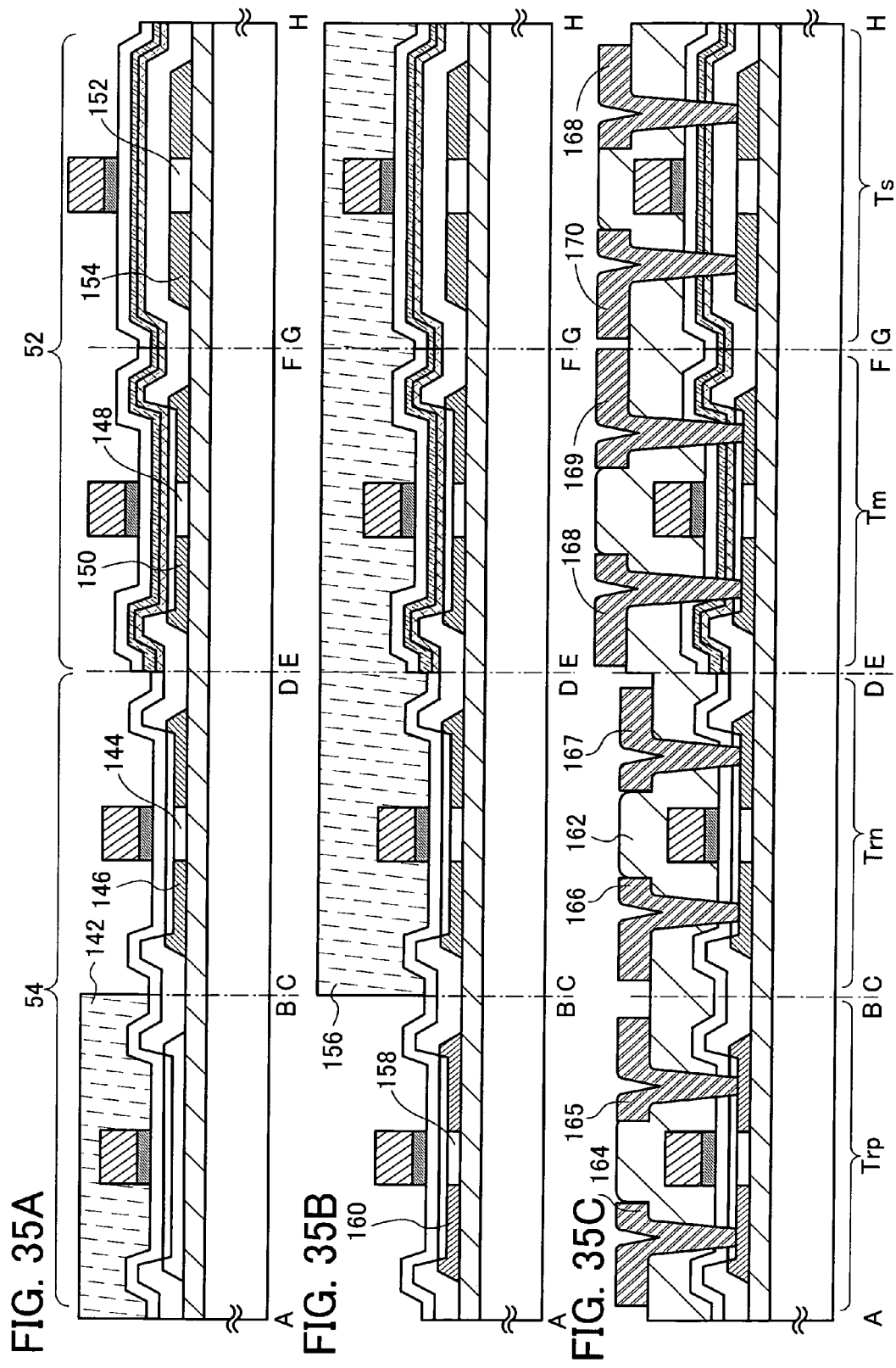

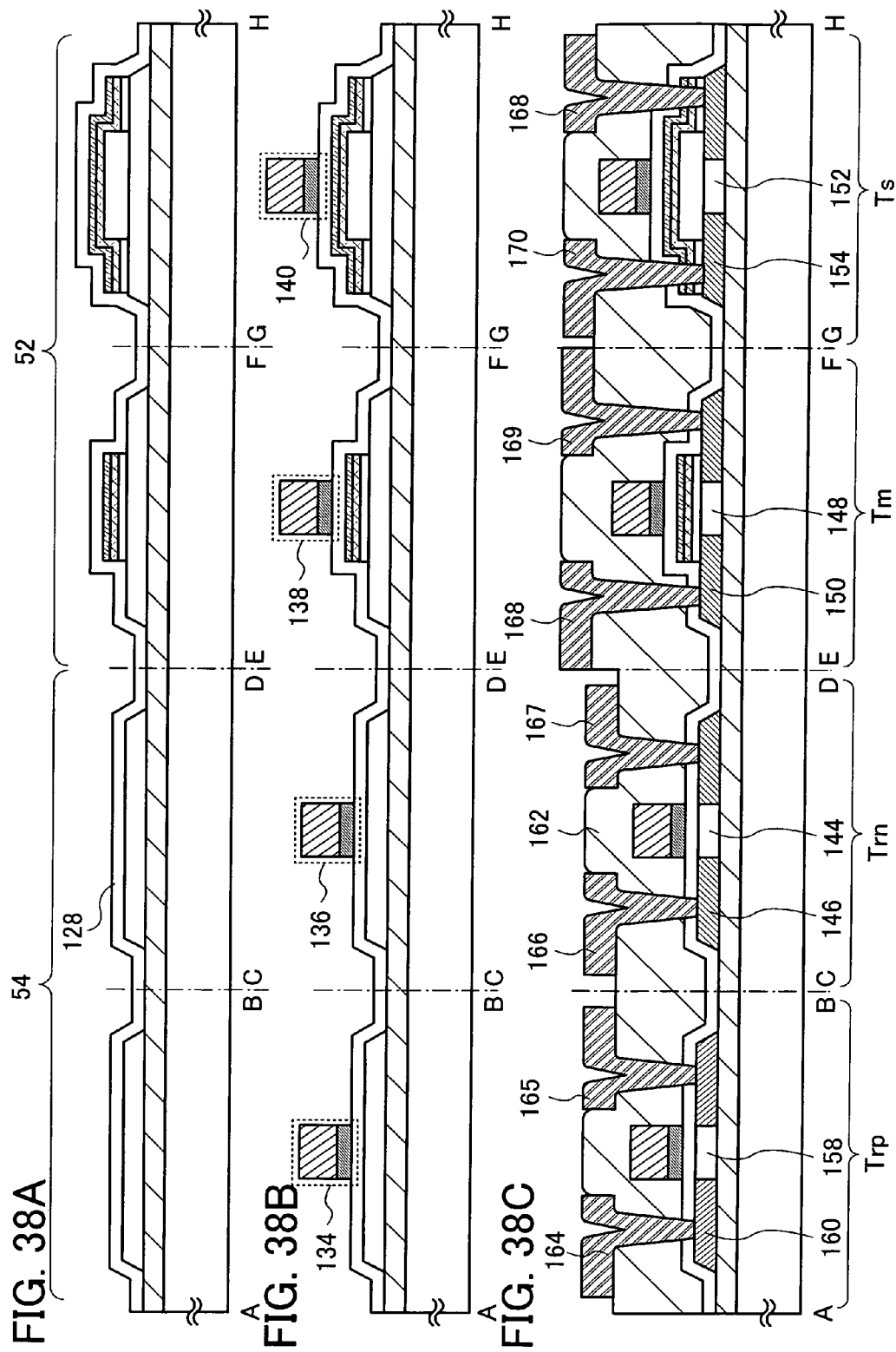

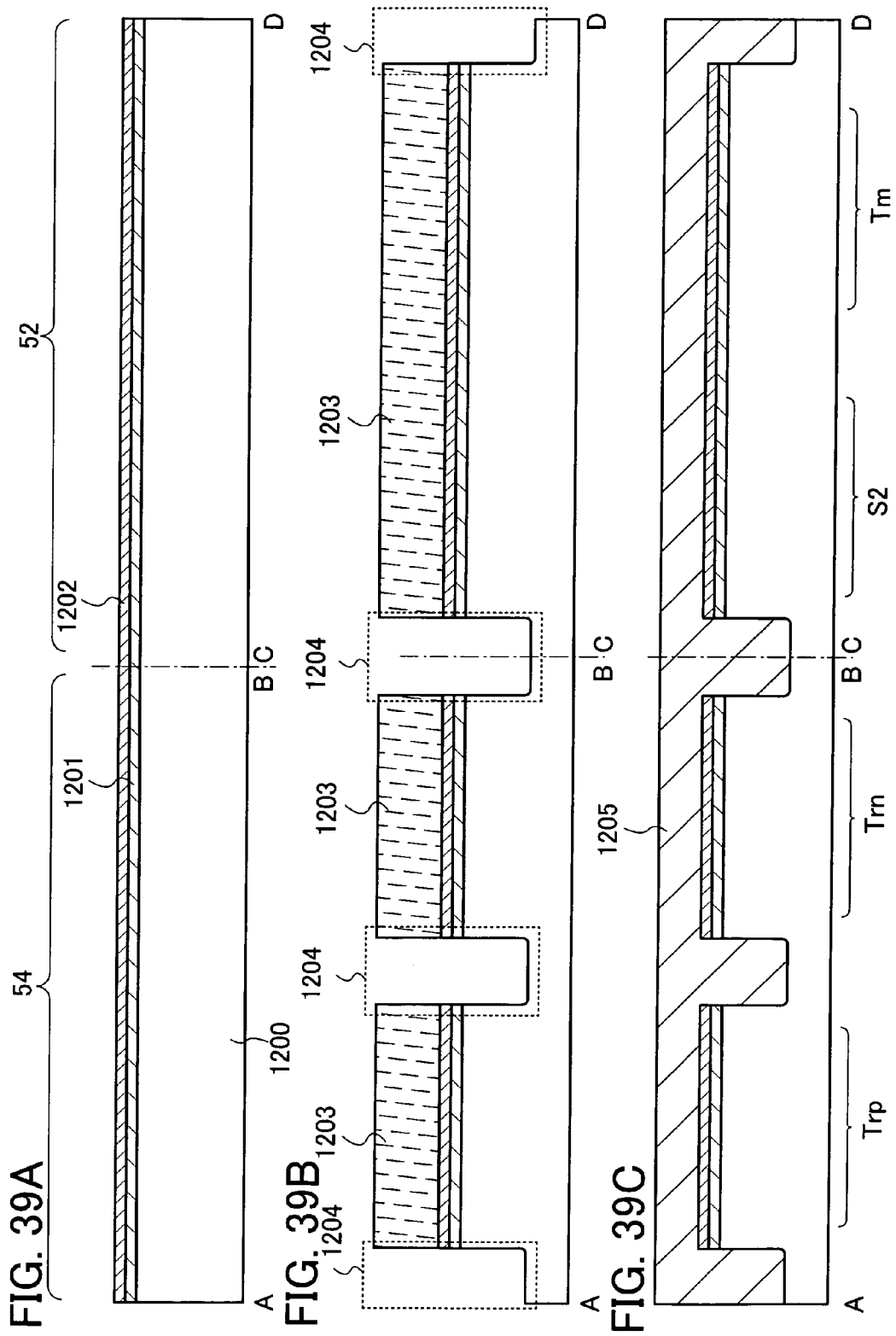

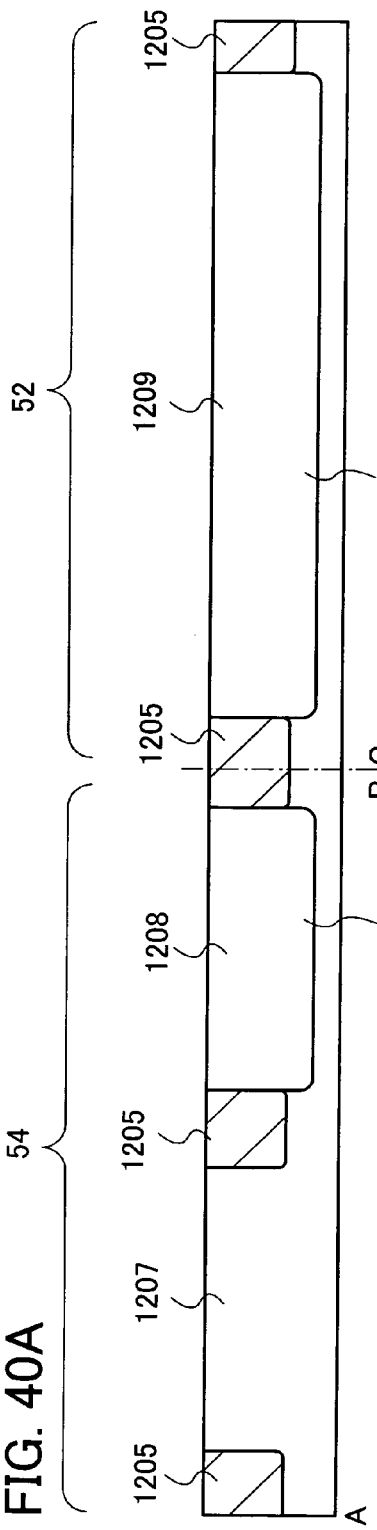
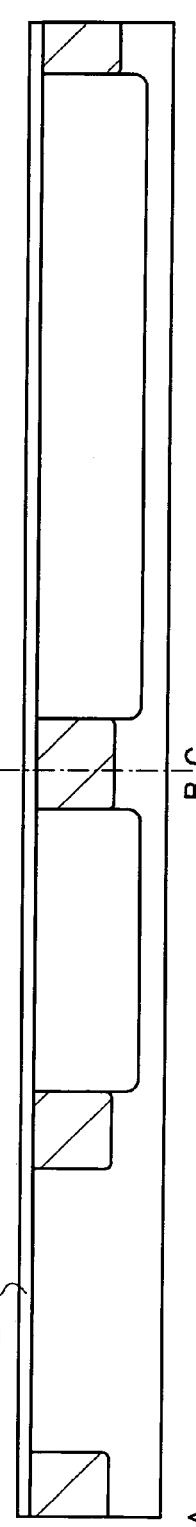
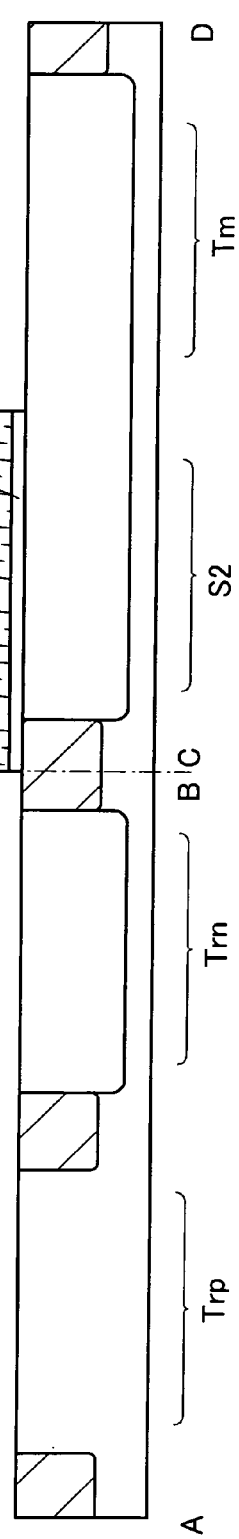

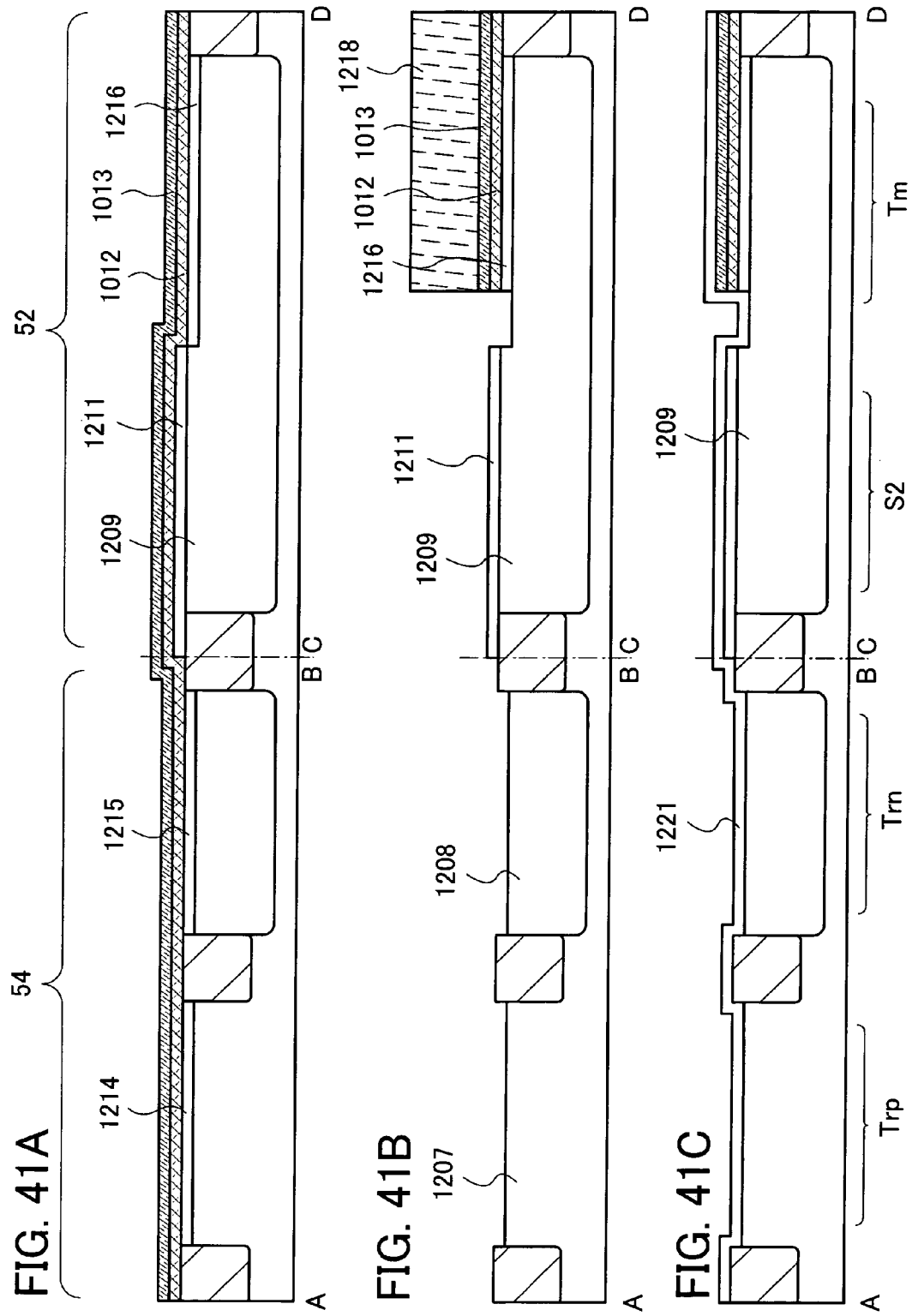

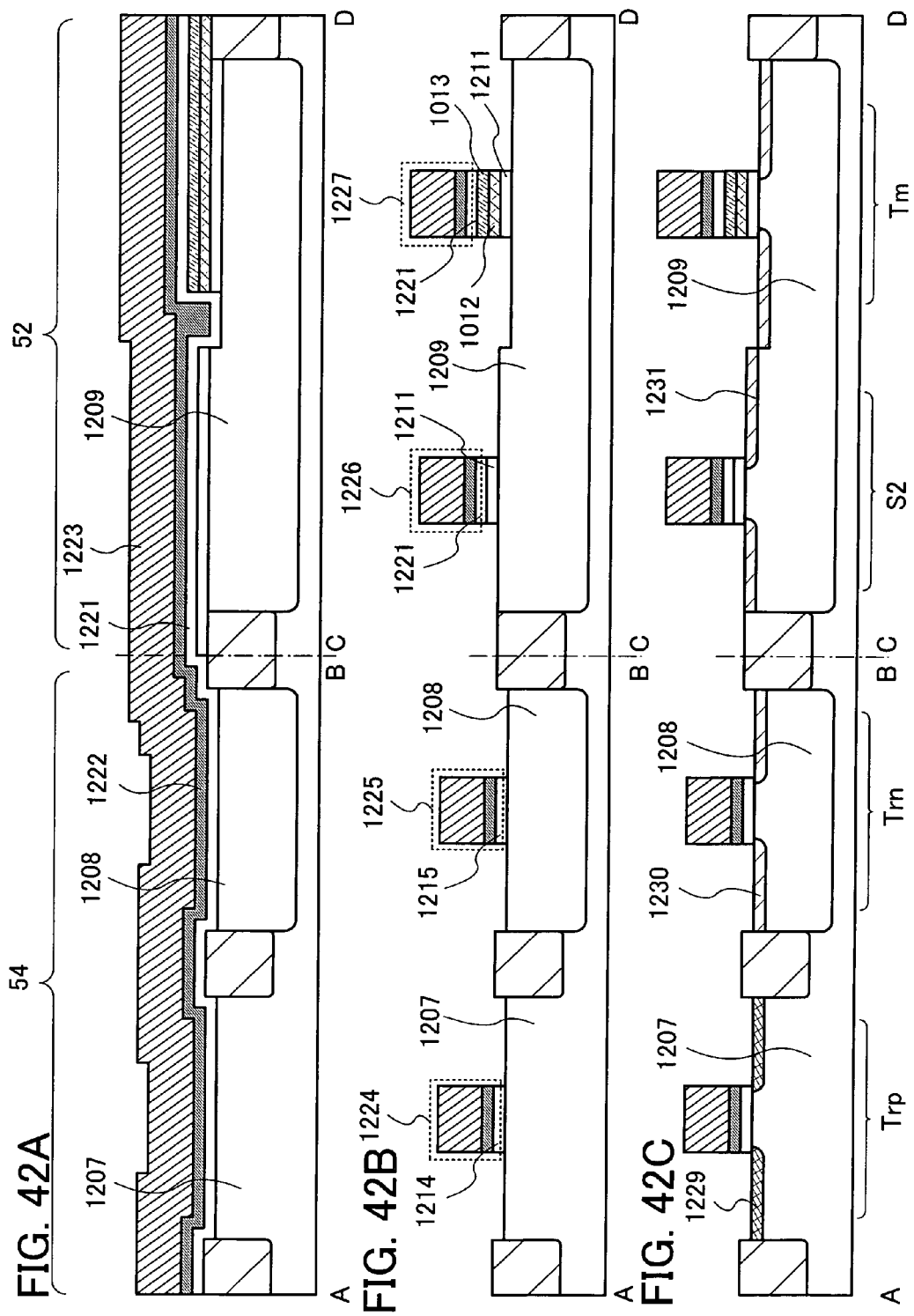

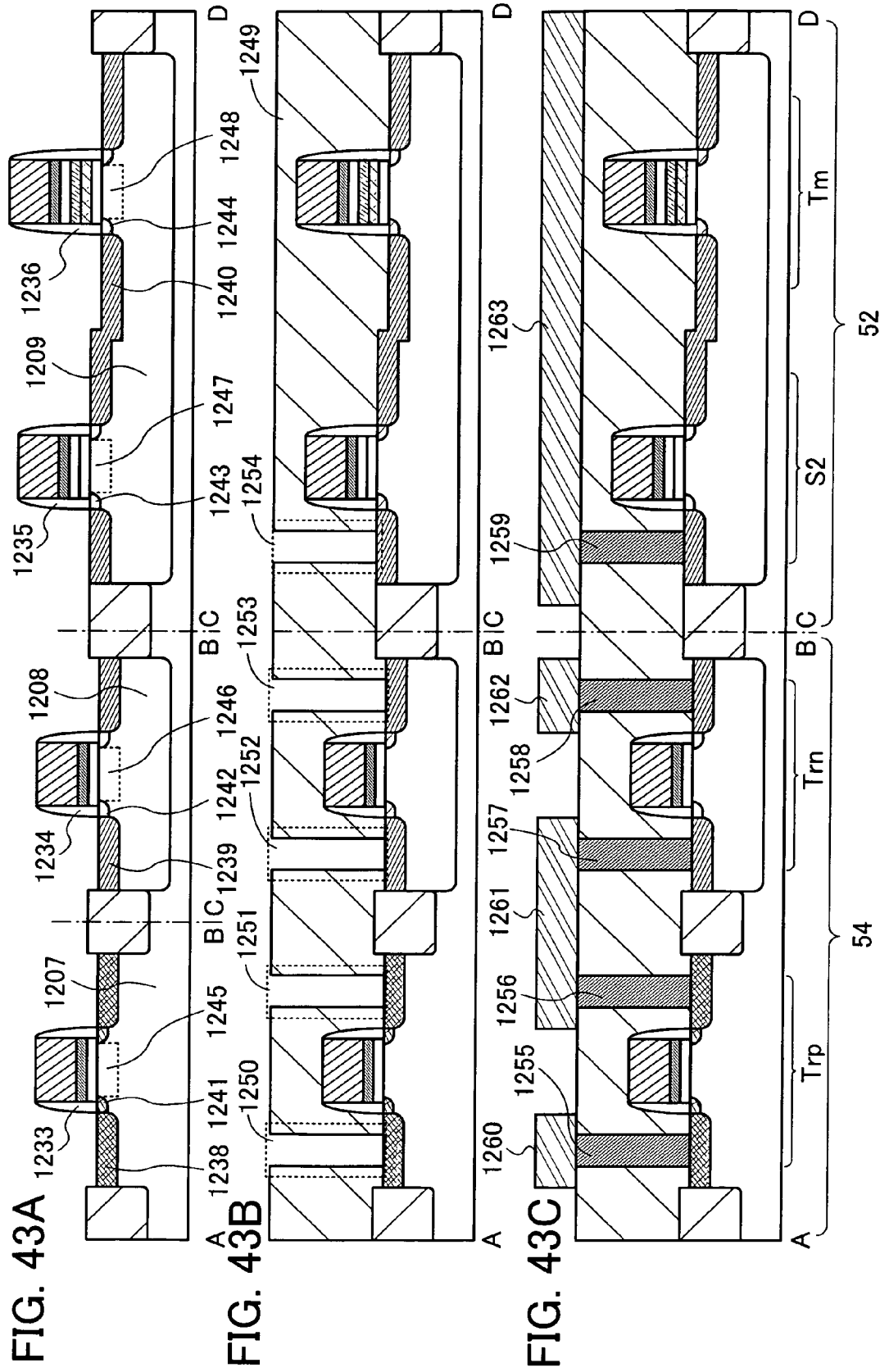

1263

1260  1261  1262

NONVOLATILE SEMICONDUCTOR MEMORY DEVICE

BACKGROUND OF THE INVENTION

1. Field of the Invention

The present invention relates to a semiconductor device having a nonvolatile semiconductor memory element capable of writing, reading, and erasing.

Note that a "semiconductor device" in this specification refers to a general device that can function using semiconductor characteristics, and electro-optical devices, semiconductor circuits, and electronic devices can all be considered semiconductor devices.

2. Description of the Related Art

A nonvolatile semiconductor memory element is a semiconductor element capable of electrically rewriting and storing data even when a power supply is turned off. As the nonvolatile semiconductor memory element, nonvolatile memory transistors having a structure similar to that of a metal oxide semiconductor field effect transistor (MOSFET) are classified into two major groups in terms of charge storage means. One is a floating gate (FG) type in which a charge storage unit is formed of a conductive layer between a channel formation region and a gate electrode; the other is a metal-oxide-nitride-oxide-silicon (MONOS) type and a metal-nitride-oxide-silicon (MNOS) type each of which uses a charge trapping layer as a charge storage means.

In many of the MONOS memory transistors and the MNOS memory transistors, a silicon nitride film that contains many charge traps is used as a charge storage means. In order to improve charge retention characteristics of the MONOS memory transistors and the MNOS memory transistors, silicon nitride films have been researched.

For example, improvement in retention characteristics of a memory transistor by provision of a silicon nitride film having a two-layer structure including different compositions or composition ratios is described in References 1 to 4. Improvement in retention characteristics by provision of a silicon nitride film having a three-layer structure including different composition ratios is formed is described in Reference 5.

In Reference 1 (Japanese Examined Patent Application Publication No. H2-59632), a silicon nitride film containing Si—H bonds is formed as a lower layer, and a silicon nitride film which hardly contains Si—H bonds is formed as an upper layer. A silicon nitride film having such a two-layer structure is formed by a CVD method in which $SiH_4$ and $NH_3$ are used as source materials, providing that a formation temperature when a silicon nitride film is formed as a lower layer is set at 700° C. to 900° C. and a formation temperature when a silicon nitride film is formed as an upper layer is set at 900° C. or higher.

In Reference 2 (Japanese Examined Patent Application Publication No. S59-24547), a silicon nitride film which contains a lot of Si is formed as a lower layer, and a silicon nitride film which contains a lot of N is formed as an upper layer. In order to form a silicon nitride film having such a two-layer structure, a CVD method in which $SiH_4$ and $NH_3$ are used as source materials is used, and a flow ratio of $NH_3/SiH_4$ is set at 50 to 150 when a lower layer is formed and the flow ratio of $NH_3/SiH_4$ is set at over 300 when an upper layer is formed.

In Reference 3 (Japanese Published Patent Application No. S63-205965), a silicon nitride film having a relatively high conductivity is formed as a lower layer, and a silicon nitride film having a relatively low conductivity is formed as an upper layer by a CVD method. As a condition to form a silicon nitride film having such a two-layer structure, the following is described: heating temperature is at 700° C. to 800° C., $SiH_2Cl_2$ and $NH_3$ are used as source materials, a flow ratio of $NH_3/SiH_2Cl_2$ is set at 0.1 to 150 when a lower layer is formed, and the flow ratio of $NH_3/SiH_2Cl_2$ is set at 10 to 1000 when an upper layer is formed.

In Reference 4 (Japanese Published Patent Application No. 2002-203917), a silicon nitride film having a two-layer structure in which the charge trap density of an upper layer is set higher than that of a lower layer is formed by a CVD method. To form a silicon nitride film having such a two-layer structure, the following is described: $SiH_4$, $SiH_2Cl_2$, or the like in which the composition ratio of chlorine is lower than that of a silicon source gas used when a lower layer is formed is used as a silicon source gas used when an upper layer is formed. In Reference 4, by changing the composition ratio of chlorine of a silicon source gas, a silicon nitride film containing a larger number of Si—Cl bonds than Si—H bonds is formed as a lower layer and a silicon nitride film containing a lot of Si—H bonds is formed as an upper layer.

In Reference 5 (Japanese Published Patent Application No. H3-9571), a silicon nitride film having a three-layer structure is described, in which charge trap level density of a second-layer silicon nitride film is higher than those of the other layers and the concentration of Si of the second-layer silicon nitride film is increased. To form a silicon nitride film having such a three-layer structure, the flow rate of $SiH_2Cl_2$ is increased at the time when the second layer is formed.

SUMMARY OF THE INVENTION

An object of the present invention is to improve charge retention characteristics of a nonvolatile semiconductor memory element.

One aspect of the present inventions is a semiconductor device having a nonvolatile semiconductor memory element. The nonvolatile semiconductor memory element is formed of a semiconductor and includes a semiconductor region which includes a source region, a drain region, and a channel formation region, and a conductive film overlapped with the channel formation region. To form a charge trap, at least a first insulating film overlapped with the channel formation region, a first silicon nitride film formed over the first insulating film, and a second silicon nitride formed over the first silicon nitride film are sandwiched between the semiconductor region and the conductive film. Further, the nonvolatile semiconductor memory element can include a second insulating film formed over the second silicon nitride film which is sandwiched between the semiconductor region and the conductive film.

The present invention is made by focusing attention on a bonding state of H in silicon nitride. One aspect of the present invention is to improve retention characteristics of a nonvolatile semiconductor memory element by higher N—H bond concentration of a first silicon nitride film than that of the second silicon nitride film.

In the present invention, it is preferable that the second silicon nitride film be a film which contains a larger number of Si—H bonds and/or Si—X bonds (X is a halogen element) than in the first silicon nitride film.

It is preferable that a ratio of Si—H bond concentration to N—H bond concentration of the second silicon nitride film, ((Si—H)/(N—H)), be larger than that of the first silicon nitride film. Alternatively, it is preferable that a ratio of Si—X bond concentration (X is a halogen element) to N—H bond concentration of the second silicon nitride film, ((Si—X)/(N—H)), be larger than that of the first silicon nitride film.

Alternatively, it is preferable that a ratio of the sum of Si—H bond concentration and Si—X bond concentration (X is a halogen element) to N—H bond concentration of the second silicon nitride film, ((Si—H+Si—X)/(N—H)), be larger than that of the first silicon nitride film.

It is preferable that the second silicon nitride film be a film which is closer to $Si_3N_4$ than the first silicon nitride film stoichiometrically.

In the present invention, the first silicon nitride film and the second silicon nitride film are formed by a chemical vapor deposition (CVD) method. As this CVD method, a low-pressure CVD method, a plasma CVD method, a thermal CVD method, a catalytic chemical vapor deposition (Cat-CVD) method, or the like can be used.

To form the first silicon nitride film and the second silicon nitride film which have different N—H bond concentrations, a hydronitrogen gas that contains N—H bonds is used for a nitrogen source gas which serves as a source material of the first silicon nitride film. Meanwhile, for a nitrogen source gas of the second silicon nitride film, a gas which does not substantially contain N—H bonds, that is, a gas which does not substantially contain hydrogen in a composition is used.

It is preferable that ammonia ($NH_3$) be used for the nitrogen source gas of the first silicon nitride film. Instead of ammonia ($NH_3$), hydrazine ($NH_2H_2N$) can be used as well. It is preferable that a nitrogen ($N_2$) gas be used for the nitrogen source gas of the second silicon nitride film.

For the silicon source gas used for the formation of the first silicon nitride film and the second silicon nitride film, a gas that contains hydrogen or halogen in a composition can be used. As the silicon source gas, there are $SiH_4$, $Si_2H_6$, $SiCl_4$, $SiHCl_3$, $SiH_2Cl_2$, $SiH_3Cl_3$, $SiF_4$, and the like. The first silicon nitride film and the second silicon nitride film may be formed using either the same silicon source gas or different silicon source gases.

In the nonvolatile semiconductor memory element of the present invention, as a writing method and an erasing method of data, any one of a method which uses Fowler-Nordheim (F-N) tunneling current, a method which uses direct tunneling current, or a method which uses hot carriers can be used.

According to the present invention, charge retention characteristics of a nonvolatile semiconductor memory element can be improved, and a semiconductor device provided with data storage capability with high reliability can be provided.

BRIEF DESCRIPTION OF THE DRAWINGS

FIGS. 22A and 22B are each a circuit diagram which describes a writing operation of a memory cell array.

FIGS. 25A to 25C are cross-sectional views illustrating a method for manufacturing a semiconductor device.

FIGS. 26A to 26C are cross-sectional views illustrating a method for manufacturing a semiconductor device.

FIGS. 27A to 27C are cross-sectional views illustrating a method for manufacturing a semiconductor device.

FIGS. 28A and 28B are cross-sectional views illustrating a method for manufacturing a semiconductor device.

FIG. 29 is a top view illustrating a method for manufacturing a semiconductor device.

FIG. 30 is a top view illustrating a method for manufacturing a semiconductor device.

FIG. 31 is a top view illustrating a method for manufacturing a semiconductor device.

FIGS. 32A to 32C are cross-sectional views illustrating a method for manufacturing a semiconductor device.

FIGS. 33A to 33C are cross-sectional views illustrating a method for manufacturing a semiconductor device.

FIGS. 34A to 34C are cross-sectional views illustrating a method for manufacturing a semiconductor device.

FIGS. 35A to 35C are cross-sectional views illustrating a method for manufacturing a semiconductor device.

FIGS. 38A to 38C are cross-sectional views illustrating a method for manufacturing a semiconductor device.

FIGS. 39A to 39C are cross-sectional views illustrating a method for manufacturing a semiconductor device.

FIGS. 40A to 40C are cross-sectional views illustrating a method for manufacturing a semiconductor device.

FIGS. 41A to 41C are cross-sectional views illustrating a method for manufacturing a semiconductor device.

FIGS. 42A to 42C are cross-sectional views illustrating a method for manufacturing a semiconductor device.

FIGS. 43A to 43C are cross-sectional views illustrating a method for manufacturing a semiconductor device.

DETAILED DESCRIPTION OF THE INVENTION

Hereinafter, the present invention will be described. However, the present invention can be implemented in various modes. As can be easily understood by those skilled in the art, the modes and details of the present invention can be changed in various ways without departing from the spirit and scope of the present invention. Thus, the present invention should not be taken as being limited to the following description of the embodiment modes and embodiment.

Embodiment Mode 1

In this embodiment mode, an example in which a nonvolatile memory transistor is applied to the present invention as a nonvolatile memory element will be described. First, a structure of a nonvolatile memory transistor of the present invention and a manufacturing method thereof will be described with reference to FIG. 1.

Figure 1:
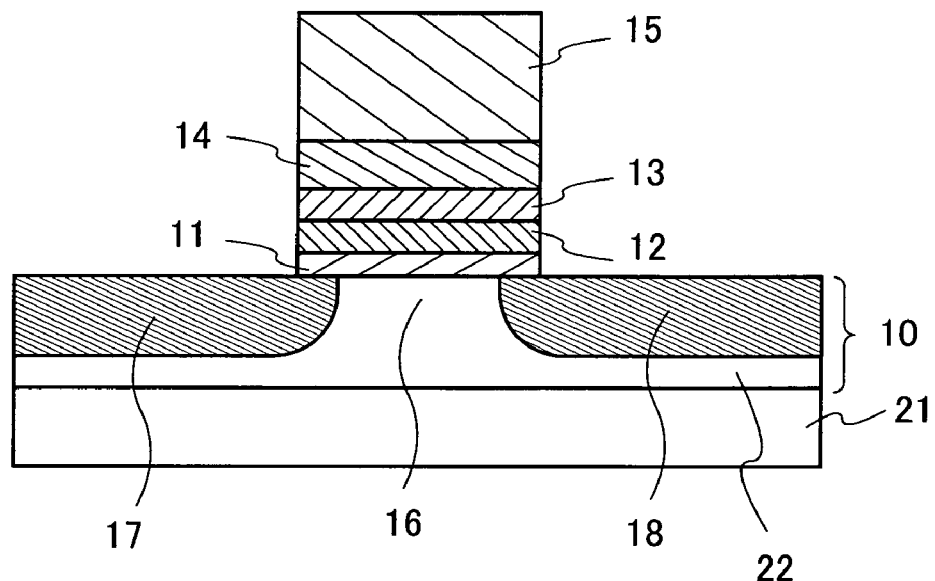
FIG. 1 is a cross-sectional view of a nonvolatile memory transistor.

FIG. 1 is a cross-sectional view so as to describe a main structure of a MONOS-type nonvolatile memory transistor. A nonvolatile memory transistor of FIG. 1 includes a semiconductor substrate 21 provided with a semiconductor region 10 and a well 22. By formation of the well 22 in the semiconductor substrate 21, the semiconductor region 10 used for forming a memory transistor is defined. In the semiconductor region 10, a channel formation region 16, and a high concentration impurity region 17 and a high concentration impurity region 18 which sandwich the channel formation region 16 are formed. The high concentration impurity regions 17 and 18 are regions each to serve as a source region or a drain region of the memory transistor.

When the semiconductor substrate 21 is a p-type substrate, the semiconductor substrate 21 is doped with an impurity which imparts n-type conductivity such as phosphorus (P) or arsenic (As) by an ion implantation process or the like so that the well 22 is formed. When the semiconductor substrate 21 is an n-type substrate, the semiconductor substrate 21 is doped with an impurity which imparts p-type conductivity such as boron (B) so that the well 22 is formed. The concentration of the impurity which imparts n-type or p-type conductivity of the well 22 is approximately $5 \times 10^{15}$ cm$^{-3}$ to $1 \times 10^{16}$ cm$^{-3}$. The well 22 is formed as appropriate, if necessary.

Over the semiconductor region 10, a first insulating film 11, a first silicon nitride film 12, a second silicon nitride film 13, a second insulating film 14, and a conductive film 15 are stacked in this order. These films 11 to 15 are overlapped with the channel formation region 16 in the semiconductor region 10.

The conductive film 15 functions as a gate electrode of the memory transistor. The first silicon nitride film 12 and the second silicon nitride film 13 are used as a charge storage layer. As a method for taking charge in and out of the charge storage layer (a writing method and an erasing method of a nonvolatile memory transistor), there are a method that uses F-N tunneling current, a method that uses direct tunneling current, and a method that uses hot carriers. The nonvolatile memory transistor of this embodiment mode can use a method selected from these methods, as appropriate, as the writing method and the erasing method.

The first insulating film 11 is formed to be thin so that charge passes through the first insulating film 11, the thickness thereof is preferably greater than or equal to 1 nm and less than or equal to 10 nm, and more preferably, greater than or equal to 1 nm and less than or equal to 5 nm. The first insulating film 11 can be formed of a single-layer film that is formed of an insulating material selected from silicon oxide, silicon oxynitride ($SiO_xN_y$), aluminum oxide, tantalum oxide, zirconium oxide, and hafnium oxide. In addition, the first insulating film 11 can be formed of a two-layer structure in which an insulating film formed of an insulating material selected from silicon oxynitride ($SiO_xN_y$), aluminum oxide, tantalum oxide, zirconium oxide, and hafnium oxide is stacked on a silicon oxide film, as well.

For example, as a method for forming the silicon oxide film, there are thermal oxidation of the semiconductor substrate 21, oxidation of the semiconductor substrate 21 by generation of an oxygen radical with plasma treatment, a CVD method such as a plasma CVD method, and the like. As a method for forming the silicon oxynitride film, there are a method in which the semiconductor substrate 21 is oxidized by thermal oxidation treatment or plasma treatment and a silicon oxide film thus obtained is nitrided by thermal nitridation treatment or plasma treatment, a method for forming the silicon oxynitride film by a CVD method such as a plasma CVD method, and the like. The film formed of metal oxide such as aluminum oxide can be formed by a sputtering method, a metal-organic chemical vapor deposition (MOCVD) method, or the like.

The first silicon nitride film 12 is formed by a CVD method such as low-pressure CVD method, a plasma CVD method, a thermal CVD method, or a Cat-CVD method. By use of a plasma CVD method, heating temperature can be set at less than or equal to 600° C. As a nitrogen source gas to serve as a source material of the first silicon nitride film 12, a hydronitrogen gas that contains N—H bonds is used. Specifically, ammonia ($NH_3$) is preferably used for this nitrogen source gas, and hydrazine ($NH_2H_2N$) can also be used instead of ammonia ($NH_3$).

As the silicon source gas to serve as a source material of the first silicon nitride film 12, a gas that contains hydrogen or halogen in a composition is used. As such a gas, there are $SiH_4$, $Si_2H_6$, $SiCl_4$, $SiHCl_3$, $SiH_2Cl_2$, $SiH_3Cl_3$, $SiF_4$, and the like.

A flow ratio of the nitrogen source gas to the silicon source gas, (N source gas/Si source gas), can be set to be greater than or equal to 0.1 and less than or equal to 1000, and this flow ratio is preferably greater than or equal to 1 and less than or equal to 400.

A gas other than the nitrogen source gas and the silicon source gas each serving as a source material can be added to a process gas of CVD at the time when the first silicon nitride film is formed. As such a gas, there are a noble gas such as He, Ar, and Xe; a hydrogen ($H_2$) gas; and the like.

The second silicon nitride film 13 is formed by a CVD method such as a low-pressure CVD method, a plasma CVD method, a thermal CVD method, or a Cat-CVD method. By use of a plasma CVD method, heating temperature can be set at less than or equal to 600° C. As a nitrogen source gas to serve as a source material of the second silicon nitride film, a gas that does not substantially contain N—H bonds is used. Specifically, a nitrogen ($N_2$) gas is preferably used for this nitrogen source gas.

Similarly to the case of the first silicon nitride film 12, as a silicon source gas to serve as a source material of the second silicon nitride film 13, a gas selected from $SiH_4$, $Si_2H_6$, $SiCl_4$, $SiHCl_3$, $SiH_2Cl_2$, $SiH_3Cl_3$, and $SiF_4$ can be used.

A gas other than the nitrogen source gas and the silicon source gas each serving as a source material can be added to a process gas of CVD at the time when the second silicon nitride film 13 is formed. As such a gas, there are a noble gas such as He, Ar, and Xe; a hydrogen ($H_2$) gas; and the like. To promote ionization of the $N_2$ gas, a noble gas such as He, Ar, or Xe is preferably added to the source material gas.

A flow ratio of the nitrogen source gas to the silicon source gas, (N source gas/Si source gas), can be set to be greater than or equal to 0.1 and less than or equal to 1000, and this flow ratio is preferably greater than or equal to 1 and less than or equal to 400.

By regulating the flow amount and kind of the process gas, the first silicon nitride film 12 and the second silicon nitride film 13 can be formed in succession in the same reaction chamber of a CVD apparatus. In this manner, the first silicon nitride film 12 and the second silicon nitride film 13 can be formed without exposure of an interface between the first silicon nitride film 12 and the second silicon nitride film 13 to the air; therefore, formation of an unstable charge trap level at the interface can be prevented. In addition, even when a CVD apparatus having a plurality of reaction chambers is used and the first silicon nitride film 12 and the second silicon nitride film 13 are formed in different reaction chambers without taking out a substrate from the CVD apparatus, contamination at the interface can be similarly prevented.

The first silicon nitride film 12 and the second silicon nitride film 13 function as the charge storage layer. Due to different nitrogen source gases, the first silicon nitride film contains a larger number of N—H bonds than the second silicon nitride film. The first silicon nitride film 12 has lower Si—H bond concentration or Si—X bond concentration (X is a halogen element) that comes from the silicon source gas than the second silicon nitride film 13.

The first silicon nitride film 12 and the second silicon nitride film 13 each can have a thickness of greater than or equal to 1 nm and less than or equal to 20 nm, and preferably, greater than or equal to 5 nm and less than or equal to 15 nm. It is preferable that the total thickness of the first silicon nitride film 12 and the second silicon nitride film 13 be less than or equal to 15 nm.

The second insulating film 14 can be formed at a thickness of greater than or equal to 1 nm and less than or equal to 20 nm. The second insulating film 14 preferably has a thickness of greater than or equal to 5 nm and less than or equal to 10 nm. The second insulating film 14 can be formed of a single-layer film or a multilayer film having two or more layers which is formed of an insulating material selected from silicon oxide, silicon oxynitride ($SiO_xN_y$), silicon nitride, aluminum oxide, tantalum oxide, zirconium oxide, and hafnium oxide. An insulating film that forms the second insulating film 14 can be formed by a thermal oxidation method, a CVD method, or a sputtering method. For example, when the second insulating film 14 has a multilayer structure, a method can be used in which thermal oxidation is performed on the second silicon nitride film 13, and then a film formed of the above insulating material is deposited by a CVD method or a sputtering method.

The conductive film 15 forms a gate electrode of the nonvolatile memory transistor and can be formed of a single-layer film or a multilayer film having two or more layers. As a conductive material which forms the conductive film 15, a metal selected from tantalum (Ta), tungsten (W), titanium (Ti), molybdenum (Mo), chromium (Cr), niobium (Nb), and the like; an alloy or a compound (e.g., metal nitride or silicide) containing any of these metals as its main component; or polycrystalline silicon doped with an impurity element such as phosphorus can be used. For example, the conductive film 15 can have a multilayer structure including metal nitride of a single layer or a plurality of layers and a layer formed of a simple substance metal thereover. For this metal nitride, tungsten nitride, molybdenum nitride, or titanium nitride can be used. By formation of a metal nitride layer to be in contact with the second insulating film 14, separation of a metal layer thereover can be prevented. Since the metal nitride such as tantalum nitride has a high work function, the first insulating film 11 can be thick due to a synergy effect with the second insulating film 14.

The high concentration impurity regions 17 and 18 formed in the semiconductor region 10 are formed in a self-aligned manner in such a way that the semiconductor substrate 21 is doped with an impurity by an ion implantation process when the stacked film formed of the films 11 to 15 is used as a mask. When the well 22 is a p type, the high concentration impurity regions 17 and 18 are doped with impurities which impart n-type conductivity. When the well 22 is an n type, the high concentration impurity regions 17 and 18 are doped with impurities which impart p-type conductivity.

Figure 2:
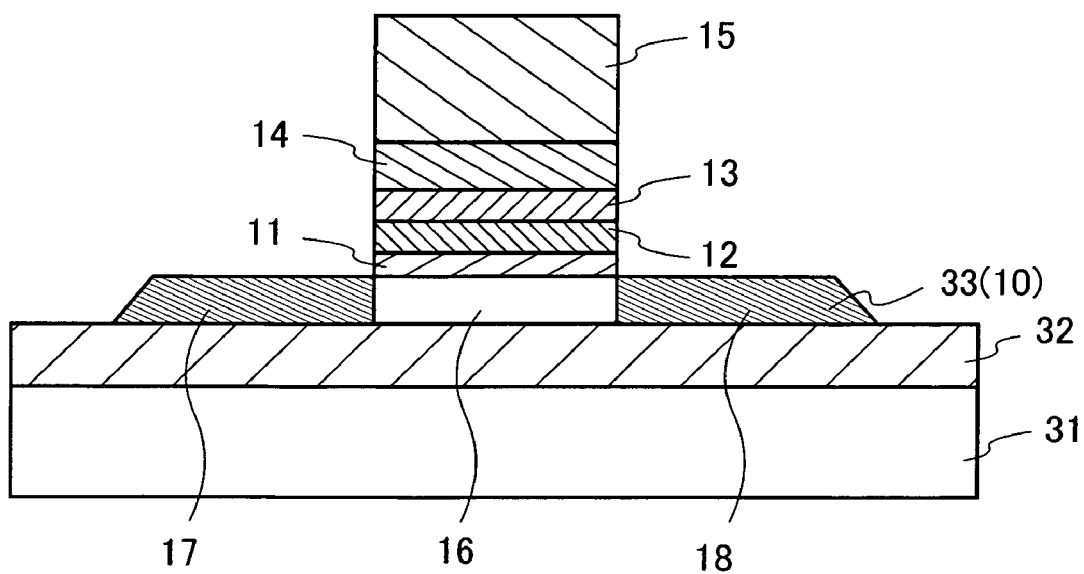
FIG. 2 is a cross-sectional view of a nonvolatile memory transistor.

The nonvolatile memory transistor of FIG. 1 is a memory element in which a semiconductor region is formed in a semiconductor substrate. A semiconductor film formed over an insulating film can be used as a semiconductor region, as well. In FIG. 2, a cross-sectional view of a nonvolatile memory transistor having such a semiconductor region is shown.

As a substrate 31, a glass substrate, a quartz substrate, a sapphire substrate, a ceramic substrate, a stainless steel substrate, a metal substrate, or the like can be used. The substrate 31 may be a substrate different from a substrate used at the time of fabrication of a nonvolatile memory transistor. In this case, as the substrate 31, a plastic film can be used as well.

A base insulating film 32 is formed over the substrate 31, and a semiconductor film 33 to serve as the semiconductor region 10 is formed over the base insulating film 32. The base insulating film 32 is formed so that an interface level of the semiconductor film 33 on the substrate 31 side can be made good, and a contaminant such as an alkali metal from the substrate 31 can be prevented from entering the semiconductor film 33. The base insulating film 32 is not necessarily formed. The base insulating film 32 can be formed of a single-layer film or a stacked film of an insulating material such as silicon oxide, silicon nitride, or silicon oxynitride.

The semiconductor film 33 is formed of a crystalline semiconductor film, and in the case where a non-single-crystal semiconductor film is used, a polycrystalline semiconductor is preferably used. For a semiconductor material, silicon is preferably used, and each of silicon germanium and germanium can be used as well. As a crystallization method of the semiconductor film, a laser crystallization method, a crystallization method by heat treatment using rapid thermal annealing (RTA) or an annealing furnace, a crystallization method using a metal element which promotes crystallization, or a method combining these methods can be adopted. An example of a method for forming the semiconductor film 33 is described. Over the base insulating film 32, an amorphous silicon film is formed at a thickness of 10 nm to 100 nm by a plasma CVD method. Next, the amorphous silicon film is irradiated with a laser beam to be crystallized, so that a polycrystalline silicon film is formed. The polycrystalline silicon film is etched to form the semiconductor film 33 having a desired shape. In the case of FIG. 2, the semiconductor region 10 is formed into the island-shaped semiconductor film 33 for the purpose of element isolation.

Figure 13:
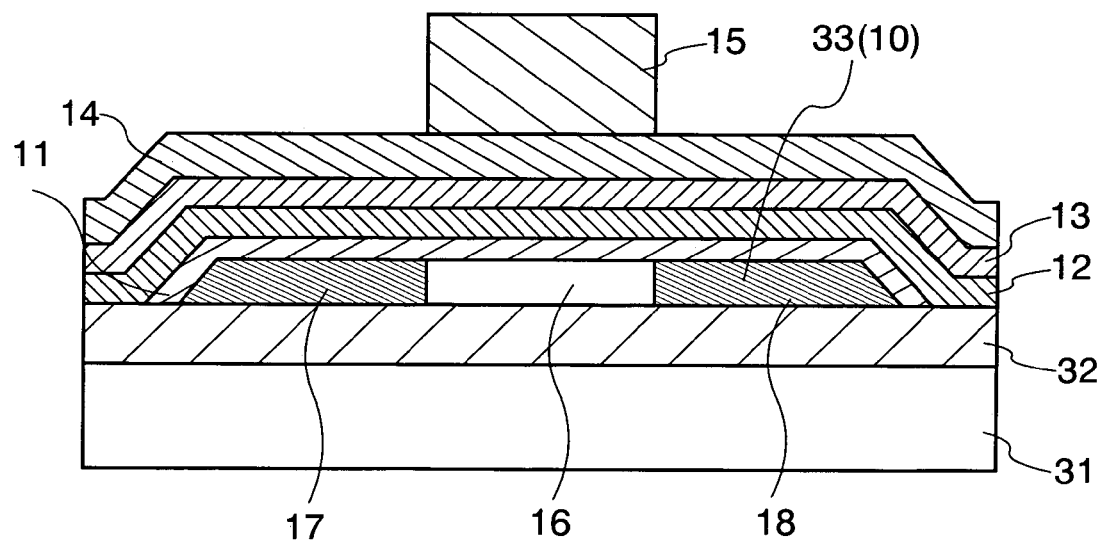
FIG. 13 is a cross-sectional view of a nonvolatile memory transistor.

Note that, in the nonvolatile memory transistor of FIG. 2, the first insulating film 11 may be formed to cover the semiconductor film 33 in a similar manner to a nonvolatile memory transistor of FIG. 13 instead of being processed into the same shape as the first silicon nitride film 12 and the second silicon nitride film 13.

The nonvolatile memory transistor of FIG. 2 is formed in such a way that the semiconductor region 10 is separated into island shapes. In this way, elements can be separated more effectively even in the case where a memory cell array and a logic circuit are formed over the same substrate than when a bulk semiconductor substrate is used. That is, even if a memory cell array that needs voltage of approximately 10 V to 20 V for writing or erasing data and a logic circuit which is operated at voltage of approximately 3 V to 7 V and mainly used for inputting or outputting data or controlling instructions are formed over the same substrate, mutual interference due to a difference in the voltage applied to each element can be prevented.

In order to increase the number of rewriting times of a nonvolatile memory transistor, the first insulating film 11 needs a high withstand voltage characteristic. However, in the case where the substrate 31 has a distortion temperature of approximately 630° C. to 750° C. which is lower than that of the semiconductor substrate 21, such as a glass substrate, heating temperature is limited by the distortion temperature of the substrate. Therefore, even when the first insulating film 11 is formed by thermal oxidation or thermal nitridation, it is very difficult to form a film that is superior in a withstand voltage characteristic. In addition, the first insulating film 11 can be deposited by a CVD method or a sputtering method at a heating temperature of less than or equal to the distortion point of the substrate. A withstand voltage characteristic of an insulating film which is formed in such a manner is not enough because a defect exists inside the film. In addition, a thin insulating film formed at a thickness of approximately 1 nm to 10 nm by a CVD method or a sputtering method easily generates a defect such as a pinhole. Further, a film formation method by a CVD method or a sputtering method is inferior to a film formation method by thermal oxidation or the like in step coverage.

Accordingly, in the case where a substrate having a distortion temperature of less than or equal to 750° C. is used, it is very preferable that the first insulating film 11 having a high withstand voltage be formed by solid-phase oxidation or solid-phase nitridation by plasma. This is because the insulating film formed using the semiconductor (typically, silicon) to which oxidation or nitridation by plasma treatment is performed is dense, and has high withstand voltage and excellent reliability even when a heating temperature at the time of formation is less than or equal to 500° C.

Further, an insulating film may be deposited by a CVD method or a sputtering method, and solid-phase oxidation treatment or solid-phase nitridation treatment may be performed on this insulating film by plasma to form the first insulating film 11, whereby the withstand voltage characteristic can be increased.

It is preferable that high density plasma that has an electron density of greater than or equal to $1 \times 10^{11}$ cm$^{-3}$ and less than or equal to $1 \times 10^{13}$ cm$^{-3}$ and an electron temperature of greater than or equal to 0.5 eV and less than or equal to 1.5 eV and that has been excited by a microwave (typically, a microwave with a frequency of 2.45 GHz) be used for solid-phase oxidation treatment or solid-phase nitridation treatment by plasma treatment. This is for forming a dense insulating film at a practical reaction rate at a heating temperature of less than or equal to 500° C. by using high density plasma. That is, in the plasma treatment using a microwave by effectively using an active radical which is excited by plasma, oxidation or nitridation can be performed by a solid-phase reaction at a low substrate heating temperature of less than or equal to 500° C.

In the case where oxidation treatment is performed by this high density plasma treatment, an oxygen radical is generated by introduction of a gas that contains oxygen in a composition (e.g., oxygen ($O_2$) or dinitrogen monoxide ($N_2O$) and a noble gas (containing at least one of He, Ne, Ar, Kr, and Xe). An oxygen radical can be generated efficiently by excited species of a noble gas. An oxygen radical (an OH radical is included in some cases) is generated by introduction of a gas that contains oxygen in a composition, a hydrogen ($H_2$) gas, and a noble gas into a reaction chamber.

In the case where nitridation treatment is performed by high density plasma treatment, a nitrogen radical is generated by introduction of nitrogen ($N_2$) and a noble gas (containing at least one of He, Ne, Ar, Kr, and Xe) into the reaction chamber. A nitrogen radical can be generated efficiently by excited species of a noble gas. In addition, a hydrogen gas as well as a nitrogen gas can be introduced into the reaction chamber. Further, ammonia ($NH_3$) can be introduced into the reaction chamber, so that a nitrogen radical (including an NH radical) can be generated. In this case, a noble gas can be introduced into the reaction chamber. For example, in the case where nitrogen and argon are used, it is preferable that nitrogen be introduced at a flow rate of 20 sccm to 2000 sccm and argon be introduced at a flow rate of 100 sccm to 10000 sccm into the reaction chamber. For example, the flow rate of nitrogen is set at 200 sccm, and the flow rate of argon is set at 1000 sccm.

An example of a method for forming the first insulating film 11 by high density plasma treatment is described. First, the semiconductor film 33 is oxidized by high density plasma treatment which generates an oxygen radical to form a silicon oxide film having a thickness of 3 nm to 6 nm. Next, this silicon oxide film is nitrided by high density plasma treatment which generates a nitrogen radical. The first insulating film 11 having high reliability can be formed by using high density plasma treatment even when the substrate heating temperature is less than or equal to 500° C. This is because, in the high density plasma treatment, a surface to be formed is not directly exposed to plasma and an electron temperature is low, so that damage to a film to be formed by plasma is small. In particular, oxidation treatment is performed, and then nitridation treatment is performed so that the first insulating film 11 which is suitable for a nonvolatile memory transistor can be formed.

In the nonvolatile transistor of FIG. 2, when a CVD method is employed to form the films 12 to 14, it is preferable to employ a plasma CVD method because a deposition rate is practical and the substrate heating temperature can be set at less than or equal to 600° C. Further, when a plasma CVD method is used, the substrate heating temperature can be set at less than or equal to 500° C.

Hereinafter, improvement in a charge retention characteristic of a nonvolatile memory transistor by a stacked-layer structure of the first silicon nitride film 12 and the second silicon nitride film 13 will be described with reference to experimental data. In addition, improvement of a charge retention characteristic by the first silicon nitride film 12 and the second silicon nitride film 13 which are formed by a plasma CVD method under the condition that the heating temperature is less than or equal to 500° C. will be described.

Figure 3:
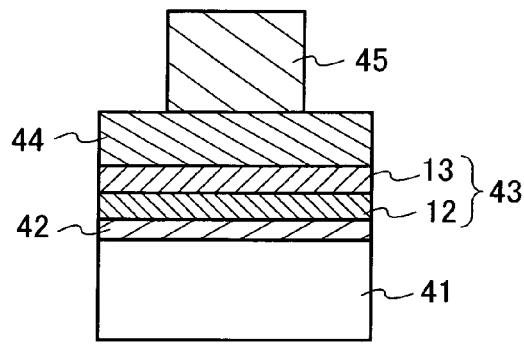
FIG. 3 is a cross-sectional view of a capacitor (Element 1) which is formed so as to evaluate retention characteristics of a nonvolatile semiconductor memory element of the present invention.

To evaluate the first silicon nitride film 12 and the second silicon nitride film 13 of the present invention, a MOS type capacitor was formed using a silicon substrate. FIG. 3 is a cross-sectional view of the formed capacitor. This capacitor is referred to as an "Element 1." In the Element 1, a first insulating film 42, a silicon nitride layer 43, a second insulating film 44, and an electrode 45 are stacked in this order over a silicon substrate 41. The silicon substrate 41 is a p-type single-crystal silicon substrate. The silicon nitride layer 43 has a two-layer structure of the first silicon nitride film 12 and the second silicon nitride film 13. The Element 1 was formed as follows.

To form the first insulating film 42, first, the surface of the silicon substrate 41 was oxidized by plasma treatment which generates plasma by a microwave to form a silicon oxide film. This oxidation plasma treatment was performed in such a way that a substrate temperature was set at 400° C., a pressure was set at 106 Pa, and a microwave with a frequency of 2.45 GHz was introduced into a reaction chamber while an Ar gas at a flow rate of 900 sccm and an $O_2$ gas at a flow rate of 5 sccm gas were supplied to the reaction chamber to excite plasma. The time of plasma treatment was regulated so that a silicon oxide film having a thickness of 3 nm was formed.

Next, this silicon oxide film was nitrided by plasma treatment which generates plasma by a microwave. This plasma nitridation treatment was performed as follows. A substrate temperature was set at 400° C., a reaction pressure was set at 12 Pa, and a microwave with a frequency of 2.45 GHz was introduced into a reaction chamber while an Ar gas at a flow rate of 1000 sccm and an $O_2$ gas at a flow rate of 200 sccm were supplied to the reaction chamber to excite plasma. The time of plasma treatment was set for 90 seconds. The first insulating film 42 was formed by the above method.

Next, the silicon nitride layer 43 was formed over the first insulating film 42. First, the first silicon nitride film 12 was formed by a plasma CVD method over the first insulating film 42. As a nitrogen source gas, $NH_3$ was used, and as a silicon source gas, $SiH_4$ was used. A substrate temperature was set at 400° C., a reaction pressure was set at 40 Pa, $SiH_4$ at a flow rate of 2 sccm and $NH_3$ at a flow rate of 400 sccm were supplied to the reaction chamber. A distance between electrodes was set at 30 mm, and RF power was set at 100 W.

Next, the second silicon nitride film 13 was formed by a plasma CVD method over the first silicon nitride film 12. As a nitrogen source gas, $N_2$ was used. As a silicon source gas, $SiH_4$ was used. As a process gas, Ar was used to promote ionization of $N_2$. $SiH_4$ at a flow rate of 2 sccm, $N_2$ at a flow rate of 400 sccm, and Ar at a flow rate of 50 sccm were supplied to the reaction chamber. In a similar manner to the formation of the first silicon nitride film 12, a substrate temperature was set at 400° C., a reaction pressure was set at 40 Pa, a distance between electrodes was set at 30 mm, and RF power was set at 100 W.

Here, the first silicon nitride film 12 and the second silicon nitride film 13 were formed in succession in the same reaction chamber of a plasma CVD apparatus. Each of the first silicon nitride film 12 and the second silicon nitride film 13 has a thickness of 5 nm.

Next, the second insulating film 44 was formed over the second silicon nitride film 13. Here, $SiH_4$ and $N_2O$ were used as a source gas by a plasma CVD method, and a silicon oxynitride film having a thickness of 10 nm was formed. Next, an Al—Ti alloy film having a thickness of 400 nm was formed over the second insulating film 44 with a sputtering apparatus and the Al—Ti alloy film was processed into a predetermined shape by etching, whereby the electrode 45 was formed. As described above, the Element 1 was completed.

Figure 4A:
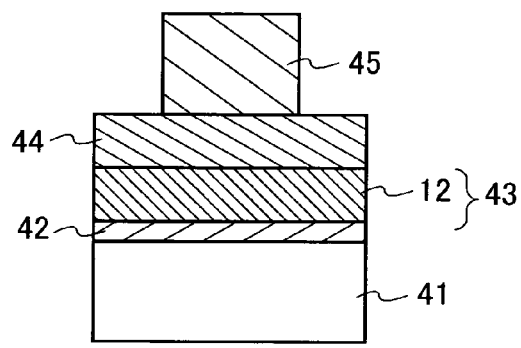
FIGS. 4A to 4C are cross-sectional views each illustrating a capacitor which is formed so as to evaluate retention characteristics of a nonvolatile semiconductor memory element of a comparative example.
Figure 4B:
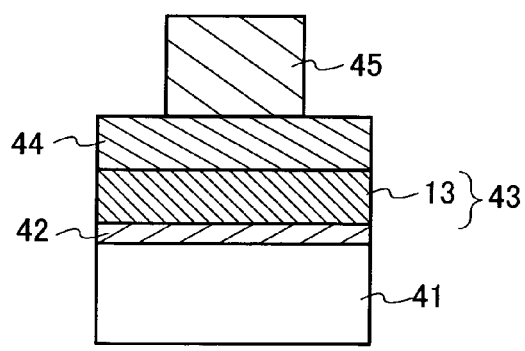
Figure 4C:
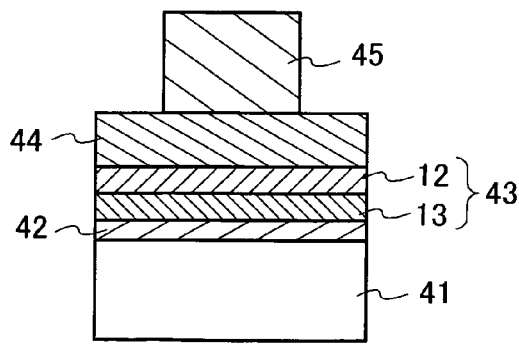

For comparison with the Element 1, three kinds of MOS type capacitors were formed. FIGS. 4A to 4C are cross-sectional views of these. Capacitors shown in FIGS. 4A, 4B, and 4C are referred to as a Comparative Element A, a Comparative Element B, and a Comparative Element C, respectively.

The Comparative Elements A to C are different from the Element 1 only in a structure of the silicon nitride layer 43, and the thickness of the silicon nitride layer 43 is 10 nm, which is the same as that of the Element 1. In the Comparative Element A, the silicon nitride layer 43 is formed of a single-layer film of the first silicon nitride film 12 having a thickness of 10 nm. In the Comparative Element B, the silicon nitride layer 43 is formed of a single-layer film of the second silicon nitride film 13 having a thickness of 10 nm. The Comparative Element C has the silicon nitride layer 43 whose stacking order is reverse to the Element 1, the second silicon nitride film 13 having a thickness of 5 nm is formed as a lower layer, and the first silicon nitride film 12 having a thickness of 5 nm is formed as an upper layer.

The Comparative Elements A to C were formed by the same method as the Element 1. That is, the first silicon nitride film 12 of the Element 1 and the first silicon nitride film 12 of each of the Comparative Element A and the Comparative Element C were formed by the same conditions. The second silicon nitride film 13 of the Element 1 and the second silicon nitride film 13 of each of the Comparative Element B and the Comparative Element C were formed by the same conditions.

To evaluate a charge retention characteristic of the silicon nitride layer 43 of each element, capacitance-voltage characteristics of each element were measured. The measurement was performed as follows. To evaluate a charge retention characteristic after writing of data, a voltage of 17 V was applied to the electrode 45 for 10 milliseconds while a metal halide lamp emitted light, and electrons were injected into the silicon nitride layer 43. Note that, since the silicon substrate 41 is a p type, electrons are minority carriers. Thus, the metal halide lamp emitted light to the silicon substrate 41 to excite electrons. Then, the state in which the silicon substrate 41 was heated at 150° C. with a hot plate was kept. Capacitance-voltage characteristics were measured before the writing operation, just after the writing operation, and after a predetermined time passed after the writing operation.

To evaluate a charge retention characteristic after written data is erased, first, the same writing operation as the above was performed. Next, to perform the erasing operation, a voltage of −15 V was applied to the electrode 45 for 10 milliseconds to inject holes into the silicon nitride layer 43. Then, the state in which the silicon substrate 41 was heated at 150° C. with a hot plate was kept. Capacitance-voltage characteristics were measured before the writing operation, just after the writing operation, just after the erasing operation, and after a predetermined time passed after the erasing operation.

Figure 5:
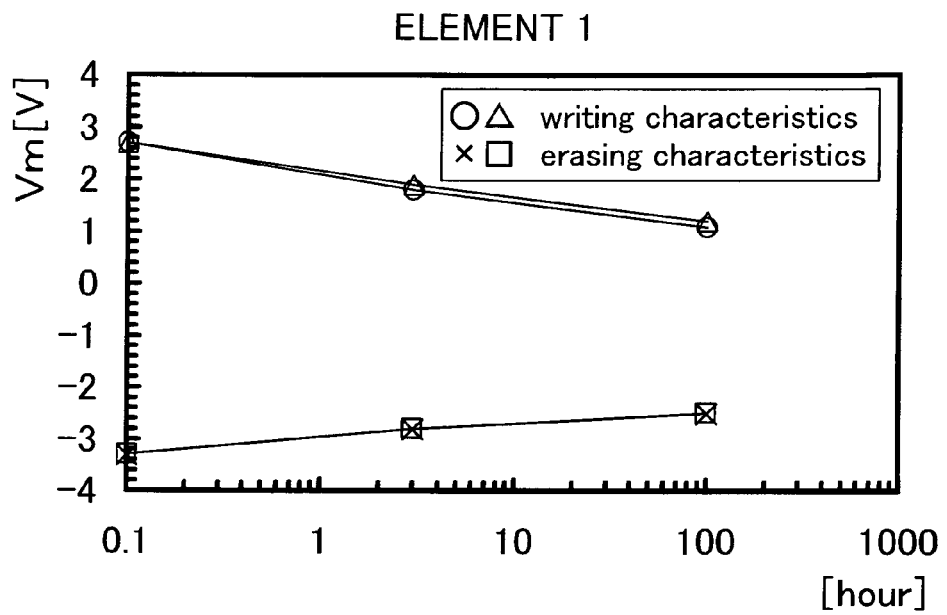
FIG. 5 is a graph which shows retention characteristics of the Element 1.
Figure 6:
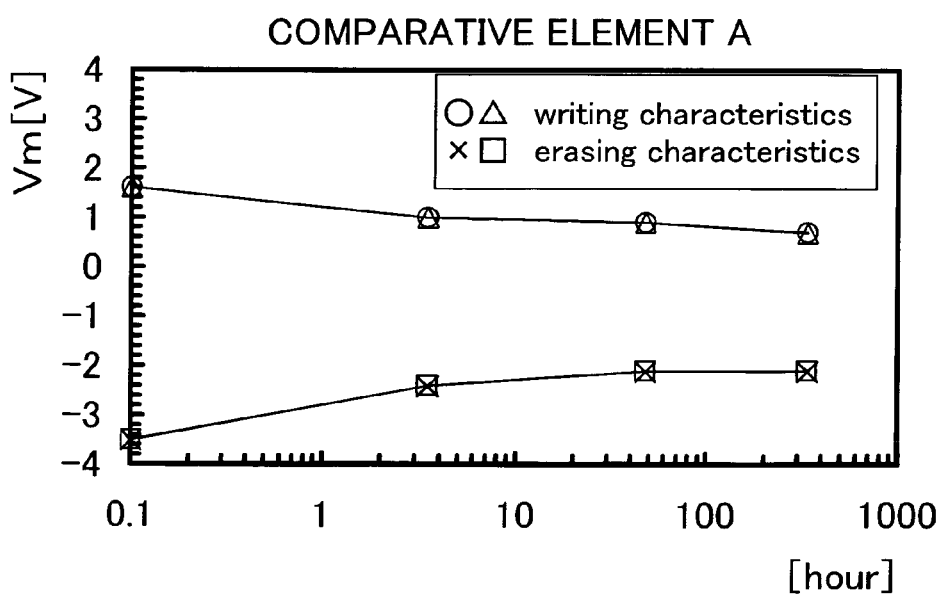
FIG. 6 is a graph which shows retention characteristics of the Comparative Element A.
Figure 7:
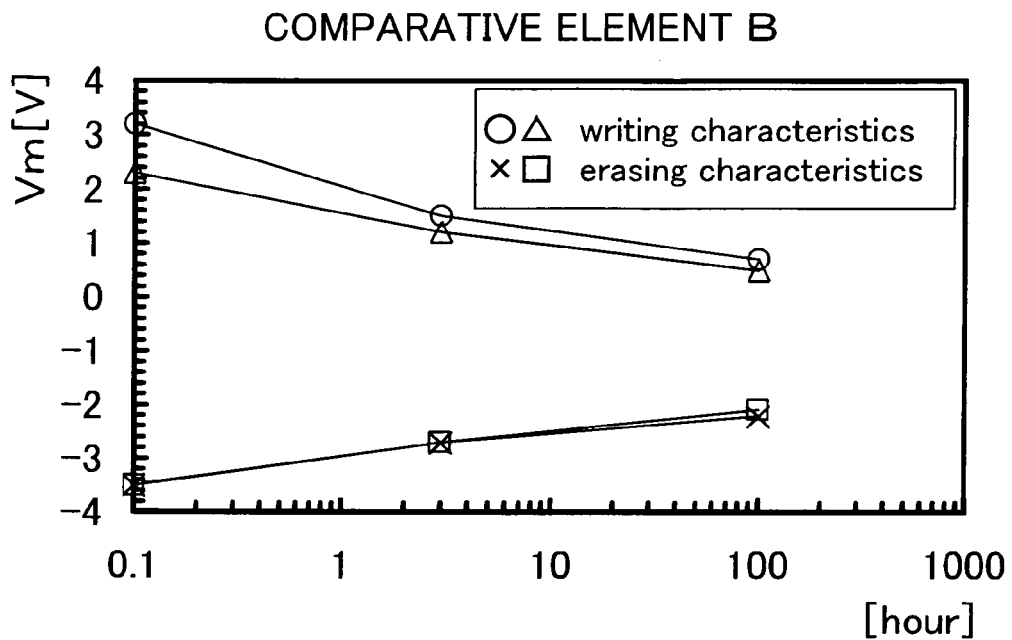
FIG. 7 is a graph which shows retention characteristics of the Comparative Element B.
Figure 8:
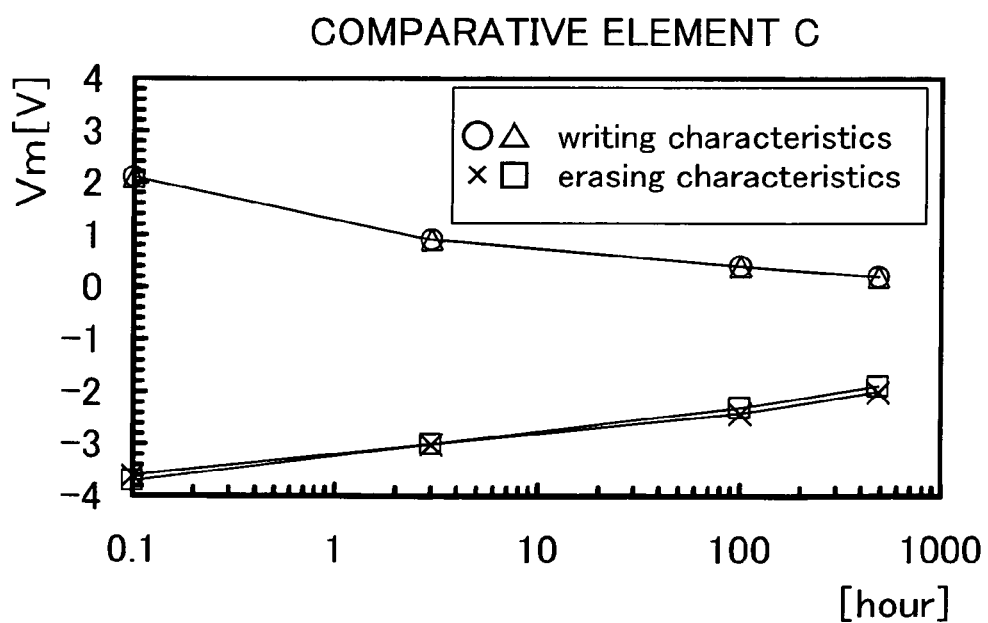
FIG. 8 is a graph which shows retention characteristics of the Comparative Element C.

Retention characteristics of the Element 1 and the Comparative Elements A to C were calculated from the capacitance-voltage characteristics after the writing operation and the capacitance-voltage characteristics after the writing operation and the erasing operation. The measurement results are shown in graphs of FIGS. 5 to 8. FIG. 5 shows the retention characteristic of the Element 1. FIGS. 6, 7, and 8 show the retention characteristics of the Comparative Elements A, B, and C, respectively. The horizontal axis of each of FIGS. 5 to 8 shows the elapsed time from the writing operation and the erasing operation. Note that, because the horizontal axis is a log scale, a point when the writing operation is performed and a point when the erasing operation is performed are denoted by 0.1 hour. The voltage Vm of the vertical axis is a voltage value that is calculated from the measurement results of the capacitance-voltage characteristics. Of tangent lines for the graphs of the capacitance-voltage characteristics, the voltage Vm of the vertical axis is a voltage value when a capacitance value is a half of the maximum when a gradient of the tangent line is the largest.

From the graphs of retention characteristics of FIGS. 5 to 8, a threshold voltage window is obtained by subtracting a threshold voltage for when each element is in an erasing state from a threshold voltage for when each element is in a writing state. Table 1 shows a threshold voltage window (hereinafter referred to as a "Vth window") in which the holding time of each element is 1000 hours. Here, the threshold voltage in a writing state and the threshold voltage in an erasing state are set at a voltage Vm of writing characteristics and a voltage Vm of erasing characteristics, respectively. From a difference between the voltage Vm of writing characteristics with an elapsed time of 1000 hours and the voltage Vm of erasing characteristics with an elapsed time of 1000 hours, a Vth window with a holding time of 1000 hours was calculated. Note that the voltage Vm of writing characteristics after 1000 hours was calculated by extrapolating a graph of writing characteristics. On the other hand, providing that an element returns to an initial state (the state before the writing operation) after 1000 hours after the erasing operation, the voltage Vm of erasing characteristics after 1000 hours was set at a value of the voltage Vm of the initial state (elapsed time is 0 hour). Note that as for the voltage Vm of writing characteristics of an initial state, the Element 1 and the Comparative Element A are approximately −0.8 V, and the Comparative Elements B and C are approximately −0.9 V.

Table 1 shows that the Vth window of the Element 1 is widest. In addition, Table 1 shows that the charge retention characteristic is improved by using a stacked-layer structure like the Element 1 rather than using a single layer of the first silicon nitride film 12 or the second silicon nitride film 13 when the silicon nitride layer 43 is formed. On the other hand, it is found that when the first silicon nitride film 12 and the second silicon nitride film 13 are stacked in reverse order of the Element 1, the charge retention characteristic gets worse than the silicon nitride layer 43 having a stacked-layer structure.

TABLE 1

|  | Vth Window |
| --- | --- |
| Element 1 | 2.15 |
| Comparative Element A | 1.36 |
| Comparative Element B | 1.27 |
| Comparative Element C | 1.01 |

Thus, the composition of the first silicon nitride film 12 in which $NH_3$ is used as a nitrogen source gas, the composition of the second silicon nitride film 13 in which $N_2$ is used as a nitrogen source gas, and each composition ratio was measured using Rutherford Backscattering Spectrometry (RBS) and Hydrogen Forward scattering Spectrometry (HFS).

Here, three kinds of the first silicon nitride films 12 and two kinds of the second silicon nitride films 13 which were different from one another in a reactive gas and flow rate were each formed at a thickness of 100 nm over a single-crystal silicon substrate. Here, in order to distinguish the three kinds of the first silicon nitride films 12, they are referred to as a silicon nitride film 12-a, a silicon nitride film 12-b, and a silicon nitride film 12-c, and the two kinds of the second silicon nitride films 13 are referred to as a silicon nitride film 13-a and a silicon nitride film 13-b.

A process gas and flow rate which were used to form each of the silicon nitride films 12-a, 12-b, 12-c, 13-a, and 13-b are shown in Table 2.

For comparison, a silicon source gas of all silicon nitride films was $SiH_4$, and the flow rate thereof was set at 2 sccm. The silicon nitride films 12-a, 12-b, 12-c, 13-a, and 13-b were formed by a plasma CVD method, and a substrate temperature was set at 400° C., a reaction pressure was set at 40 Pa, and a distance between electrodes was set at 30 mm at the time of film formation. The silicon nitride film 12-a was a film formed under the same condition as the first silicon nitride film 12 of each of the Element 1, the Comparative Element A, and the Comparative Element C. The silicon nitride film 13-a was a film formed under the same condition as the second silicon nitride film 13 of each of the Element 1, the Comparative Element B, and the Comparative Element C.

TABLE 2

| SiN film | Process gases and Flow rate thereof [sccm] | | | | |
| --- | --- | --- | --- | --- | --- |
|  | $SiH_4$ | $NH_3$ | $N_2$ | Ar | $H_2$ |
| 12-a | 2 | 400 | — | — | — |
| 12-b | 2 | 100 | — | — | 400 |
| 12-c | 2 | 100 | — | 400 | — |
| 13-a | 2 | — | 400 | 50 | — |
| 13-b | 2 | — | 100 | 400 | — |

Measurement results of RBS and HFS of the silicon nitride films 12-a, 12-b, 12-c, 13-a, and 13-b are shown in Table 3. Note that oxygen concentration is a value of less than or equal to the minimum limit of detection.

TABLE 3

| SiN film | Concentration [atomic %] | | | Composition | Density | |
|---|---|---|---|---|---|---|
| | H | Si | N | Si/N | atoms/cm$^3$ | g/cm$^3$ |
| 12-a | 21.4 | 30.4 | 48.2 | 0.63 | $8.10 \times 10^{22}$ | 2.1 |
| 12-b | 17.3 | 33.9 | 48.8 | 0.69 | $7.90 \times 10^{22}$ | 2.2 |
| 12-c | 20.7 | 31.3 | 48.0 | 0.65 | $8.00 \times 10^{22}$ | 2.1 |
| 13-a | 10.3 | 38.5 | 51.2 | 0.75 | $7.50 \times 10^{22}$ | 2.2 |
| 13-b | 9.7 | 38.2 | 52.1 | 0.73 | $7.50 \times 10^{22}$ | 2.2 |

Figure 9:
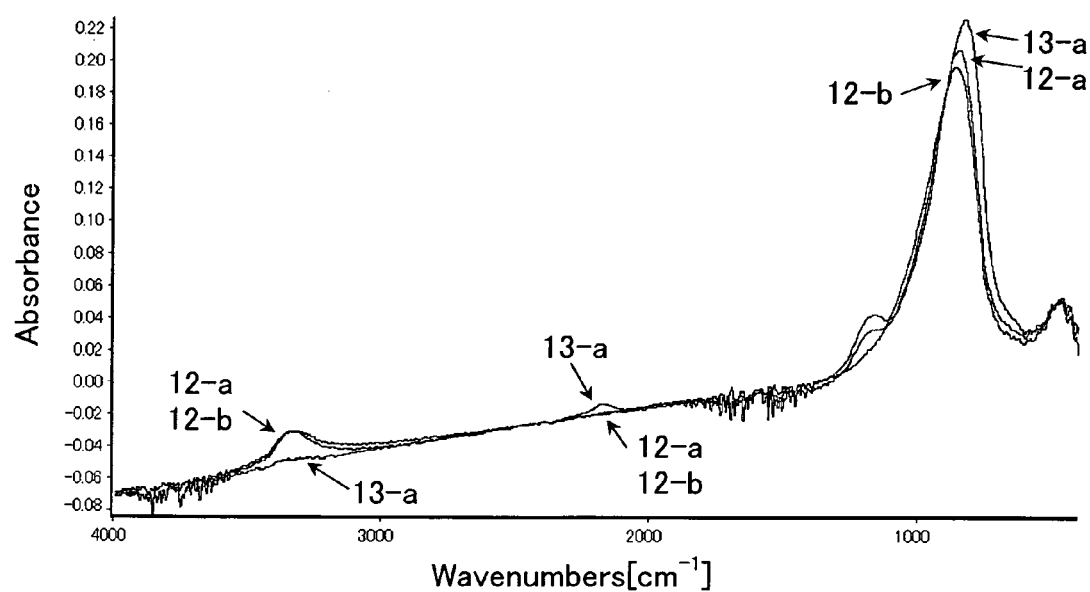
FIG. 9 is an absorption spectrum of FTIR of a silicon nitride film.

A bonding state of an element that forms each of the silicon nitride films 12-a, 12-b, and 13-a was analyzed by Fourier Transform Infrared Spectroscopy (FTIR). FIG. 9 shows an absorption spectrum of the silicon nitride films 12-a, 12-b, and 13-a with FTIR. The N—H bond concentration and the Si—H bond concentration were quantified by using the absorption spectrum of FIG. 9. The concentrations are shown in Table 4.

TABLE 4

| SiN film | Concentration[atoms/cm$^3$] | | | Concentration ratio |
|---|---|---|---|---|
| | N—H | Si—H | N—H + Si—H | Si—H/N—H |
| 12-a | $9.10 \times 10^{21}$ | $2.00 \times 10^{20}$ | $9.30 \times 10^{21}$ | $2.20 \times 10^{-2}$ |
| 12-b | $7.54 \times 10^{21}$ | $2.18 \times 10^{20}$ | $7.76 \times 10^{21}$ | $2.89 \times 10^{-2}$ |
| 13-a | $2.29 \times 10^{21}$ | $3.25 \times 10^{21}$ | $5.54 \times 10^{21}$ | 1.42 |

The measurement data of Table 3 and Table 4 shows that the nitrogen concentration of the second silicon nitride film 13 is higher than that of the first silicon nitride film 12 but the N—H bond concentration of the first silicon nitride film 12 is higher than that of the second silicon nitride film 13. That is, the data shows that the charge retention characteristic of the Element 1 is improved by providing the first silicon nitride film that contains more nitrogen bonding with hydrogen as a lower layer.

The Si—H bond concentration of the first silicon nitride film 12 is lower than that of the second silicon nitride film 13, and the Si—H bond concentration of the first silicon nitride film 12 is approximately 1/10 of that of the second silicon nitride film 13. In addition, as for the ratio ((Si—H)/(N—H)) of the Si—H bond concentration to the N—H bond concentration, the second silicon nitride film 13 is approximately 100 times higher than the first silicon nitride film 12. Accordingly, the charge retention characteristic of the Element 1 can be improved by forming a silicon nitride film having a high concentration ratio ((Si—H)/(N—H)) as an upper layer, that is, on the side distant from a channel formation region and forming a silicon nitride film having a low concentration ratio on the channel formation region side.

When the attention is focused on the composition ratio of Si/N of Table 3, the second silicon nitride film 13 is a film stoichiometrically closer to $Si_3N_4$ than the first silicon nitride film 12.

Note that, in the case where a gas that contains halogen (e.g., $SiCl_4$, $SiHCl_3$, $SiH_2Cl_2$, $SiH_3Cl_3$, $SiF_4$, or the like) is used as a silicon source gas, a silicon nitride film includes Si—X bonds (X is a halogen element). Since the Si—X bond concentration is influenced by the kind of the nitrogen source gas, the silicon nitride film can be formed so that the Si—X bond concentration has a similar tendency to the Si—H bonds of Table 4.

Therefore, in the case where a gas that contains hydrogen or halogen (e.g., $SiH_4$, $SiCl_4$, $SiF_4SiHCl_3$, $SiH_2Cl_2$, or $SiH_3Cl_3$) is used as a silicon source gas, the sum of the Si—X bond concentration and the Si—H bond concentration of the second silicon nitride film 13 can be higher, and the ratio of the sum of the Si—X bond concentration and the Si—H bond concentration to the N—H bond concentration, ((Si—H+Si—X)/(N—H)), of the second silicon nitride film 13 can be higher than those of the first silicon nitride film 12.

In the case where silicon source gases of the first silicon nitride film 12 and the second silicon nitride film 13 contain halogen in compositions, like $SiCl_4$ or $SiF_4$, and do not contain hydrogen, the Si—X bond concentration of the second silicon nitride film 13 can be higher than that of the first silicon nitride film 12. In this case, the ratio of the Si—X bond concentration to the N—H bond concentration, ((Si—X)/(N—H)), of the second silicon nitride film 13 can also be higher than that of the first silicon nitride film 12.

Therefore, the first silicon nitride film 12 that contains a larger number of N—H bonds is provided on the channel formation region 16 side and the second silicon nitride film 13 that contains a smaller number of N—H bonds is provided on the conductive film 15 side so that a charge retention characteristic of the nonvolatile semiconductor memory element can be improved.

It is added that the first silicon nitride film 12 and the second silicon nitride film 13 shown in Table 2 are films formed by a plasma CVD method at a heating temperature of less than or equal to 500° C., and these silicon nitride films are films which can be formed over a substrate having a distortion temperature of less than or equal to 750° C., like a glass substrate.

Next, nonvolatile memory transistors each having a cross-sectional structure that is different from each of FIGS. 1 and 2 will be described with reference to FIGS. 10 to 17. The same reference numerals as FIGS. 1 and 2 indicate the same components, and repetitive description thereof is omitted.

Figure 10:
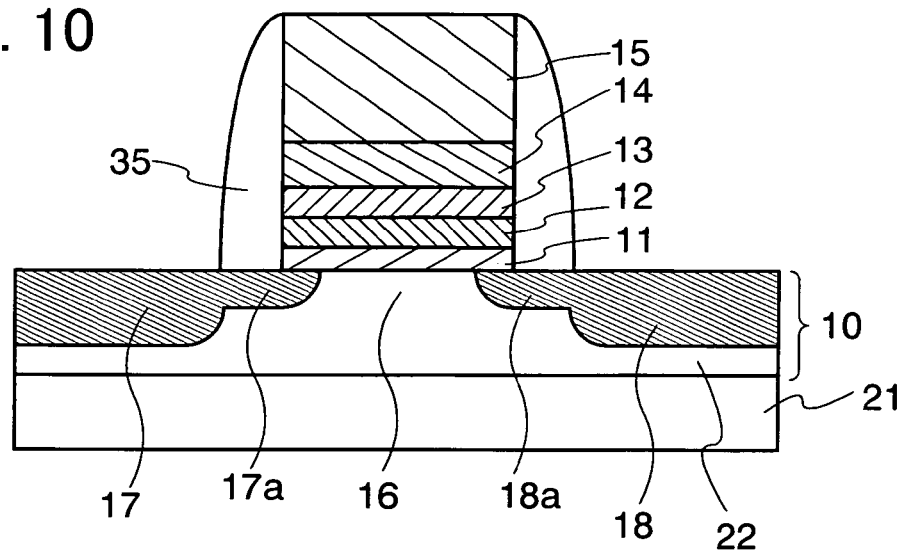
FIG. 10 is a cross-sectional view of a nonvolatile memory transistor.
Figure 11:
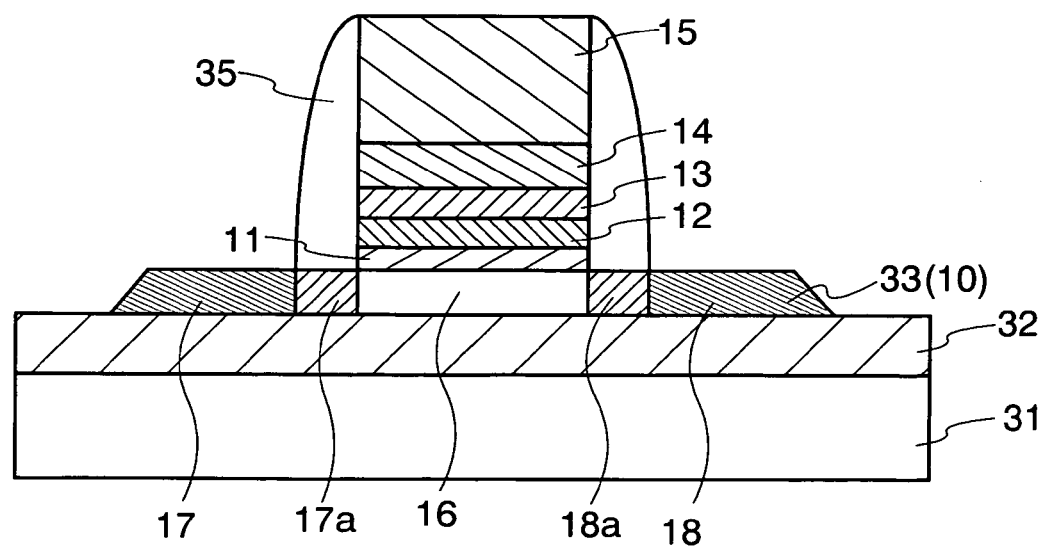
FIG. 11 is a cross-sectional view of a nonvolatile memory transistor.

FIGS. 10 and 11 are cross-sectional views showing another structural example of a nonvolatile memory transistor. Each of the nonvolatile memory transistors shown in FIGS. 10 and 11 is provided with a spacer 35 formed of an insulating film on side walls of a stacked film that is formed of the first insulating film 11, the first silicon nitride film 12, the second silicon nitride film 13, the second insulating film 14, and the conductive film 15. The spacer 35 is also referred to as a sidewall. Formation of the spacer 35 has an effect to prevent charge that is stored in the second silicon nitride film 13 from leaking to the conductive film 15. In addition, by use of the spacer 35, a low concentration impurity region 17a and a low concentration impurity region 18a which are adjacent to the channel formation region 16 can be formed in a self-aligned manner.

The low concentration impurity regions 17a and 18a function as low concentration drains (LDDs: lightly doped drains). The low concentration impurity regions 17a and 18a are provided so that deterioration of the first insulating film 11 due to repetition of the reading operation can be suppressed.

Figure 12:
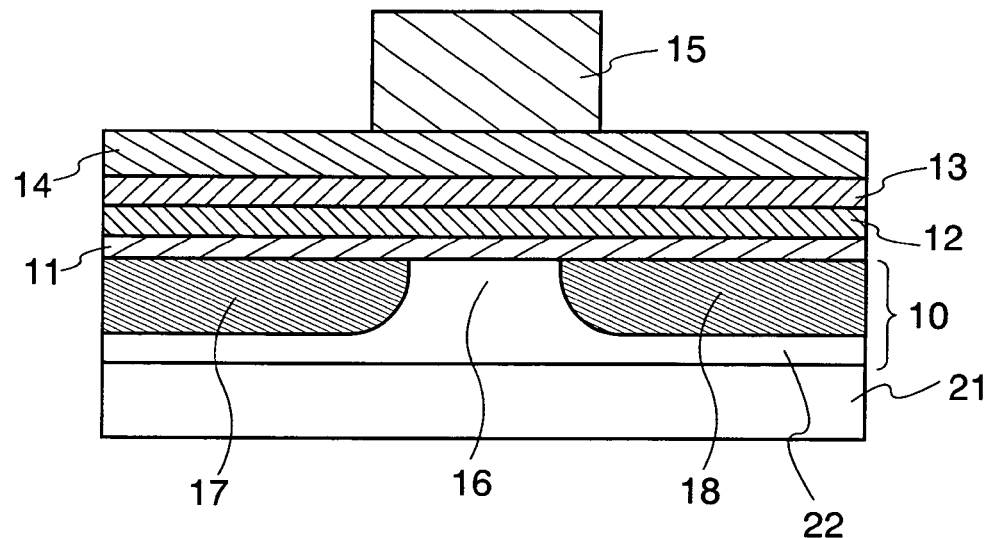
FIG. 12 is a cross-sectional view of a nonvolatile memory transistor.

FIGS. 12 and 13 are cross-sectional views each showing another structural example of a nonvolatile memory transistor. The nonvolatile memory transistors shown in FIGS. 12 and 13 differ from those of FIGS. 1 and 2 in that the first insulating film 11, the first silicon nitride film 12, the second silicon nitride film 13, and the second insulating film 14 are not processed into the same shape as the conductive film 15.

In the structures of FIGS. 12 and 13, the first insulating film 11, the first silicon nitride film 12, the second silicon nitride film 13, and the second insulating film 14 are formed to cover the high concentration impurity regions 17 and 18 by using adjacent memory transistors. In this case, in a manufacture process, the films 11 to 15 are not removed by etching to expose the semiconductor region 10; therefore, damage on the semiconductor region 10 can be reduced. Since there is no etching process of the films 11 to 15, throughput can be improved.

Figure 14:
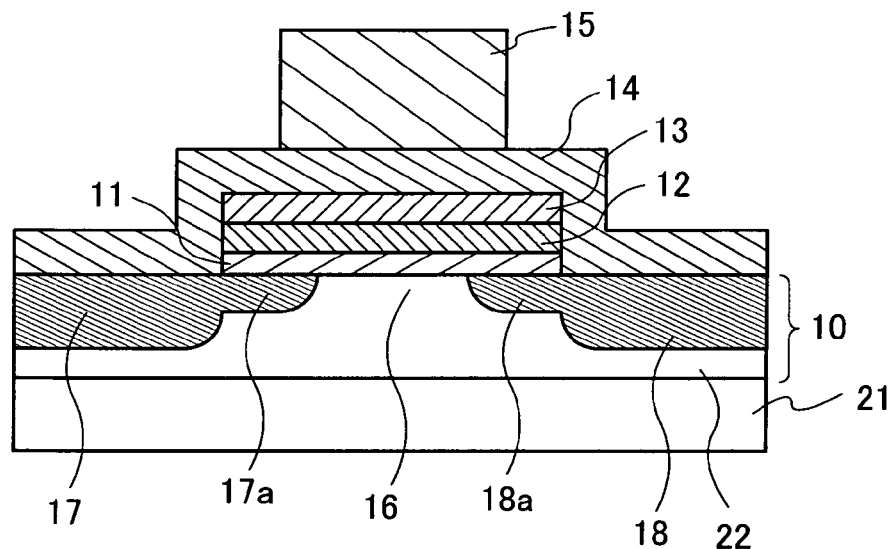
FIG. 14 is a cross-sectional view of a nonvolatile memory transistor.
Figure 15:
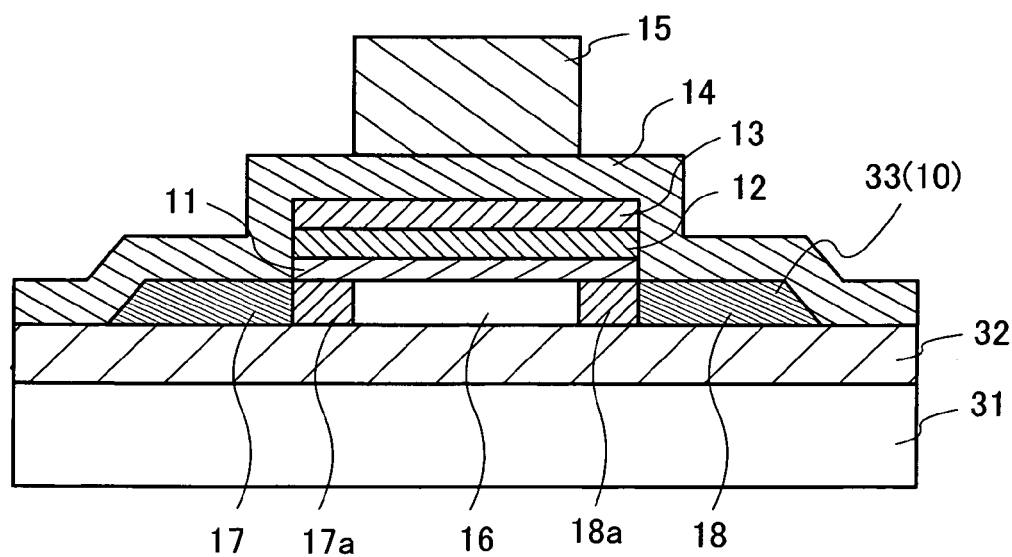
FIG. 15 is a cross-sectional view of a nonvolatile memory transistor.

FIGS. 14 and 15 are cross-sectional views each showing another structural example of a nonvolatile memory transistor. As the nonvolatile memory transistors of FIGS. 14 and 15, the width in a channel length direction of the stacked film that is formed of the first insulating film 11, the first silicon nitride film 12, and the second silicon nitride film 13 is longer than that of the conductive film 15. The second insulating film 14 is formed to cover the stacked film that is formed of the films 11 to 13 and the high concentration impurity regions 17 and 18.

When the stacked film that is formed of the films 11 to 13 and the conductive film 15 have any structure shown in FIG. 14 or 15, the channel formation region 16, the high concentration impurity regions 17 and 18, and the low concentration impurity regions 17a and 18a can be formed in a self-aligned manner in the semiconductor region 10. When the conductive film 15 and the stacked film that is formed of the films 11 to 13 are used as masks and the semiconductor region 10 is doped with an impurity which imparts n-type or p-type conductivity, the channel formation region 16, the high concentration impurity regions 17 and 18, and the low concentration impurity regions 17a and 18a are formed in a self-aligned manner in the semiconductor region 10. Accordingly, the first insulating film 11, the first silicon nitride film 12, and the second silicon nitride film 13 are overlapped with the low concentration impurity regions 17a and 18a.

Note that, in FIG. 15, the first insulating film 11 is not necessarily processed into the same shape as the first silicon nitride film 12 and the second silicon nitride film 13, but the first insulating film 11 can be formed to cover the semiconductor film 33 as shown in FIG. 13, as well.

Figure 16:
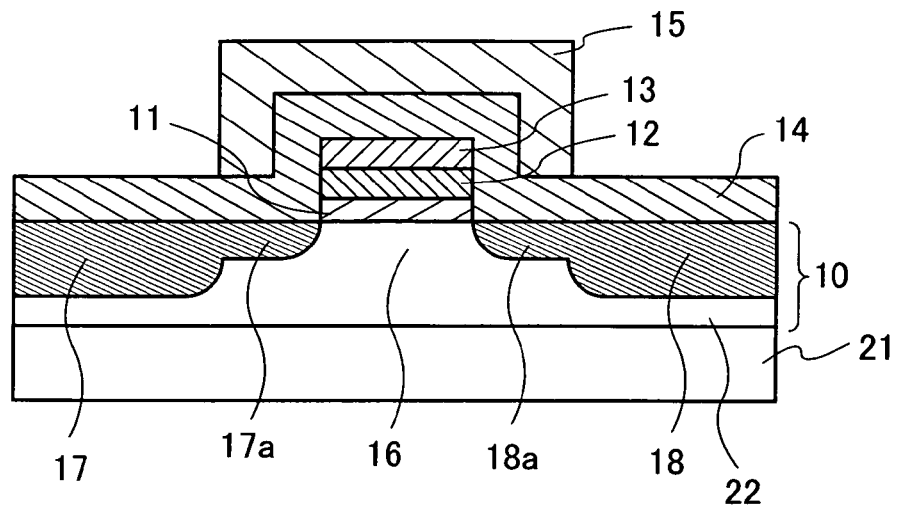
FIG. 16 is a cross-sectional view of a nonvolatile memory transistor.
Figure 17:
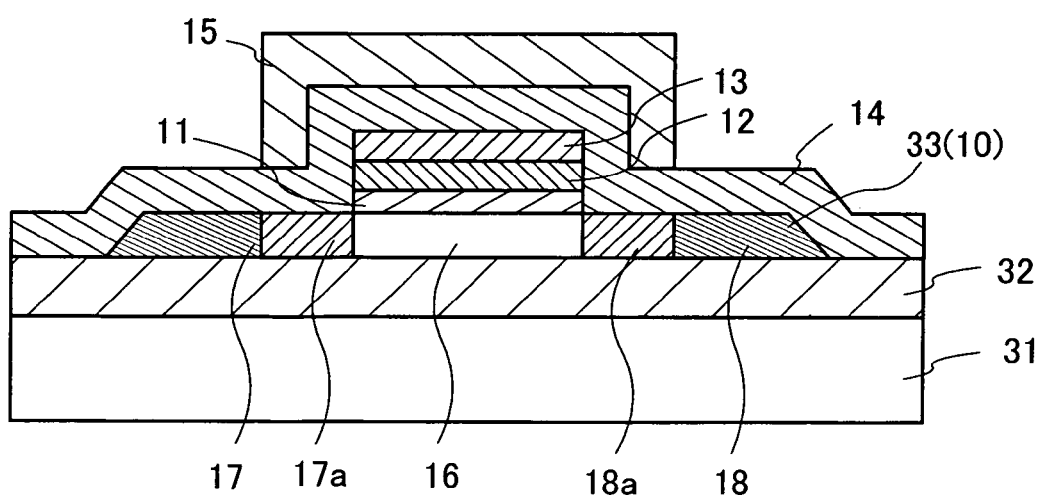
FIG. 17 is a cross-sectional view of a nonvolatile memory transistor.

FIGS. 16 and 17 are cross-sectional views each showing another structural example of a nonvolatile memory transistor. The conductive film 15 is formed so that the width of the conductive film 15 in a channel length direction is longer than the channel length. The second insulating film 14 is formed to cover the first silicon nitride film 12 and the second silicon nitride film 13.

The first silicon nitride film 12, the second silicon nitride film 13, and the conductive film 15 have such a structure as shown in FIG. 16 or 17 so that the channel formation region 16, the high concentration impurity regions 17 and 18, and the low concentration impurity regions 17a and 18a can be formed in a self-aligned manner in the semiconductor region 10.

The first insulating film 11, the first silicon nitride film 12, the second silicon nitride film 13, and the second insulating film 14 are formed over the semiconductor region 10, as shown in FIG. 16 or 17. Before the conductive film 15 is formed, the first silicon nitride film 12 and the second silicon nitride film 13 are used as masks, and the semiconductor region 10 is doped with an impurity which imparts n-type or p-type conductivity at a low concentration to form low concentration impurity regions. After that, the conductive film 15 having such a structure as shown in FIG. 16 or 17 is formed. Next, the conductive film 15 is used as a mask, and the semiconductor region 10 is doped with an impurity which imparts n-type or p-type conductivity at a high concentration. By this doping step of impurities, the channel formation region 16, the high concentration impurity regions 17 and 18, and the low concentration impurity regions 17a and 18a are formed in a self-aligned manner in the semiconductor region 10.

Note that, in the nonvolatile memory transistor of FIG. 17, the first insulating film 11 is not necessarily processed into the same shape as the first silicon nitride film 12 and the second silicon nitride film 13, but the first insulating film 11 can be formed to cover the semiconductor film 33 as shown in FIG. 13, as well.

In FIGS. 1, 10, 12, 14, and 17, a bulk single-crystal or polycrystalline silicon substrate (silicon wafer), a single-crystal or polycrystalline silicon germanium substrate, or a single-crystal or polycrystalline germanium substrate can be used as the semiconductor substrate 21. Further, an SOI (silicon-on-insulator) substrate can be used as well. As the SOI substrate, a so-called SIMOX (separation by implanted oxygen) substrate can be used, which is formed in such a manner that after oxygen ions are injected into a mirror-polished wafer and high-temperature annealing is performed so that an oxide layer is formed at a certain depth from the surface and defects generated in a surface layer are eliminated. In the case where an SOI substrate is used, the semiconductor region 10 is formed in a thin silicon layer over an oxide layer formed in a substrate; even when the well 22 is not formed, elements can be separated. In a similar manner to the SOI substrate, an SGOI (silicon-germanium on insulator) substrate or a GOI (germanium on insulator) substrate can also be used.

Although a MONOS nonvolatile memory transistor is described as an example of a nonvolatile semiconductor memory element with reference to FIGS. 1, 2 and FIGS. 10 to 17, a nonvolatile memory transistor having an MNOS structure can be applied to a nonvolatile semiconductor memory element of the present invention. In each of the MONOS nonvolatile memory transistors of FIGS. 1, 2 and FIGS. 10 to 17, the conductive film 15 may be formed in contact with the second silicon nitride film 13 without forming the second insulating film 14 so that a nonvolatile memory transistor having an MNOS structure can be formed.

Embodiment Mode 2

In this embodiment mode, a nonvolatile semiconductor memory device will be described as a semiconductor device of the present invention.

Figure 18:
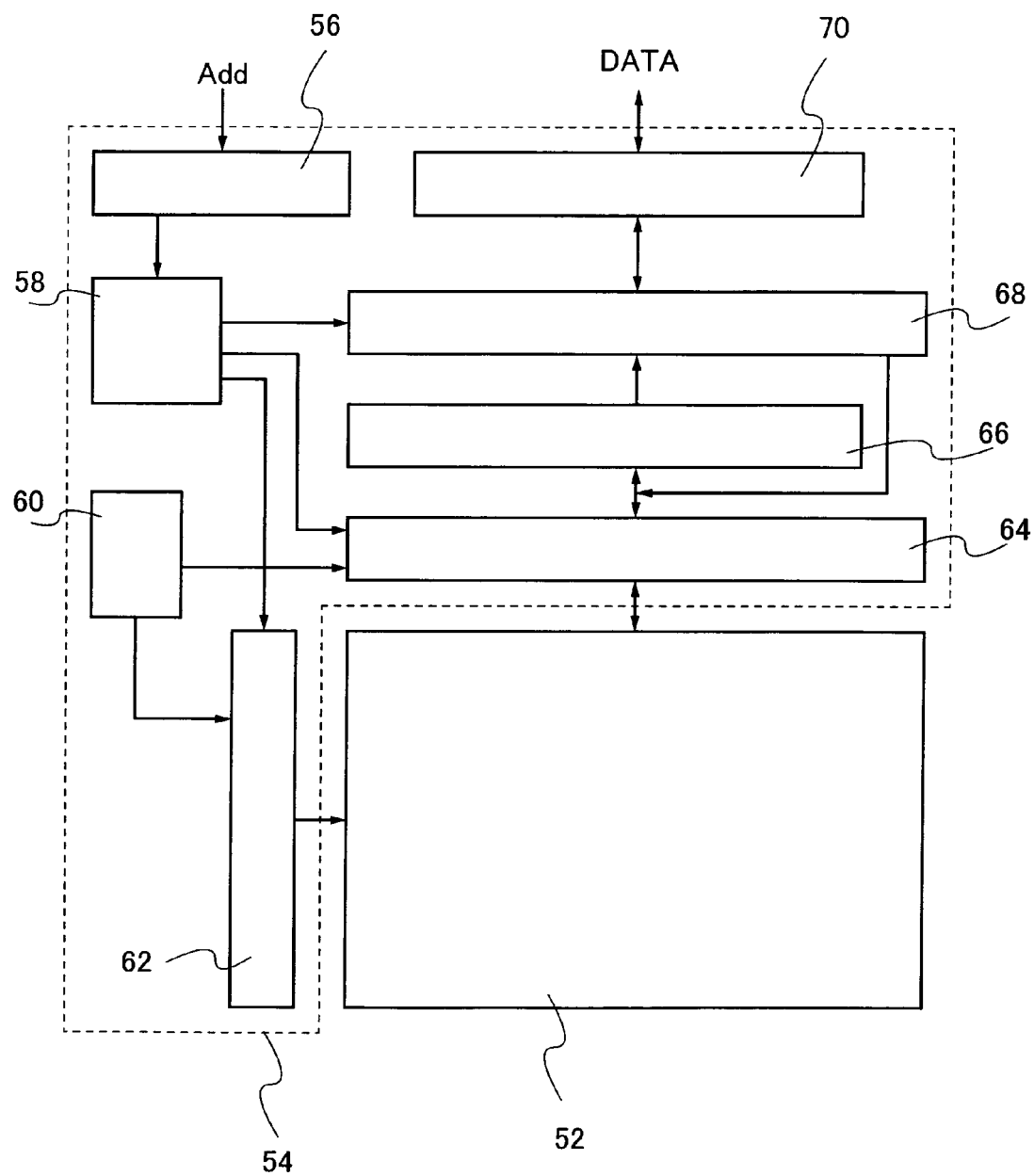
FIG. 18 is a block diagram which shows a structural example of a semiconductor device.

FIG. 18 is a block diagram showing a structural example of a nonvolatile semiconductor memory device. In the nonvolatile semiconductor memory device of FIG. 18, a memory cell array 52 and a logic portion 54 which is connected to the memory cell array 52 and which controls the writing operation, the erasing operation, the reading operation, and the like are formed over the same substrate. The memory cell array 52 includes a plurality of word lines WLs, a plurality of bit lines BLs which are crossed to the word lines WLs, and a plurality of memory cells MCs connected to the word lines WLs and the bit lines BLs. As a storage unit of data of the memory cells MCs, the nonvolatile memory transistor described in Embodiment Mode 1 is used. Accordingly, a nonvolatile semiconductor memory device which is superior in a charge retention characteristic and has high reliability can be obtained.

The structure of the logic portion 54 is as follows. A row decoder 62 for selection of the word line and a column decoder 64 for selection of the bit line are provided around the memory cell array 52. An address is transmitted to a control circuit 58 through an address buffer 56, and an inner row address signal and an inner column address signal are transferred to the row decoder 62 and the column decoder 64, respectively.

A potential obtained by boosting a power supply potential is used for writing and erasing of data. Therefore, a booster circuit 60 controlled by the control circuit 58 according to an operation mode is provided. Output of the booster circuit 60 is supplied to the word line WL or the bit line BL formed in the memory cell array 52 through the row decoder 62 and the column decoder 64. Data output from the column decoder 64 is input to a sense amplifier 66. Data read by the sense amplifier 66 is retained in a data buffer 68. Data retained in the data buffer 68 is accessed randomly by control by the control circuit 58, and is output through a data input/output buffer 70. Writing data is once retained in the data buffer 68 through the data input/output buffer 70 and is transferred to the column decoder 64 by control by the control circuit 58.

In the memory cell array 52, a potential that differs from the power supply potential is necessary to be used. Therefore, it is desirable that at least the memory cell array 52 and the logic portion 54 be electrically insulated and isolated. As described in Embodiment Modes 3 to 6, when a nonvolatile memory element and a transistor of a peripheral circuit are formed using a semiconductor film formed over an insulating film, insulation and isolation can be easily performed. Accordingly, a nonvolatile semiconductor memory device with no malfunction and low power consumption can be obtained.

Figure 19:
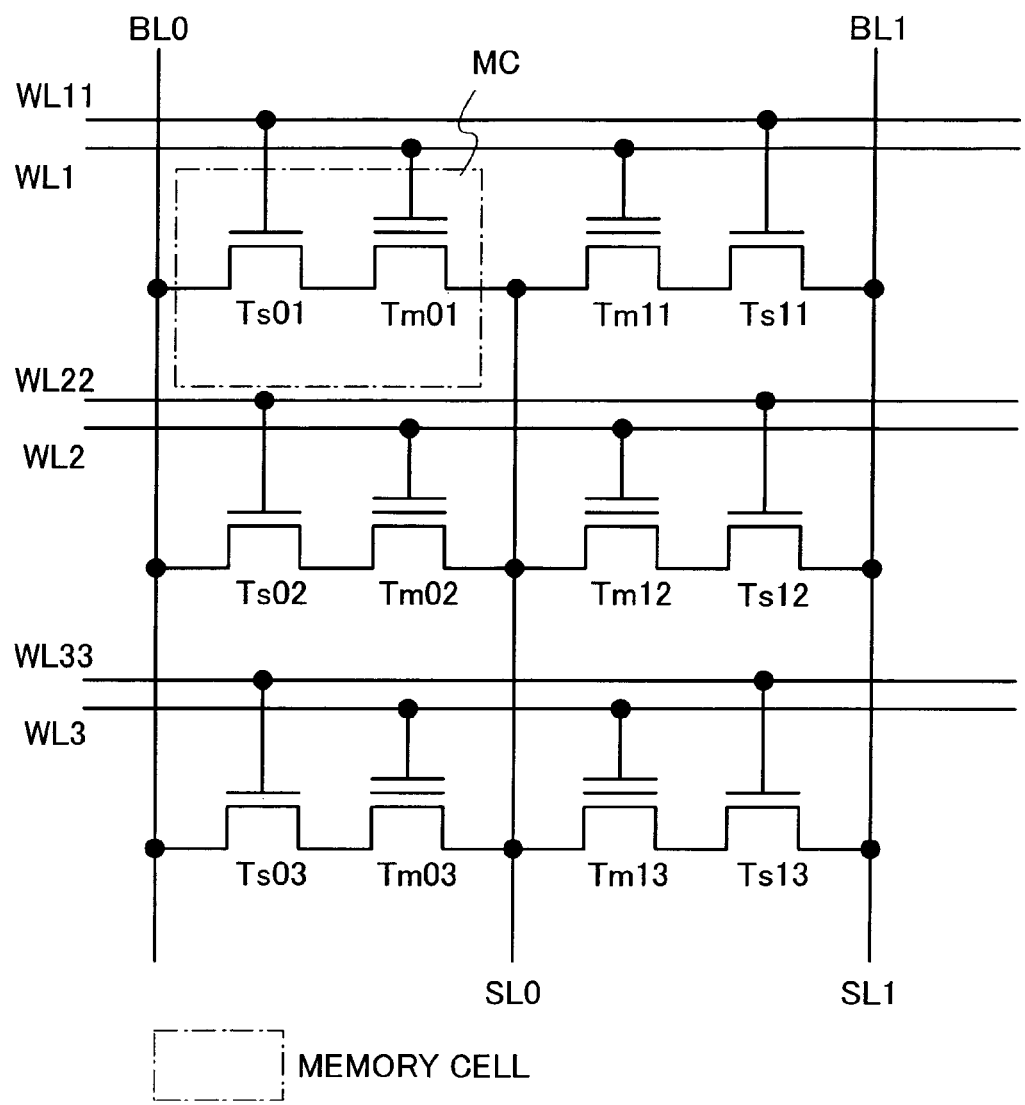
FIG. 19 is a circuit diagram which shows a structural example of a memory cell array.

Hereinafter, a structural example of the memory cell array will be described with reference to FIGS. 19 to 21. FIG. 19 is a circuit diagram showing a structural example of the memory cell array 52. The memory cells MCs are arranged in matrix. In FIG. 19, the memory cells MCs at 3 rows×2 columns are shown. Each memory cell MC stores information of 1 bit and includes a switching transistor Ts and a nonvolatile memory transistor Tm which are connected in series. The memory cell array 52 is provided with bit lines BL0 and BL1 and source lines SL0 and SL1 for every column. In addition, first word lines WL1 to WL3 and second word lines WL11 to WL13 are provided for every row.

When the attention is focused on the memory cell MC specified by the bit line BL0 and the first word line WL1, a gate of a switching transistor Ts01 is connected to the second word line WL11, one of a source and a drain of the switching transistor Ts01 is connected to the bit line BL0, and the other thereof is connected to a nonvolatile memory transistor Tm01. A gate of the nonvolatile memory transistor Tm01 is connected to the first word line WL1, one of a source and a drain of the nonvolatile memory transistor Tm01 is connected to the switching transistor Ts01, and the other thereof is connected to the source line SL0.

In the case where both the switching transistor Ts and the nonvolatile memory transistor Tm (hereinafter also referred to as a "memory transistor Tm") are n-channel transistors, providing that the potential of the second word line WL11 and the bit line BL1 is set at a high level (hereinafter referred to as an "H level") and the potential of the bit line BL0 is set at a low level (hereinafter referred to as an "L level") to write data in the memory cell MC specified by the bit line BL0 and the first word line WL1, high voltage is applied to the second word line WL11. Accordingly, charge is injected in a charge storage layer of the nonvolatile memory transistor Tm01. To erase data from the nonvolatile memory transistor Tm01, the potential of the first word line WL1 and the bit line BL0 is set at an H level and high voltage of negative polarity is applied to the second word line WL11.

Figure 20:
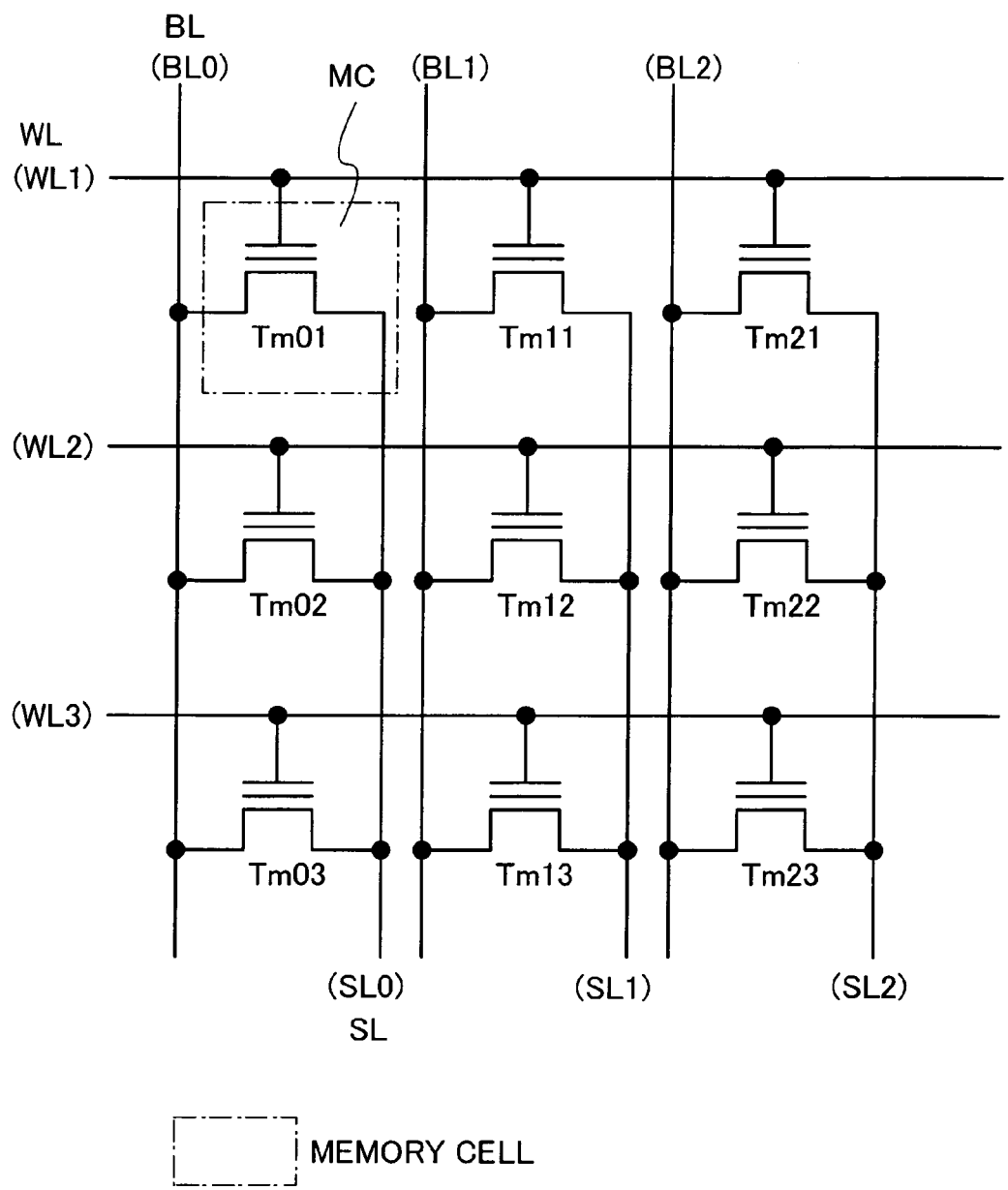
FIG. 20 is a circuit diagram which shows a structural example of a memory cell array.

FIG. 20 is a circuit diagram showing another structural example of the memory cell array 52. In FIG. 20, the memory cell MC differs from that of FIG. 19 in that the switching transistor Ts is not provided and that one of a source and a drain of the nonvolatile memory transistor Tm is electrically connected to the bit line BL without through a switching element. Accordingly, in the memory cell array 52 of FIG. 20, the second word lines WL11, WL22, and WL33 are not provided.

In the case where the nonvolatile memory transistor Tm is an n-channel transistor, an example of writing of data to the memory cell MC specified by the bit line BL0 and the first word line WL1 is as follows. Providing that the potential of a source line SL is set at L level (e.g., 0 V), high voltage is applied to the first word line WL, and a potential corresponding to data "0" or data "1" is given to the bit line BL. For example, the potential of the bit line BL is set at potentials of an H level and an L level for the data "0" and the data "1", respectively. In a drain of the nonvolatile memory transistor Tm01 to which an H level potential has been given, in order to write data "0", hot electrons are generated near the drain and the hot electrons are injected into a charge storage layer. That is, electrons are injected into the charge storage layer by F-N tunneling current. In the case of writing the data "1", such electron injection does not occur.

In the memory cell MC to which data "0" has been given, hot electrons are generated near the drain by a high lateral electric field between the drain and the source, and the hot electrons are injected into the charge storage layer. A state in which threshold voltage is high by the injection of electrons into the charge storage layer is "0". In the case where data "1" has been given, hot electrons are not generated, and a state in which electrons are not injected into the charge storage layer and threshold voltage is low is kept. That is, an erasing state is kept.

When the data is erased, the potential of the source line SL0 is set at a high potential of positive polarity (e.g., a positive potential of approximately 10 V) and the bit line BL0 is made to be in a floating state. Then, the potential of the first word line WL1 is set at a high potential of negative polarity. Thus, electrons are extracted from the charge storage layer of the nonvolatile memory transistor Tm01 to a semiconductor region. Accordingly, an erasing state of data "1" is obtained.

For example, data is read in the following manner. Providing that the potential of the source line SL0 is set at 0 V and the potential of the bit line BL0 is set at approximately 0.8 V, a reading potential set at an intermediate value of threshold voltages corresponding to the data "0" and the data "1" are given to the potential of the first word line WL1. At this time, the sense amplifier 66 connected to the bit line BL0 judges whether or not current flows from the nonvolatile memory transistor Tm to the bit line BL0.

Figure 21:
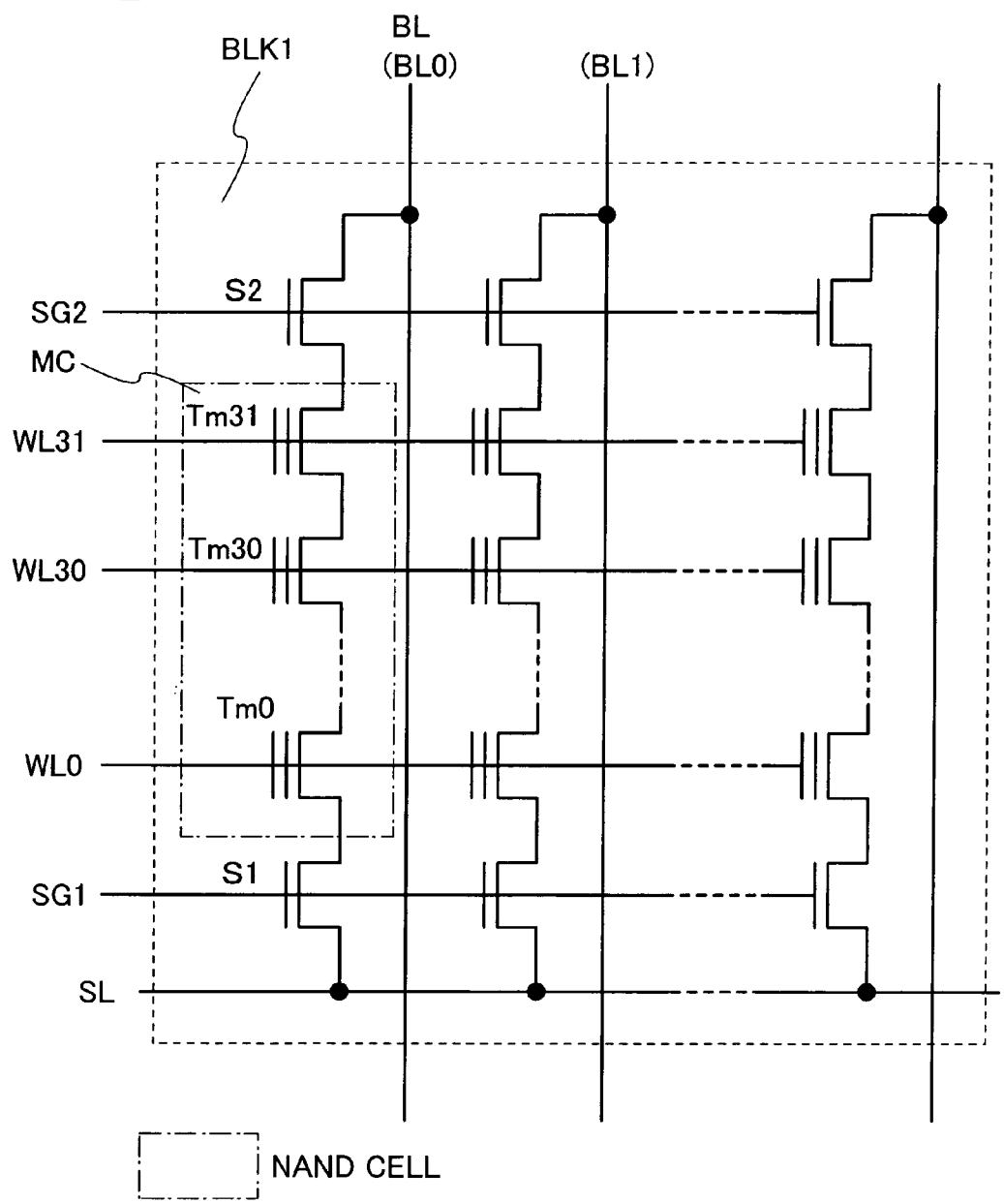
FIG. 21 is a circuit diagram which shows a structural example of a memory cell array.

FIG. 21 is a circuit diagram showing another structural example of the memory cell array 52. FIG. 21 shows an equivalent circuit in which the memory cell MC is a NAND type memory cell. A block BLK1 includes a plurality of NAND cells. The block BLK1 shown in FIG. 21 has 32 word lines (word lines WL0 to WL31). The memory cell MC is formed of a plurality of nonvolatile memory transistors Tms connected in series.

In one memory cell MC specified by the bit line BL0, gates of nonvolatile memory transistors Tm0 to Tm31 are connected to the first distinct word lines WL0 to WL31, respectively. One of a source and a drain of the first-row nonvolatile memory transistor Tm0 is connected to a first selection transistor S1, and one of a source and a drain of the $32^{nd}$-row nonvolatile memory transistor Tm31 is connected to a second selection transistor S2. The first selection transistor S1 is connected to a first selection gate line SG1 and the bit line BL0, and the second selection transistor S2 is connected to a second selection gate line SG2 and the bit line BL0.

Here, providing that the nonvolatile memory transistors Tm0 to Tm31, the first selection transistor S1, and the second selection transistor S2 are n-channel transistors, the writing operation and the erasing operation are described. In a NAND type memory cell, after the memory cell MC is made in an erasing state, the writing operation is performed. The erasing state is a state in which threshold voltage of each of the memory transistors Tm0 to Tm31 of the memory cell MC is a negative voltage.

FIG. 22A is a circuit diagram describing an example of operation to write "0" in the memory transistor Tm0 shown in FIG. 21, and FIG. 22B is a circuit diagram describing an example of operation to write "1". To write "0", for example, 0 V (ground voltage) is applied to the bit line BL0 and Vcc (a power supply potential) is applied to the second selection gate line SG2 to turn the second selection transistor S2 on. Meanwhile, 0 V is applied to the first selection gate line SG1 to turn the first selection transistor S1 off. Next, the potential of the word line WL0 is set at a high potential Vpgm (approximately 20 V), and potentials of the other word lines are set at an intermediate potential Vpass (approximately 10 V). Since the potential of the bit line BL0 is 0 V, the potential of a channel formation region of the selected memory cell M0 becomes 0 V. A potential difference between the word line WL0 and the channel formation region is large; therefore, electrons are injected into a charge storage layer of the nonvolatile memory transistor Tm0 by F-N tunneling current. Consequently, the threshold voltage of the nonvolatile memory transistor Tm0 has positive polarity so that a state where "0" has been written is obtained.

In the case where "1" is written to the nonvolatile memory transistor Tm0, as shown in FIG. 22B, the potential of the bit line BL0 is set at a power supply potential Vcc, for example. Since the potential of the second selection gate line SG2 is Vcc, the second selection transistor S2 is cut off. Therefore, a channel formation region of the nonvolatile memory transistor Tm0 is made in a floating state. Next, the potential of the word line WL0 is set at a writing potential Vpgm (20 V) that is a high potential of positive polarity and potentials of the other word lines WLs are set at an intermediate potential Vpass (10 V). Voltage of a channel formation region is higher than (Vcc-Vth) and becomes, for example, approximately 8 V, due to capacitance coupling of each of the word lines WL0 to WL31 and the channel formation region. Therefore, a potential difference between the word line WL0 and the channel formation region is small. Therefore, electron injection into a floating gate of the memory transistor Tm0 by F-N tunneling current does not occur. Accordingly, the threshold voltage of the nonvolatile memory transistor Tm0 has negative polarity so that a state where "1" has been written is obtained.

Figure 23:
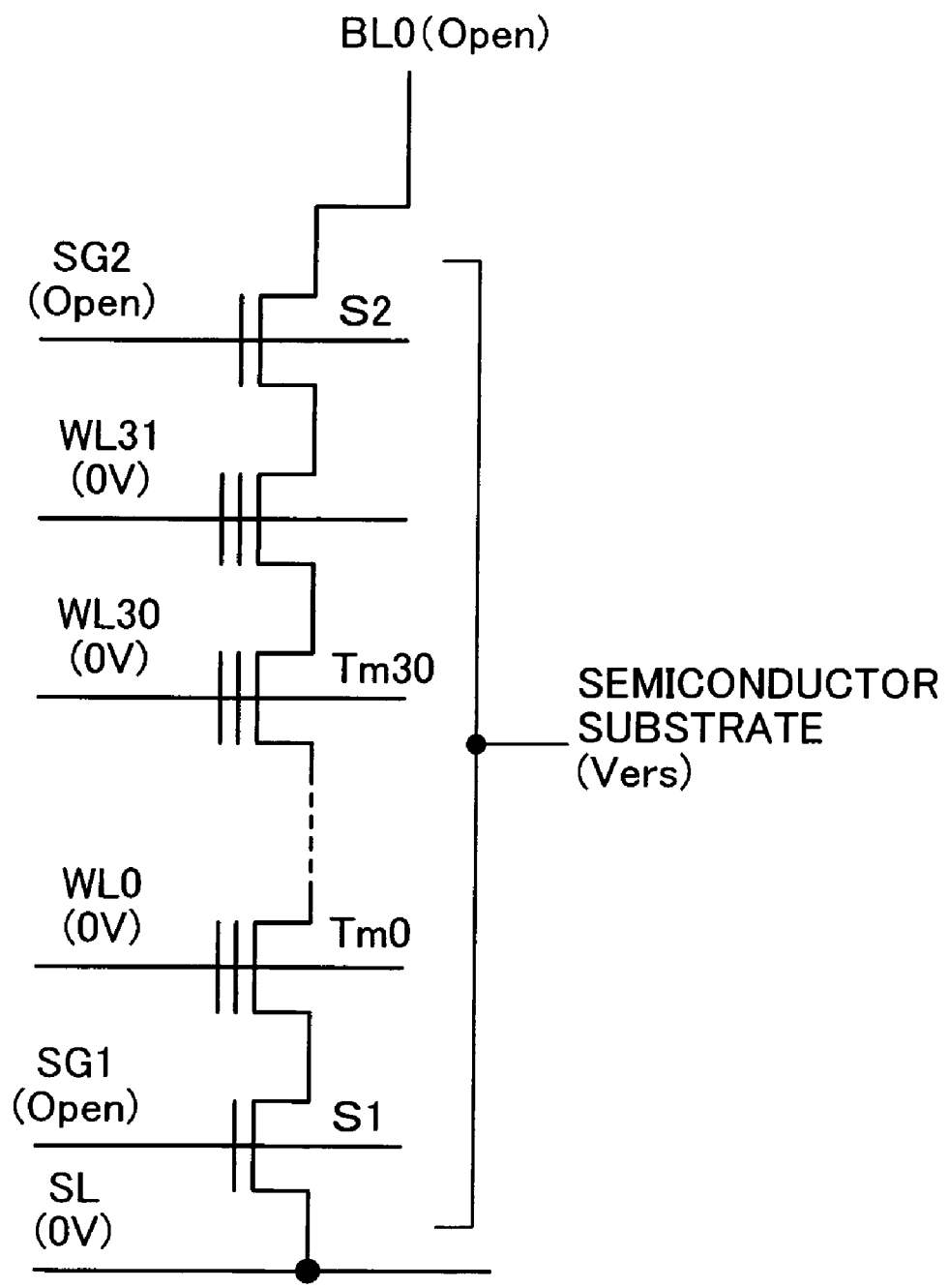
FIG. 23 is a circuit diagram which describes an erasing operation of a memory cell array.

FIG. 23 is a circuit diagram describing an example of the erasing operation. In the memory cell array 52 of FIG. 21, data of a plurality of nonvolatile memory transistors Tms included in the same block BLK1 is erased at the same time. As shown in FIG. 23, when potentials of all the word lines WL0 to WL31 of the selected block is set at 0 V and the p-well potential of a semiconductor substrate is set at an erasing potential Vers which is a high potential of negative polarity, the bit line BL and the source line SL are in a floating state. Accordingly, electrons are discharged from a charge storage layer of all the memory transistors Tms included in the block BLK1 to a semiconductor substrate by tunneling current, and threshold voltage of the memory transistor Tm shifts to a negative direction.

Figure 24:
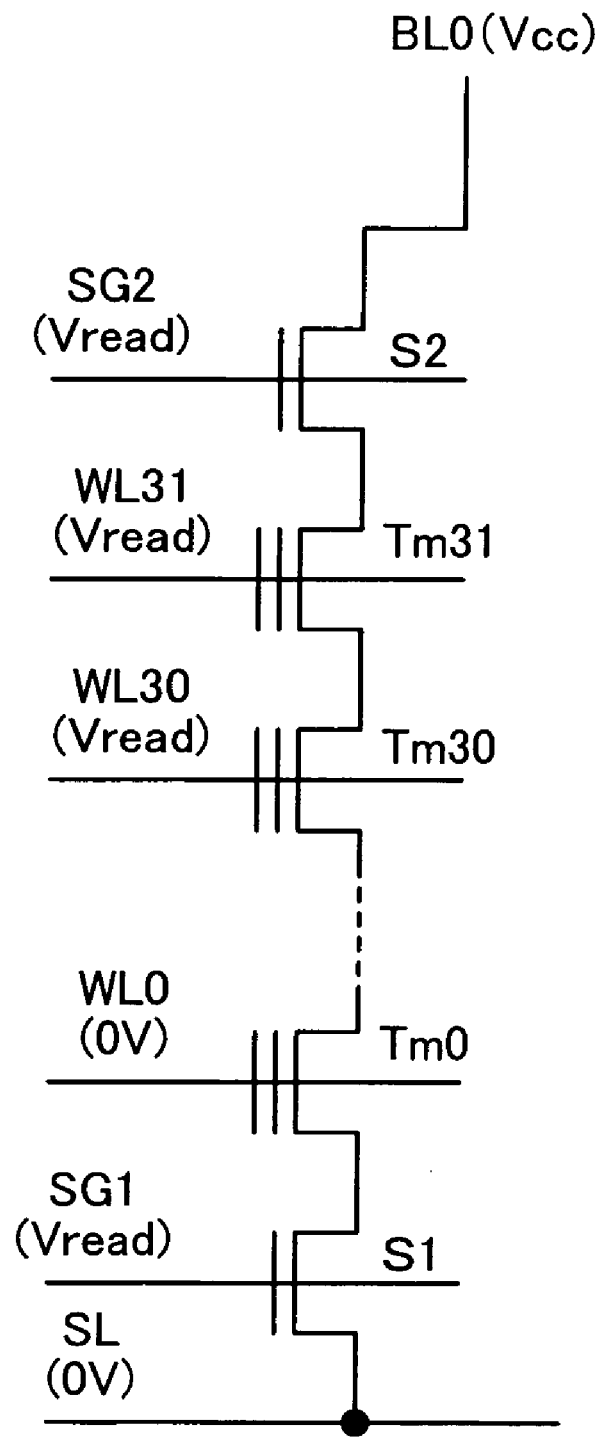
FIG. 24 is a circuit diagram which describes a reading operation of a memory cell array.

FIG. 24 is a circuit diagram describing an example of the reading operation to read data from the memory transistor Tm0 of FIG. 21. In the reading operation, the potential of the first word line WL0 is set at a reading potential Vr (e.g., 0 V), and the word lines WL1 to WL31 of an unselected memory cell and the selection gate lines SG1 and SG2 are set at an intermediate potential Vread for reading which is a little higher than a power supply potential Vcc. As a result of this, the memory transistors Tm1 to Tm31 other than the memory transistor Tm0 function as transfer transistors, and current flowing to the bit line BL0 is detected in the sense amplifier 66 shown in FIG. 18 so that whether current flows to the memory transistor Tm0 can be detected. In the case where data stored in the memory transistor Tm0 is "0", the memory transistor Tm0 is in an off state; therefore, current does not flow to the bit line BL0. Meanwhile, in the case where data stored in the memory transistor Tm0 is "1", the memory transistor Tm0 is in an on state; therefore, current flows to the bit line BL0.

The nonvolatile semiconductor memory device of this embodiment mode includes a nonvolatile semiconductor memory element whose charge retention characteristic is improved so that reliability of memory performance can be improved.

Embodiment Mode 3

In this embodiment mode, as a method for manufacturing a semiconductor device, a method for manufacturing a nonvolatile semiconductor memory device will be described. In the nonvolatile semiconductor memory device, since a transistor of a memory cell array requires a higher drive voltage than a transistor of a logic portion, it is preferable that structures of the transistor of the memory cell array and the transistor of the logic portion be changed in accordance with drive voltage. For example, in the case where driving voltage is low and variation of a threshold voltage are desired to be small, it is preferable that a gate insulating film be thin. In the case where driving voltage is high and a gate insulating film having high withstand voltage is required, it is preferable that the gate insulating film be thick.

Thus, in this embodiment mode, a method for manufacturing transistors in which a gate insulating film having different thicknesses is formed over the same substrate will be described. In addition, in this embodiment mode, a method for manufacturing a transistor and a nonvolatile memory transistor using thin film transistors will be described. Further, in this embodiment mode, a method for manufacturing a nonvolatile semiconductor memory device will be described using the device of FIG. 18 as a nonvolatile semiconductor memory device and the case where the memory cell array 52 is formed using the circuit shown in FIG. 19 as examples. This point is similar to nonvolatile semiconductor memory devices to be described later in Embodiment Modes 4 to 8.

FIGS. 25A to 25C, 26A to 26C, 27A to 27C, and 28A and 28B are cross-sectional views for description of a manufacturing process of this embodiment mode. In FIGS. 25A to 25C, 26A to 26C, 27A to 27C, and 28A and 28B, a cross section of a p-channel transistor Trp provided in the logic portion 54 is shown between A and B, and a cross section of an n-channel transistor Tm provided in the logic portion 54 is shown between C and D. A cross section of the nonvolatile memory transistor Tm provided in the memory cell MC is shown between E and F, and a cross section of the switching transistor Ts of the memory cell MC is shown between G and H. FIGS. 29 to 31 are top views for description of the manufacturing process of this embodiment mode. Cross-sectional views taken along dashed lines A-B, C-D, E-F and G-H of FIG. 29 to FIG. 31 correspond to FIGS. 25A to 25C, 26A to 26C, 27A to 27C, and 28A and 28B.

First, as shown in FIG. 25A, a base insulating film 102 is formed over a substrate 100. For the substrate 100, a glass substrate, a quartz substrate, a ceramic substrate, or a metal substrate (e.g., a stainless steel substrate) can be used. The base insulating film 102 can be formed using an insulating material such as silicon oxide, silicon nitride, or silicon oxynitride by a CVD method, a sputtering method, or the like. For example, in the case where the base insulating film 102 is formed of a two-layered structure, a silicon oxynitride layer ($SiO_xN_y$, where x<y) whose nitrogen concentration is higher than oxygen concentration may be formed as a first insulating layer and a silicon oxynitride layer ($SiO_xN_y$, where x>y) whose oxygen concentration is higher than nitrogen concentration may be formed as a second insulating layer. Alternatively, a silicon nitride layer may be formed as the first insulating layer and a silicon oxide layer may be formed as the second insulating layer. In this manner, the formation of the base insulating film 102 which serves as a blocking layer makes it possible to prevent an alkali metal such as Na or an alkaline earth metal from the substrate 100 from having an adverse effect on an element to be formed over the base insulating film 102.

Next, island-shaped semiconductor films 104, 106, 108, and 110 are formed over the base insulating film 102. FIG. 29 is a top view of the island-shaped semiconductor films 104, 106, 108, and 110. The island-shaped semiconductor films 104, 106, 108, and 110 can be formed as follows. An amorphous semiconductor film which contains silicon (Si) as its main component is formed by a sputtering method, an LPCVD method, a plasma CVD method, or the like, and the amorphous semiconductor film is crystallized to form a crystalline semiconductor film. The crystalline semiconductor film is etched to form the island-shaped semiconductor films 104, 106, 108, and 110. Note that, as the amorphous semiconductor film, an amorphous silicon film, an amorphous germanium film, an amorphous silicon germanium film, or the like can be formed. Further, crystallization of the amorphous semiconductor film can be performed by a laser crystallization method, a thermal crystallization method using RTA or an annealing furnace, a thermal crystallization method using a metal element that promotes crystallization, a method in which any of these methods are combined, or the like.

As the substrate 100, an SOI substrate can be used. In this case, a semiconductor layer of the SOI substrate is etched so that the island-shaped semiconductor films 104, 106, 108, and 110 can be formed. Alternatively, part of a semiconductor layer is oxidized so that a region that is not oxidized can be used as the island-shaped semiconductor films 104, 106, 108, and 110. Instead of the SOI substrate, a GOI substrate or an SGOI substrate can be used.

Next, as shown in FIG. 25A, an insulating film 112 is formed to cover the island-shaped semiconductor films 104, 106, 108, and 110. The insulating film 112 is formed of a single-layer film or a multilayer film having two or more layers using silicon oxide, silicon nitride, or silicon oxynitride by an LPCVD method or a plasma CVD method. The insulating film 112 functions as a gate insulating film of the transistor Ts of the memory cell MC. Therefore, the insulating film 112 is formed at a thickness of 10 nm to 50 nm.

Next, as shown in FIG. 25B, the insulating film 112 is selectively removed, and the surfaces of the semiconductor films 104, 106, and 108 are exposed. Here, the semiconductor film 110 provided in a memory portion is selectively covered by a resist 114, and the insulating film 112 formed over the semiconductor films 104, 106, and 108 are etched and removed.

The resist 114 is removed, and insulating films 116, 118, and 120 are formed over the semiconductor films 104, 106, and 108 respectively, as shown in FIG. 25C. The insulating film 120 forms a first insulating film of the memory transistor Tm. The thickness of each of the insulating films 116, 118, and 120 is preferably 1 nm to 10 nm, more preferably, 1 nm to 5 nm. Note that the insulating films 116 and 118 are removed in a later step.

The insulating films 116, 118, and 120 can be formed in such a way that the semiconductor films 104, 106, and 108 are subjected to heat treatment, high density plasma treatment, or the like. For example, in a similar manner to the first insulating film 11 of the nonvolatile memory transistor in FIG. 2, the semiconductor films 104, 106, and 108 are subjected to oxidation treatment, nitridation treatment, or oxynitridation treatment by high density plasma treatment so that the insulating films 116, 118, and 120 formed of oxide, nitride, or oxynitride of a semiconductor are formed. In the case where the semiconductor films 104, 106, and 108 are formed of silicon films, when each of the semiconductor films 104, 106, and 108 is subjected to oxidation treatment by high density plasma treatment, a silicon oxide layer can be formed; when each of the semiconductor films 104, 106, and 108 is subjected to nitridation treatment by high density plasma treatment, a silicon nitride layer can be formed; and when each of the semiconductor films 104, 106, and 108 is subjected to oxynitridation treatment by high density plasma treatment, a silicon oxynitride layer can be formed. In addition, after oxidation treatment is performed to form a silicon oxide layer, nitridation treatment can also be performed. In this case, nitridation treatment time or the like is regulated so that a silicon oxide layer which has a nitrided surface, a silicon oxynitride layer, or a silicon nitride layer can be formed.

First, here, a mixed gas of oxygen ($O_2$) and argon (Ar) is introduced into a reaction chamber, an oxygen radical is generated by high density plasma, and oxidation treatment is performed on the semiconductor films 104, 106, and 108; accordingly, silicon oxide layers having a thickness of approximately 3 nm to 6 nm are formed on the surfaces of the semiconductor films 104, 106, and 108. As the flow rate of a process gas, the flow rate of oxygen can be set at 0.1 sccm to 100 sccm and the flow rate of argon can be set at 100 sccm to 5000 sccm.

Next, a mixed gas of nitrogen ($N_2$) and argon (Ar) is introduced into the reaction chamber where the oxidation treatment has been performed, a nitrogen radical is generated by high density plasma, and the silicon oxide layers are subjected to nitridation treatment. For example, nitridation treatment time is regulated so that each silicon oxide layer can be provided with a layer which has a nitrogen concentration of 20 at. % to 50 at. % and a thickness of approximately 1 nm. At this time, the surface of the insulating film 112 formed over the semiconductor film 110 may be oxidized or nitrided, and a silicon oxynitride layer may be formed in some cases. As the flow rate of a process gas, the flow rate of nitrogen can be set at 20 sccm to 2000 sccm and the flow rate of argon can be set at 100 sccm to 10000 sccm.

Next, as shown in FIG. 26A, a first silicon nitride film 122 and a second silicon nitride film 123 which serve as a charge storage layer are formed to cover the insulating films 112, 116, 118, and 120. The first silicon nitride film 122 can be formed in a similar manner to that of the first silicon nitride film 12 of Embodiment Mode 1, and the second silicon nitride film 123 can be formed in a similar manner to that of the second silicon nitride film 13 of Embodiment Mode 1. For example, NH₃ and SiH₄ are introduced into a reaction chamber of a plasma CVD apparatus, and the first silicon nitride film 122 is formed at a substrate temperature of 400° C. N₂, SiH₄, and Ar are introduced into the same reaction chamber, and the second silicon nitride film 123 is formed at a substrate temperature of 400° C.

Next, as shown in FIG. 26B, a resist 124 is formed, the insulating films 116 and 118, and part of the first silicon nitride film 122 and part of the second silicon nitride film 123 are removed by etching. Top surfaces of the semiconductor films 104 and 106, and a top surface of the insulating film 120 over the semiconductor film 108 are exposed, and the first silicon nitride film 122 and the second silicon nitride film 123 are left over the semiconductor film 108 to serve as the memory transistor Tm.

The resist 124 is removed, and an insulating film 128 is formed over the substrate 100 as shown in FIG. 26C. The insulating film 128 forms a gate insulating film of the transistors Trp and Trn of the logic portion 54 and forms the second insulating film of the memory transistor Tm. The insulating film 128 is formed by depositing an insulating material formed of silicon oxide, silicon nitride, silicon oxynitride, or the like by a CVD method, a sputtering method, or the like. The insulating film 128 is formed of a single-layer film or a multiple-layer film having two or more layers. For example, in the case where the insulating film 128 is formed of a single layer, a silicon oxynitride layer is formed at a thickness of 5 nm to 50 nm by a CVD method. In addition, in the case where the insulating film 128 is formed of a three-layered structure, a silicon oxynitride layer is formed as a first insulating layer, a silicon nitride layer is formed as a second insulating layer, and a silicon oxynitride layer is formed as a third insulating layer.

Next, as shown in FIG. 27A, a conductive film 130 is formed over the insulating film 128, and a conductive film 132 is formed over the conductive film 130. A stacked film formed of the conductive film 130 and the conductive film 132 forms gate electrodes of the transistors Trp, Trn, and Ts and the memory transistor Tm. Needless to say, the gate electrodes can be formed of a conductive film having a single-layer structure.

Note that, when the memory transistor Tm is an MNOS type, before the step for forming the conductive film 130, the insulating film 128 is removed by etching from a region in which the memory transistor Tm is formed.

The conductive films 130 and 132 can have a single-layer structure or a multilayer structure of two or more layers. As a conductive material that forms the conductive films 130 and 132, a single metal selected from tantalum (Ta), tungsten (W), titanium (Ti), molybdenum (Mo), aluminum (Al), copper (Cu), chromium (Cr), niobium (Nb), and the like; an alloy material or compound material containing any of these metals as its main component; polycrystalline silicon doped with an impurity element such as phosphorus; or the like can be used. For example, as a metal compound, there are metal nitride, silicide, and the like.

For example, the conductive film 130 is formed of a tantalum nitride film and the conductive film 132 is formed of a tungsten film. Alternatively, the conductive film 130 can be formed of a single-layer film or a stacked-layer film using a conductive material selected from tungsten nitride, molybdenum nitride, and titanium nitride; and the conductive film 132 can be formed of a single-layer film or a stacked-layer film using a conductive material selected from tantalum, molybdenum, and titanium.

Next, as shown in FIG. 27B, the stacked film formed of the conductive films 130 and 132 is etched to form conductive films 134, 136, 138, and 140 which overlap with the semiconductor films 104, 106, 108, and 110, respectively. The top view in this state is shown in FIG. 30. The conductive films 134 and 136 function as the gate electrodes of the transistors Trp and Trn, respectively. The conductive film 138 forms the second word line WL and functions as the gate electrode of the switching transistor Ts. The conductive film 140 forms the first word line WL and functions as the gate electrode of the switching transistor Ts.

Then, as shown in FIG. 27C, a resist 142 is selectively formed to cover the semiconductor film 104. The conductive films 136, 138, and 140 are used as masks, and the semiconductor films 106, 108, and 110 are doped with an impurity element which imparts n-type conductivity to form n-type high concentration impurity regions 146, 150, and 154, respectively. The high concentration impurity regions 146, 150, and 154 form source regions and drain regions. By the addition of this impurity which imparts n-type conductivity, channel formation regions 144, 148, and 152 are formed in a self-aligned manner in the semiconductor films 106, 108, and 110, respectively.

The resist 142 is removed. Next, as shown in FIG. 28A, a resist 156 to cover the semiconductor films 106, 108, and 110 is formed. The conductive film 134 is used as a mask, and the semiconductor film 104 is doped with an impurity which imparts p-type conductivity to form p-type high concentration impurity regions 160. The high concentration impurity regions 160 form a source region and a drain region. By addition of this impurity which imparts p-type conductivity, a channel formation region 158 is formed in a self-aligned manner in the semiconductor film 104.

The resist 156 is removed. Subsequently, as shown in FIG. 28B, an insulating film 162 is formed to cover the conductive films 134, 136, 138, and 140. Openings to reach the high concentration impurity regions 160, 146, 150, and 154 are formed in the insulating film 162. Conductive films 164 to 170 which are electrically connected to the high concentration impurity regions 160, 146, 150, and 154 that are formed in the semiconductor films 104, 106, 108, and 110 are formed over the insulating film 162. A top view of this state is shown in FIG. 31. The conductive film 164 and the conductive film 165 form source electrodes and drain electrodes of the p-channel transistor Trp. The conductive film 166 and the conductive film 167 form source electrodes and drain electrodes of the n-channel transistor Tm. The conductive film 168 forms an electrode which connects the switching transistor Ts and the memory transistor Tm. The conductive film 169 forms the bit line BL. The conductive film 170 forms the source line SL.

The insulating film 162 can be formed of a single-layer structure or a stacked-layer structure. As an insulating film which forms the insulating film 162, an inorganic insulating film that contains silicon oxide, silicon nitride, silicon oxynitride, or DLC (diamond-like carbon) can be formed by a CVD method, a sputtering method, or the like. In addition, a film formed of an organic material such as epoxy, polyimide, polyamide, polyvinyl phenol, benzocyclobutene, or acrylic; or a film formed of a siloxane material such as a siloxane resin can be used.

The conductive film 164 can be formed of a single-layer structure or a stacked-layer structure. The conductive film 164 is formed of, by a CVD method, a sputtering method, or the like, a conductive material such as a single metal element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), and neodymium (Nd); or an alloy material or compound material containing any of these elements as its main component. For example, as an alloy material that contains aluminum as its main component, an alloy of aluminum and nickel; an aluminum alloy containing nickel, and one or both of carbon and silicon; and the like are given. Since aluminum or aluminum silicon has a low resistance value and is inexpensive, aluminum or aluminum silicon is suitable for the material for forming the conductive film 164.

For example, as the conductive film 164 having a three-layer structure, there are a stacked film including a barrier layer, an aluminum silicon (Al—Si) layer, and a barrier layer; a stacked film including a barrier layer, an aluminum silicon (Al—Si) layer, a titanium nitride layer, and a barrier layer; and the like. Note that the barrier layer is formed using a thin film formed of titanium, nitride of titanium, molybdenum, or nitride of molybdenum. When the barrier layers are provided for an upper layer and a lower layer, generation of hillock of aluminum or aluminum silicon can be prevented. In addition, when the barrier layer formed of titanium that has a high reducing property is used, even when a thin oxide film is naturally formed over a crystalline semiconductor layer, the barrier layer reduces this oxide film, and accordingly, favorable contact with the crystalline semiconductor layer can be obtained.

By the above-described steps, a nonvolatile semiconductor device in which the memory cell array 52 and the logic portion 54 are integrated over the same substrate 100 can be formed.

Embodiment Mode 4

In Embodiment Mode 3, a manufacturing method is described, in which the insulating layer which serves as the control insulating film of the nonvolatile memory element formed in the memory cell MC and the gate insulating film of the thin film transistor formed in the logic portion are formed at the same time; however, a method for manufacturing a nonvolatile semiconductor memory device is not limited thereto. For example, the formation as shown in FIGS. 32 to 32C can also be employed.

First, a process up to and including FIG. 26A is performed by the manufacturing method of Embodiment Mode 3. As shown in FIG. 32A, after similar formation, the insulating film 128 is formed over the first silicon nitride film 122 and the second silicon nitride film 123.

Next, as shown in FIG. 32B, the resist 124 is selectively formed to cover the semiconductor film 108, and then, the first silicon nitride film 122, the second silicon nitride film 123, and the insulating film 128 which are formed over the semiconductor films 104, 106, and 110 are removed, and the semiconductor films 104 and 106 and the insulating film 112 are exposed.

Next, as shown in FIG. 32C, the insulating films 116 and 118 are formed on the surfaces of the semiconductor films 104 and 106 by high density plasma treatment similarly to Embodiment Mode 3. As a result, the gate insulating film of the transistors Trp and Trn formed in the logic portion 54 and the second insulating film of the nonvolatile memory transistor Tm formed in the memory cell MC can be formed at different thicknesses and of different materials.

A process including and after FIG. 27A of Embodiment Mode 3 is performed so that a nonvolatile semiconductor memory device can be formed.

Embodiment Mode 5

In this embodiment mode, a method for manufacturing a semiconductor device will be described. In this embodiment mode, a method for manufacturing a nonvolatile semiconductor memory device will be described similarly to Embodiment Modes 3 and 4.

FIGS. 33A to 33C, FIGS. 34A to 34C, and FIGS. 35A to 35C are cross-sectional views showing a manufacturing method of this embodiment mode. Similarly to Embodiment Mode 3, the transistors Trp and Trn in the logic portion 54 and the nonvolatile memory transistor Tm and the switching transistor Ts in the memory cell array 52 are shown in the cross-sectional views. In this embodiment mode, the memory cell array 52 is formed of the circuit shown in FIG. 19, similarly to Embodiment Mode 3. Note that, in a manufacturing method in this embodiment mode, the process of Embodiment Mode 3 can be applied to a process to form components with the same reference numerals as those in FIGS. 25A to 25C, 26A to 26C, 27A to 27C, and 28A and 28B; therefore, description of Embodiment Mode 3 is used for detailed description of these.

First, a process up to and including FIG. 25A described in Embodiment Mode 3 is performed. Next, the resist 114 is formed over the insulating film 112. The resist 114 is used, and the insulating film 112 in a region which is not covered by the resist 114 is removed by etching (see FIG. 33A).

By this etching, edges of the semiconductor films 104, 106, and 108 are covered by the insulating film 112. This structure is provided in order to prevent a depression from being formed in the base insulating film 102 in a portion where the edges of each of the semiconductor films 104, 106, and 108 are in contact with the base insulating film 102, in the case where the entire insulating film 112 formed over each of the semiconductor films 104, 106, and 108 is removed by etching. In the case where a depression is formed in the base insulating film 102, a problem such as a coverage defect occurs in the case of forming the insulating layer or the like for covering the semiconductor films 104, 106, and 108 thereafter. To avoid such a problem, it is effective to cover the edges of each of the semiconductor films 104, 106, and 108 with the insulating film 112.

The resist 114 is removed. As shown in FIG. 33B, the insulating films 116, 118, and 120 are formed over the semiconductor films 104, 106, and 108, respectively, by high density plasma treatment, similarly to Embodiment Mode 3. Next, as shown in FIG. 33C, the first silicon nitride film 122 and the second silicon nitride film 123 are formed similarly to Embodiment Mode 3.

Next, as shown in FIG. 34A, the semiconductor film 108 and the semiconductor film 110 are covered by a resist 126, and the first silicon nitride film 122 and the second silicon nitride film 123 which are formed in a region that is not covered by the resist 126 are removed by etching. The resist 126 is removed, and the insulating film 128 is formed as shown in FIG. 34B. A method for forming the insulating film 128 can be performed in a similar manner to Embodiment Mode 3. For example, a silicon oxynitride layer is formed at a thickness of 5 nm to 50 nm by a plasma CVD method as the insulating film 128.

Next, as shown in FIG. 34C, the conductive films 134, 136, 138, and 140 each of which serves as a gate electrode are formed over the semiconductor films 104, 106, 108, and 110, respectively. Note that the conductive film 138 formed over the semiconductor film 108 provided in the memory portion forms the second word line WL and serves as a control gate in the nonvolatile memory transistor Tm. In addition, the conductive films 134 and 136 serve as the gate electrodes of the transistors Trp and Trn, respectively. The conductive film 140 forms the first word line WL and serves as the gate electrode of the switching transistor Ts.

Note that, when the memory transistor Tm is an MNOS type, before a process in which the conductive films 134, 136, 138, and 140 are formed, the insulating film 128 is removed by etching from the region in which the memory transistor Tm is formed.

Subsequently, as shown in FIG. 35A, the resist 142 is selectively formed to cover the semiconductor film 104, and the resist 142 and the conductive films 136, 138, and 140 are used as masks so that the semiconductor films 106, 108, and 110 are doped with an impurity element which imparts n-type conductivity. By this doping step of the impurity element which imparts n-type conductivity, the high concentration impurity regions 146, 150, and 154, and the channel formation regions 144, 148, and 152 are formed in a self-aligned manner in the semiconductor films 106, 108, and 110, respectively.

The resist 142 is removed. Next, as shown in FIG. 35B, the resist 156 to cover the semiconductor films 106, 108, and 110 is formed. The conductive film 134 is used as a mask, and an impurity element which imparts p-type conductivity is introduced into the semiconductor film 104 so that the high concentration impurity regions 160 and the channel formation region 158 are formed in a self-aligned manner in the semiconductor film 104.

The resist 156 is removed. Next, as shown in FIG. 35C, the insulating film 162 to cover the conductive films 134, 136, 138, and 140 is formed, and openings which reach the high concentration impurity regions 160, 146, 150, and 154 are formed, respectively. The conductive films 164 to 170 which are electrically connected to the high concentration impurity regions 160, 146, 150, and 154 in the semiconductor films 104, 106, 108, and 110 are formed over the insulating film 162. Through the above-described process, a nonvolatile semiconductor memory device in which the memory cell array 52 and the logic portion 54 are integrated over the same substrate 100 is formed.

Embodiment Mode 6

In this embodiment mode, a method for manufacturing a semiconductor device will be described. In this embodiment mode, a method for manufacturing a nonvolatile semiconductor memory device will be described similarly to Embodiment Modes 3 to 5.

FIGS. 36A to 36C, FIGS. 37A to 37C, and FIGS. 38A to 38C are cross-sectional views each showing a manufacturing method of this embodiment mode. Similarly to Embodiment Mode 3, the transistors Trp and Trn in the logic portion 54 and the nonvolatile memory transistor Tm and the switching transistor Ts in the memory cell array 52 are shown in the cross-sectional views. In this embodiment mode, the memory cell array 52 is formed of the circuit shown in FIG. 19, similarly to Embodiment Mode 3. In addition, in a manufacturing method in this embodiment mode, the process of Embodiment Mode 3 can be applied to a process to form components with the same reference numerals as those in FIGS. 25A to 25C, 26A to 26C, 27A to 27C, and 28A and 28B; therefore, description of Embodiment Mode 3 is used for detailed description of these.

Figures 36A, 36B, 36C:
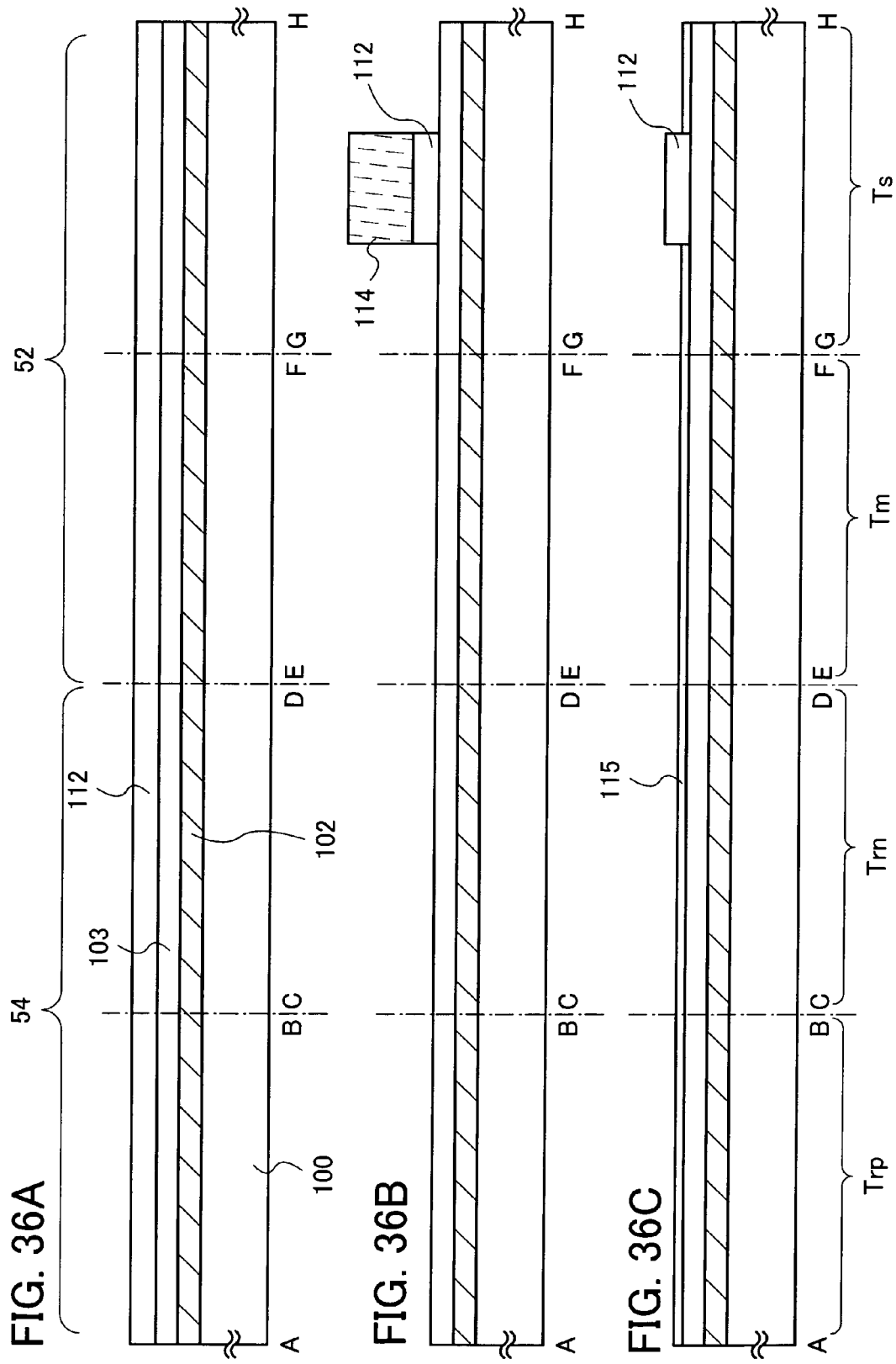
FIGS. 36A to 36C are cross-sectional views illustrating a method for manufacturing a semiconductor device.

First, as shown in FIG. 36A, the base insulating film 102 is formed over the substrate 100, a semiconductor film 103 is formed over the base insulating film 102, and the insulating film 112 is formed over the semiconductor film 103.

As a method for forming the semiconductor film 103, the following method can be used. An amorphous semiconductor film formed of silicon, silicon germanium, or germanium is formed by a sputtering method, an LPCVD method, a plasma CVD method, or the like, and the amorphous semiconductor film is crystallized to form a crystalline semiconductor film. Crystallization of the amorphous semiconductor film can be performed by a laser crystallization method, a thermal crystallization method using RTA or an annealing furnace, a thermal crystallization method using a metal element that promotes crystallization, a method in which any of these methods are combined, or the like.

Next, the resist 114 is formed over the insulating film 112. As shown in FIG. 36B, the resist 114 is used as a mask and the insulating film 112 is etched. As shown in FIG. 36C, the resist 114 is removed, and the exposed semiconductor film 103 is subjected to high density plasma treatment to form an insulating film 115. The insulating film 115 can be formed by a method similar to that of the insulating films 116 and 118 of Embodiment Mode 3.

Figures 37A, 37B, 37C:
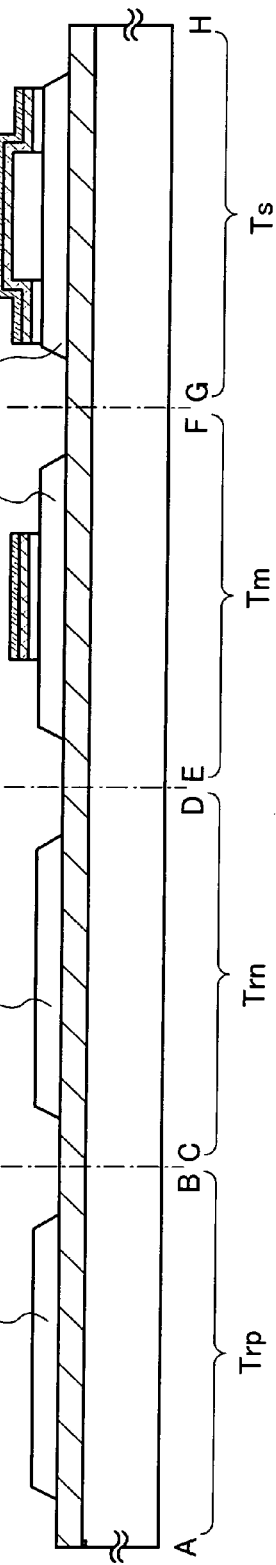
FIGS. 37A to 37C are cross-sectional views illustrating a method for manufacturing a semiconductor device.

Next, as shown in FIG. 37A, the first silicon nitride film 122 is formed over the insulating films 115 and 112, and the second silicon nitride film 123 is formed over the first silicon nitride film 122.

Next, a resist 125 is formed. The resist 125 is used as a mask, and the insulating film 115, the first silicon nitride film 122, and the second silicon nitride film 123 are etched as shown in FIG. 37B. The first silicon nitride film 122 and the second silicon nitride film 123 between G and H function as the gate insulating film of the switching transistor. The first silicon nitride film 122 and the second silicon nitride film 123 between G and H can be removed as well.

The resist 125 is removed. Next, as shown in FIG. 37C, a resist mask is used, and the semiconductor film 103 is etched to form the island-shaped semiconductor films 104, 106, 108, and 110 (see FIG. 37C).

Next, as shown in FIG. 38A, the insulating film 128 which covers the semiconductor films 104, 106, 108, and 110 is formed. Next, as shown in FIG. 38B, the conductive films 134, 136, 138, and 140 which each serve as a gate electrode are formed over the semiconductor films 104, 106, 108, and 110, respectively.

Note that, when the memory transistor Tm is an MNOS type, before a process in which the conductive films 134, 136, 138, and 140 are formed, the insulating film 128 is removed by etching from the region in which the memory transistor Tm is formed.

Next, processes of FIG. 27C and FIG. 28A of Embodiment Mode 3 are performed; as shown in FIG. 38C, the channel formation regions 158, 144, 148, and 152 and the high concentration impurity regions 160, 146, 150, and 154 are formed in the semiconductor films 104, 106, 108, and 110, respectively. Next, the insulating film 162 is formed to form openings which reach the high concentration impurity regions 160, 146, 150, and 154 in the insulating film 162. Next, the conductive films 164 to 170 which are electrically connected to the high concentration impurity regions 160, 146, 150, and 154 formed in the semiconductor films 104, 106, 108, and 110 are formed over the insulating film 162.

Through the above-described process, a nonvolatile semiconductor memory device in which the memory cell array 52 and the logic portion 54 are integrated over the same substrate 100 is formed.

Embodiment Mode 7

In this embodiment mode, as a method for manufacturing a semiconductor device, a method for manufacturing a nonvolatile semiconductor memory device using a semiconductor substrate will be described.

FIGS. 39A to 39C, 40A to 40C, 41A to 41C, 42A to 42C, and 43A to 43C are cross-sectional views for description of a manufacturing process of a nonvolatile semiconductor memory device of this embodiment mode. In this embodiment mode, the memory cell array 52 is formed of a NAND type memory cell as shown in FIG. 21. In each of FIGS. 39A to 39C, 40A to 40C, 41A to 41C, 42A to 42C, and 43A to 43C, a cross section of the p-channel transistor Trp and the n-channel transistor Trn which are provided in the logic portion 54 is shown between A and B. A cross section of the nonvolatile memory transistor Tm and the second selection transistor S2 which are provided in the memory cell array 52 is shown between C and D. FIGS. 44A and 44B, 45A and 45B, and 46A and 46B are top views for description of a manufacturing process of this embodiment mode. Cross-sectional views taken along dashed lines A-B and C-D of FIGS. 44A and 44B, 45A and 45B, and 46A and 46B correspond to FIGS. 39A to 39C, 40A to 40C, 41A to 41C, 42A to 42C, and 43A to 43C.

First, as shown in FIG. 39A, a semiconductor substrate 1200 is prepared. A single-crystal Si wafer having n-type conductivity is used for the semiconductor substrate 1200. An insulating film 1201 is formed over the semiconductor substrate 1200. As a method for forming the insulating film 1201, a method in which the surface of the semiconductor substrate 1200 is oxidized by thermal oxidation treatment to form silicon oxide can be used. A silicon nitride film 1202 is formed over the insulating film 1201 by a CVD method. In addition, the silicon nitride film 1202 can be formed in such a way that the insulating film 1201 is formed, and then the insulating film 1201 is nitrided by high density plasma treatment.

Next, as shown in FIG. 39B, a pattern of a resist 1203 is formed over the silicon nitride film 1202. The resist 1203 is used as a mask, and the silicon nitride film 1202, the insulating film 1201, and the semiconductor substrate 1200 are etched so that a depression 1204 is formed in the semiconductor substrate 1200. This etching can be performed by dry etching using plasma.

The resist 1203 is removed. Next, as shown in FIG. 39C, an insulating film 1205 which fills the depression 1204 formed in the semiconductor substrate 1200 is formed. The insulating film 1205 is formed using an insulating material such as silicon oxide, silicon nitride, silicon nitride that contains oxygen, or silicon oxide that contains nitrogen by a CVD method, a sputtering method, or the like. Here, as the insulating film 1205, silicon oxide is formed using a TEOS (tetraethylorthosilicate) gas by an atmospheric-pressure CVD method or a low-pressure CVD method.

Figure 44A:
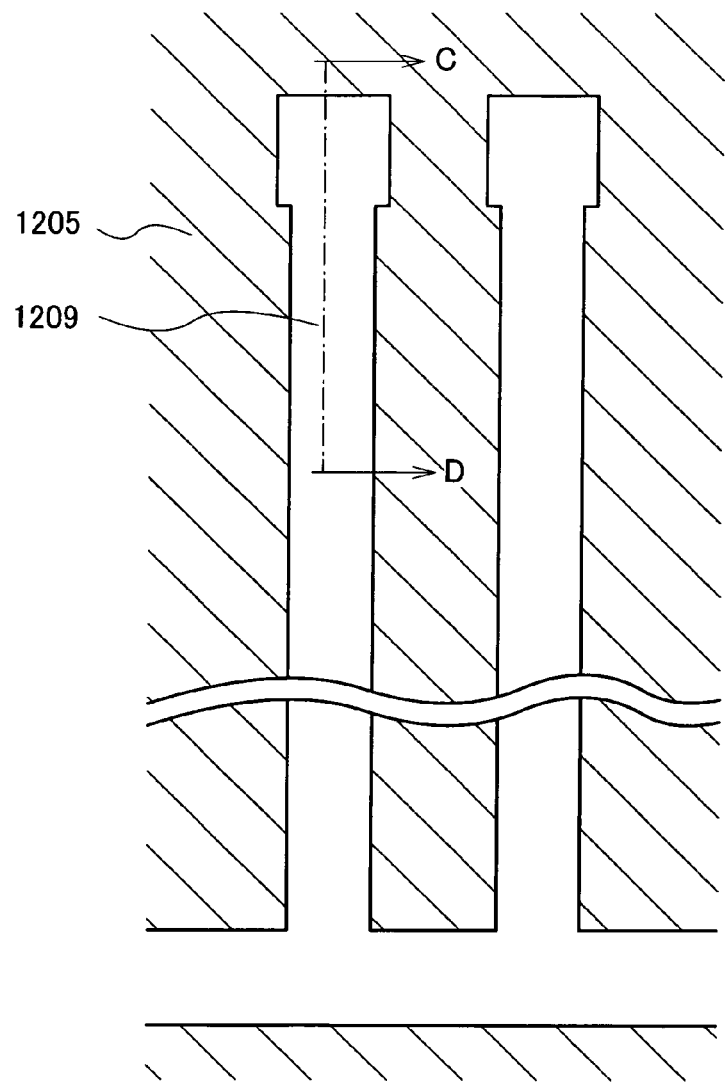
FIGS. 44A and 44B are top views illustrating a method for manufacturing a semiconductor device.
Figure 44B:
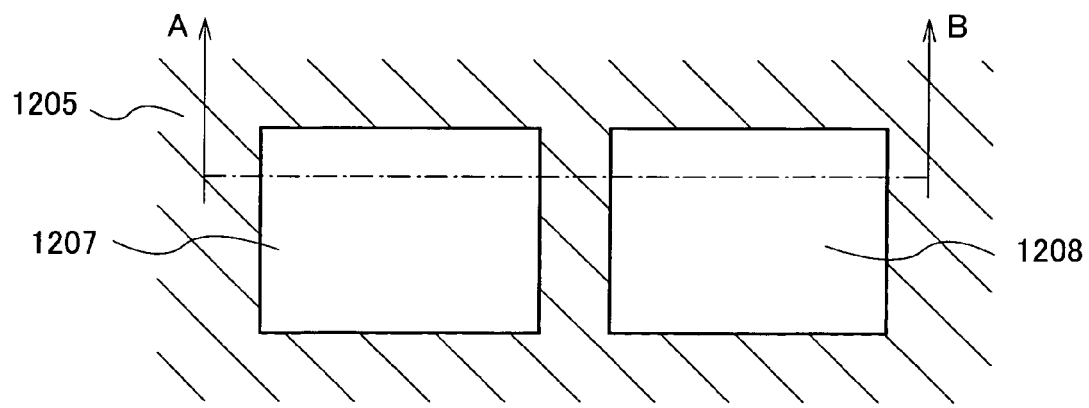

Next, a grinding process, a polishing process, or chemical mechanical polishing (CMP) process is performed so that the insulating film 1205, the silicon nitride film 1202, and the insulating film 1201 are removed as shown in FIG. 40A, whereby the surface of the semiconductor substrate 1200 is exposed. By this treatment, semiconductor regions 1207 to 1209 are provided between the insulating films 1205 left in the depression 1204 of the semiconductor substrate 1200. Next, the semiconductor substrate 1200 is selectively doped with an impurity element which imparts p-type conductivity to form a p-well 1210. A top view of this state is shown in FIGS. 44A and 44B.

Note that, in this embodiment mode, a semiconductor substrate having n-type conductivity is used as the semiconductor substrate 1200; therefore, introduction of an impurity element into the semiconductor region 1207 is not performed. However, an impurity element which imparts n-type conductivity is introduced so that an n-well can be formed in the semiconductor region 1207. Note that, in the case where a p-type semiconductor substrate is used, an n-well is formed so that the semiconductor region 1207 is formed. The semiconductor regions 1208 and 1209 may be formed of p-wells but is not necessarily formed of p-wells.

Next, as shown in FIG. 40B, an insulating film 1211 is formed over the surface of the semiconductor substrate 1200. The insulating film 1211 can be formed in a similar manner to the insulating film 112 of Embodiment Mode 3. Here, as the insulating film 1211, a silicon oxynitride film is formed by a plasma CVD method. Note that the insulating film 1211 formed over the semiconductor region 1209 forms the gate insulating film of the switching transistor Ts.

Next, as shown in FIG. 40C, a resist 1212 is formed. By use of the resist 1212, the insulating film 1211 formed over the semiconductor regions 1207 and 1208 of the semiconductor substrate 1200 is removed.

After the resist 1212 is removed, an insulating film 1214 is formed over the surface of the semiconductor region 1207 and an insulating film 1215 is formed over the surface of the semiconductor region 1208, as shown in FIG. 41A. An insulating film 1216 is formed over the semiconductor region 1209. Next, a first silicon nitride film 1012 is formed to cover the insulating films 1214 to 1216, and a second silicon nitride film 1013 is formed over the first silicon nitride film 1012.

The insulating films 1214 to 1216 can be formed in such a way that the semiconductor substrate 1200 is oxidized by high density plasma treatment and subjected to nitridation treatment. The high density plasma treatment can be performed similarly to Embodiment Mode 3. The insulating films 1214 to 1216 can be formed by thermal oxidation or thermal nitridation, as well.

Next, as shown in FIG. 41B, a resist 1218 is formed. The resist 1218 is used as a mask, and the second silicon nitride film 1013, the first silicon nitride film 1012, and the insulating films 1214 to 1216 are etched. Here, the second silicon nitride film 1013, the first silicon nitride film 1012, the insulating film 1214, and the insulating film 1215 are removed from the semiconductor regions 1207 and 1208. As for the semiconductor region 1209, the second silicon nitride film 1013, the first silicon nitride film 1012, and the insulating film 1216 are left in a region where the nonvolatile memory transistor Tm is formed and these insulating films are removed from the other region.

After the resist 1218 is removed, an insulating film 1221 which covers the semiconductor regions 1207 to 1209 is formed, as shown in FIG. 41C. The insulating film 1211 may be formed of a single-layer film or a stacked film. An insulating film which forms the insulating film 1221 can be formed using an insulating material such as silicon oxide, silicon nitride, or silicon oxynitride by a CVD method, a sputtering method, or the like. Here, as the insulating film 1221, a silicon oxynitride film is formed by a plasma CVD method by using $SiH_4$ and $N_2O$ as source materials.

Next, as shown in FIG. 42A, a conductive film 1222 is formed over the insulating film 1221, and a conductive film 1223 is formed over the conductive film 1222. The conductive films 1222 and 1223 can be formed in a similar manner to the conductive films 130 and 132 of Embodiment Mode 3. Here, the conductive film 1222 is formed of tantalum nitride, and the conductive film 1223 is formed of tungsten.

Figure 45A:
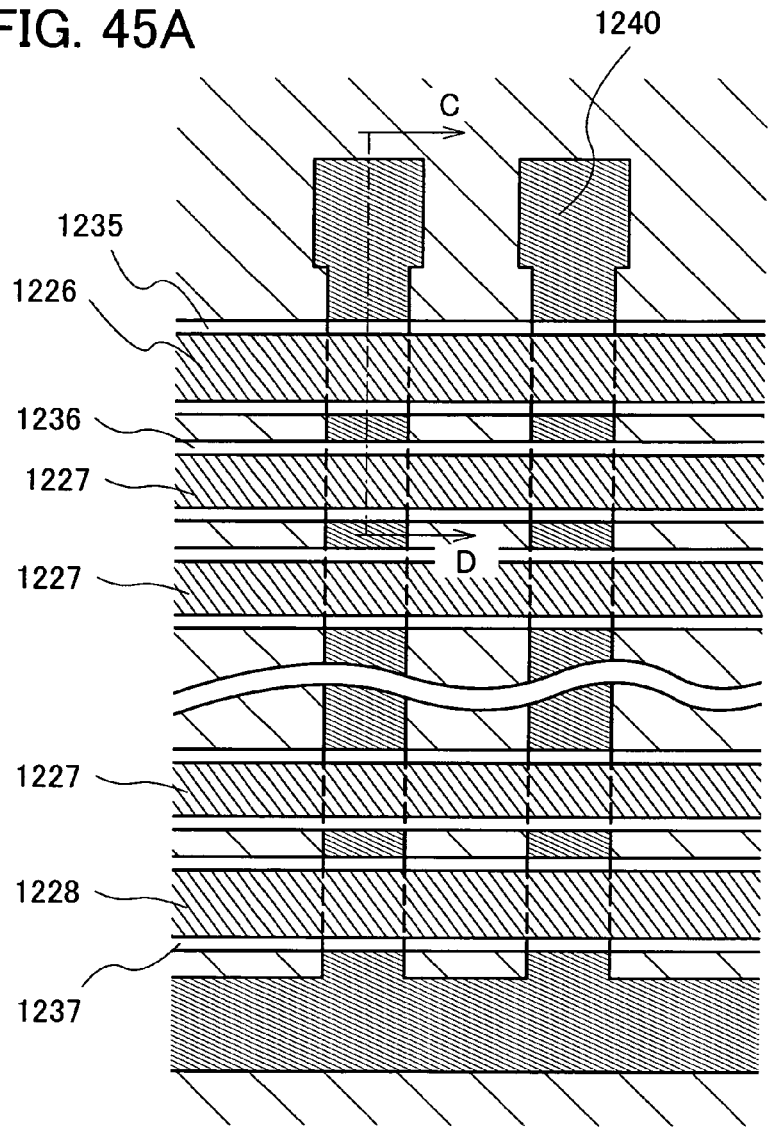
FIGS. 45A and 45B are top views illustrating a method for manufacturing a semiconductor device.
Figure 45B:
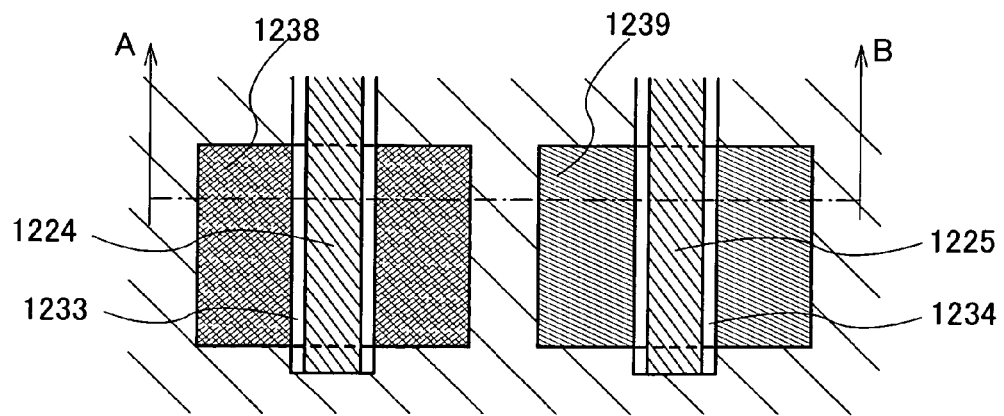

Next, the conductive films 1222 and 1223 are etched, and conductive films 1224 to 1228 which each function as a gate electrode are formed, as shown in FIGS. 42B, 45A, and 45B. By this etching process, the surface of a region which is not overlapped with the conductive films 1224 to 1228 are exposed in the semiconductor regions 1207 to 1209. The conductive film 1226 forms the second selection gate line, the conductive film 1227 forms the word line, and the conductive film 1228 forms the first selection gate line.

Next, as shown in FIG. 42C, an impurity element is selectively introduced into the semiconductor regions 1207 to 1209 to form low concentration impurity regions 1229 to 1231. The conductive films 1225 to 1227 are used as masks, and an impurity which imparts n-type conductivity is introduced into the semiconductor regions 1208 and 1209 to form the n-type low concentration impurity regions 1230 and 1231. In the semiconductor region 1207, the conductive film 1224 is used as a mask, and an impurity which imparts p-type conductivity is added to form the p-type low concentration impurity regions 1229.

Next, spacers 1233 to 1237 (also referred to as sidewalls) that are formed of an insulating film which is in contact with side surfaces of the conductive films 1224 to 1228 respectively are formed (see FIGS. 43A, 45A, and 45B). Specifically, an insulating film is formed of a single-layer structure or a multilayer structure having two or more layers formed of an inorganic material such as silicon, silicon oxide, or silicon nitride or an organic material such as an organic resin by a plasma CVD method, a sputtering method, or the like. Then, the insulating film is etched by anisotropic etching mainly in a perpendicular direction so that the spacers 1233 to 1237 can be formed to be in contact with the side surfaces of each of the conductive films 1224 to 1227.

Next, as shown in FIG. 43A, the spacers 1233 to 1237 and the conductive films 1224 to 1228 are used as masks, and an impurity element is introduced into the semiconductor regions 1207 to 1209 to form high concentration impurity regions 1238 to 1240 which function as source regions and drain regions. A top view of FIG. 43A corresponds to FIGS. 45A and 45B.

In the semiconductor region 1207, the high concentration impurity regions 1238, low concentration impurity regions 1241 which form LDD regions, and a channel formation region 1245 are formed. In the semiconductor region 1208, the high concentration impurity regions 1239, low concentration impurity regions 1242 which form LDD regions, and a channel formation region 1246 are formed. In the semiconductor region 1209, the high concentration impurity regions 1240, low concentration impurity regions 1243 and 1244 which form LDD regions, and channel formation regions 1247 and 1248 are formed. The high concentration impurity regions 1238 to 1240 formed in the semiconductor regions 1207 to 1209 form source regions and drain regions.

Note that, in this embodiment mode, an impurity element is introduced in a state that the semiconductor regions 1207 to 1209 which do not overlap with the conductive films 1224 to 1228 are exposed. Accordingly, the channel formation regions 1245 to 1248 formed in the semiconductor regions 1207 to 1209 can be formed in a self-aligned manner with respect to the conductive films 1224 to 1228.

Next, as shown in FIG. 43B, an insulating film 1249 is formed and openings 1250 to 1254 are formed in the insulating film 1249. The insulating film 1249 can be formed in a similar manner to the insulating film 162 of Embodiment Mode 3. Here, polysilazane is used.

Next, conductive films 1255 to 1259 are formed in the openings 1250 to 1254, respectively, and conductive films 1260 to 1263 are selectively formed over the insulating film 1249 so as to be electrically connected to the conductive films 1255 to 1259. The conductive films 1255 to 1259, and 1260 to 1263 can be formed in a similar manner to the conductive film 164 described in Embodiment Mode 3. In addition, the conductive films 1255 to 1259 can be formed in such a manner that tungsten (W) is selectively grown by a CVD method. A top view of FIG. 43C corresponds to FIGS. 46A and 46B. The conductive film 1259 and the conductive film 1263 form a bit line.

Through the above-described steps, a nonvolatile semiconductor memory device can be formed in which the p-channel transistor Trp formed in the semiconductor region 1207 of the semiconductor substrate 1200, the n-channel transistor Trn formed in the semiconductor region 1208 of the semiconductor substrate 1200, the n-channel second selection transistor S2 and the nonvolatile memory element Tm formed in the semiconductor region 1209 of the semiconductor substrate 1200 are integrated.

Figure 47:
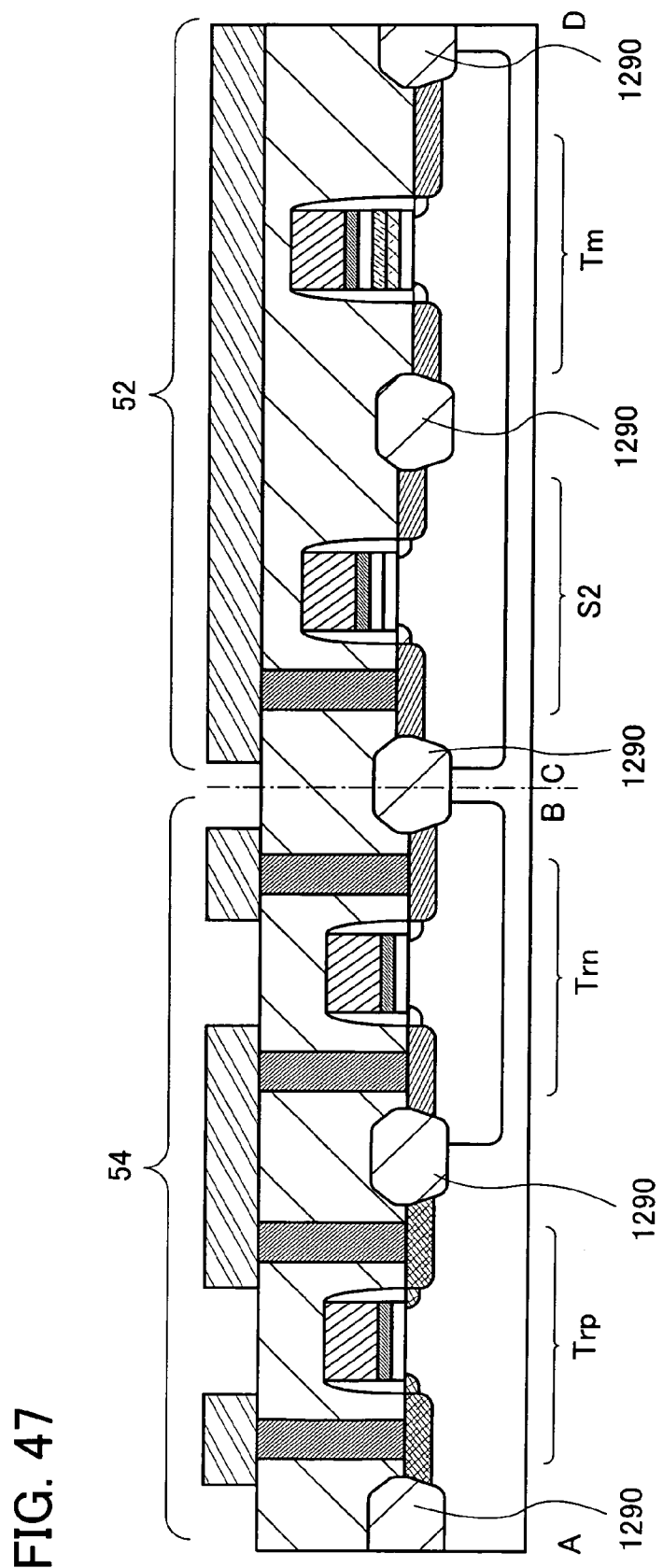
FIG. 47 is a cross-sectional view illustrating a method for manufacturing a semiconductor device.

Note that the depression 1204 and the insulating film 1205 are formed for element isolation. However, instead of the depression 1204 and the insulating film 1205, an insulating film 1290 can be formed by a LOCOS (local oxidation of silicon) method as an element isolation region, as shown in FIG. 47.

Embodiment Mode 8

In this embodiment mode, as a method for manufacturing a semiconductor device, a method for manufacturing a nonvolatile semiconductor memory device will be described. In this embodiment mode, a method for manufacturing a nonvolatile semiconductor memory device using a semiconductor substrate will be described, similarly to Embodiment Mode 7.

FIGS. 48A to 48C, and FIGS. 49A to 49C are cross-sectional views each showing a manufacturing method of this embodiment mode. Similarly to FIGS. 39A to 39C, 40A to 40C, 41A to 41C, 42A to 42C, and 43A to 43C, the transistors Trp and Trn in the logic portion 54 and the nonvolatile memory transistor Tm and the second selection transistor S2 in the memory cell array 52 are shown in the cross-sectional views. Note that, in this embodiment mode, the process of Embodiment Mode 7 can be applied to a process to form components with the same reference numerals as those in FIGS. 39A to 39C, 40A to 40C, 41A to 41C, 42A to 42C, and 43A to 43C; therefore, description of Embodiment Mode 7 is used for detailed description of these.

Figure 48:
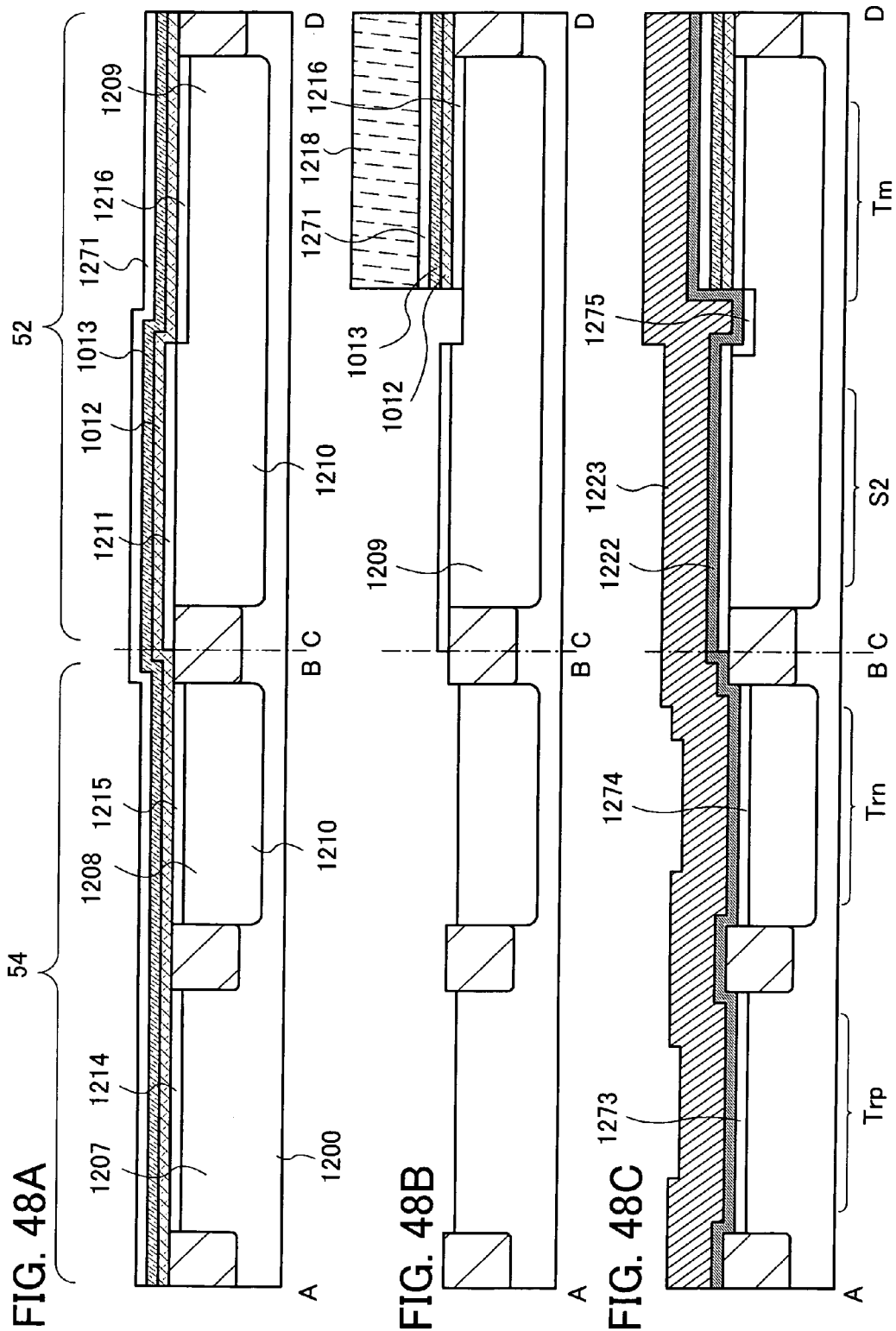
FIGS. 48A to 48C are cross-sectional views illustrating a method for manufacturing a semiconductor device.

A process from FIG. 39A to FIG. 41A described in Embodiment Mode 7 is performed. Next, as shown in FIG. 48A, an insulating film 1271 is formed over the second silicon nitride film 1013. The insulating film 1271 can be formed in a similar manner to the insulating film 1221 of Embodiment Mode 6.

Next, the resist 1218 is formed over the insulating film 1271. The resist 1218 is used as a mask, and the insulating film 1271, the second silicon nitride film 1013, the first silicon nitride film 1012, and the insulating films 1214 to 1216 are etched. As shown in FIG. 48B, a stacked-layer film formed of the insulating film 1216, the first silicon nitride film 1012, the second silicon nitride film 1013, and the insulating film 1271 is formed over a region where the memory transistor Tm of the semiconductor region 1209 is formed. The first silicon nitride film 1012, the second silicon nitride film 1013, the insulating film 1271, and the insulating films 1216, 1214, and 1215 are removed from the other region. The semiconductor region 1207, the semiconductor region 1208, and the insulating film 1211 are exposed, and part of the semiconductor region 1209 is exposed.

After the resist 1218 is removed, oxidation treatment or nitridation treatment is performed on exposed portions of the semiconductor regions 1207 to 1209, and as shown in FIG. 48C, insulating films 1273 to 1275 are formed. The insulating films 1273 to 1275 can be formed by a method similarly to that of the insulating films 1214 and 1215 of Embodiment Mode 7. The insulating films 1273 and 1274 can form the gate insulating films of the transistors Trp and Trn formed in the logic portion 54. For example, the insulating films 1273 to 1275 can be formed in such a way that oxidation treatment is performed to the surface of the semiconductor substrate 1200 by high density plasma, and nitridation treatment is performed by high density plasma in succession.

Next, as shown in FIG. 48C, the conductive film 1222 is formed over the semiconductor substrate 1200, and the conductive film 1223 is formed over the conductive film 1222.

Subsequently, the stacked film formed of the conductive films 1222 and 1223 is etched so that the conductive films 1224 to 1228 are formed (see FIGS. 49A, 45A, and 45B). Further, the conductive films 1224 to 1227 are used as masks, and as shown in FIG. 49A, the insulating films formed below the conductive films 1224 to 1227 are etched.

The insulating film 1273 over the semiconductor region 1207 forms the gate insulating film of the transistor Trp. The insulating film 1274 over the semiconductor region 1208 forms the gate insulating film of the transistor Trn. The insulating film 1211 over the semiconductor region 1209 forms the gate insulating film of the second selection transistor S2. The insulating film 1216 over the semiconductor region 1209 forms a first insulating film of the memory transistor Tm. The first silicon nitride film 1012 and the second silicon nitride film 1013 form the charge storage layer of the memory transistor Tm. The insulating film 1271 forms the second insulating film of the memory transistor Tm.

Next, similarly to Embodiment Mode 7, the semiconductor regions 1207 to 1209 are doped with an impurity element at a low concentration to form low concentration impurity regions. Next, the spacers 1233 to 1237 that are formed of an insulating film, which are in contact with side surfaces of the conductive films 1224 to 1228, respectively are formed. Then, the semiconductor regions 1207 to 1209 are doped with an impurity element at a high concentration to form high concentration impurity regions.

Figure 49:
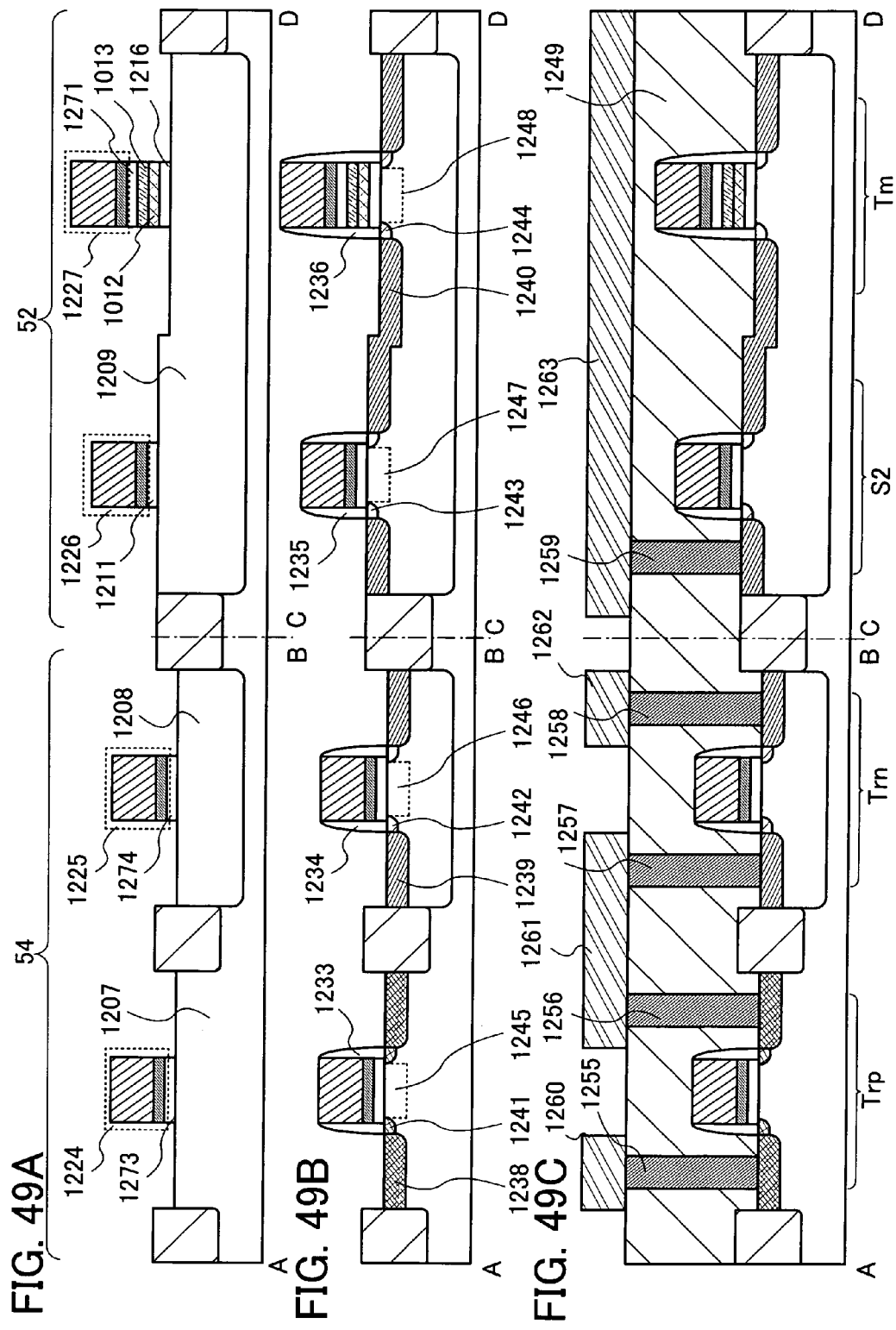
FIGS. 49A to 49C are cross-sectional views illustrating a method for manufacturing a semiconductor device.

As shown in FIG. 49B, this process is performed so that the high concentration impurity regions 1238, the low concentration impurity regions 1241, and the channel formation region 1245 are formed in a self-aligned manner in the semiconductor region 1207. In the semiconductor region 1208, the high concentration impurity regions 1239, the low concentration impurity regions 1242, the channel formation region 1246 are formed in a self-aligned manner. In the semiconductor region 1209, the high concentration impurity regions 1240, the low concentration impurity regions 1243 and 1244, and the channel formation regions 1247 and 1248 are formed in a self-aligned manner. A top view of this state is shown in FIGS. 45A and 45B.

Figure 46A:
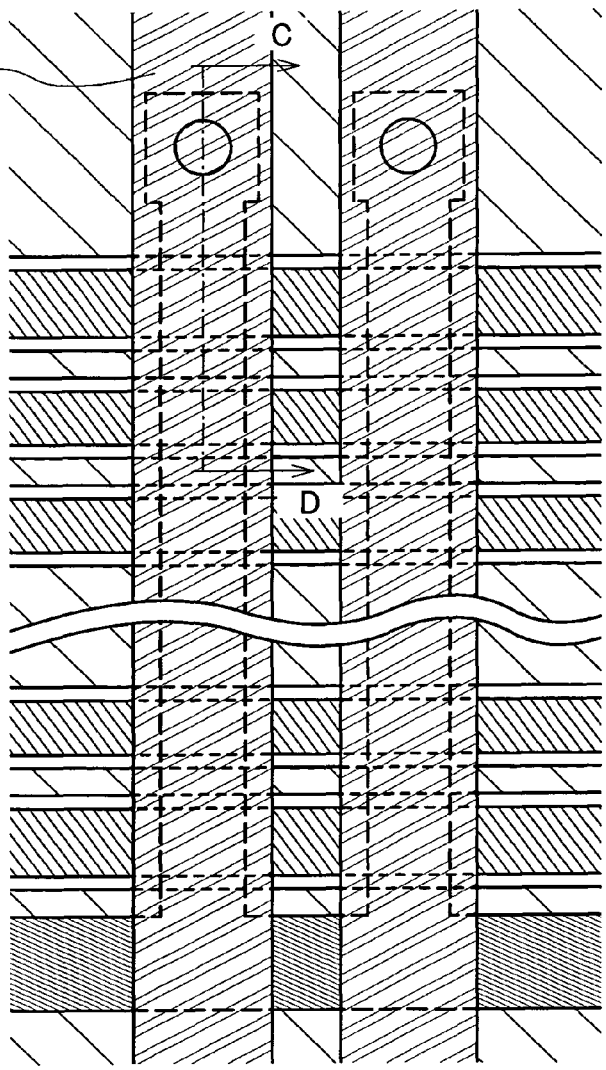
FIGS. 46A and 46B are top views illustrating a method for manufacturing a semiconductor device.
Figure 46B:
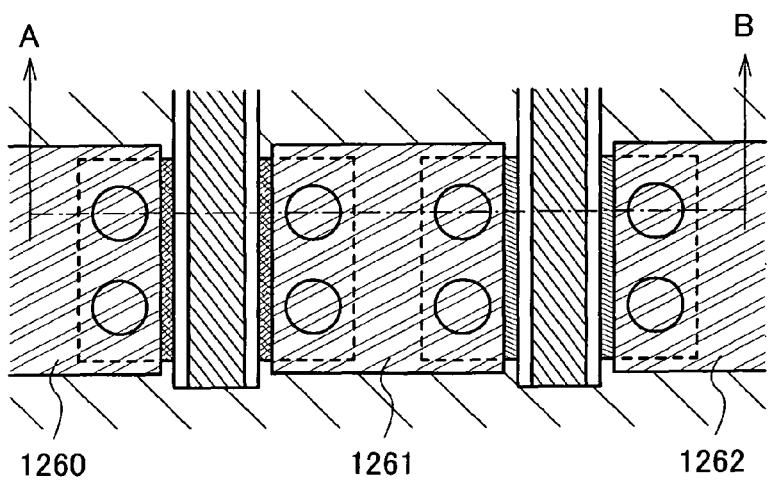

A process similar to Embodiment Mode 7 is performed, and the insulating film 1249, the conductive films 1255 to 1259, the conductive films 1260 to 1263 are formed, as shown in FIG. 49C. A top view of FIG. 49C is shown in FIGS. 46A and 46B.

By the above-described process, a nonvolatile semiconductor memory device in which the logic portion 54 and the memory cell array 52 are integrated over the semiconductor substrate 1200 can be obtained.

Embodiment Mode 9

In this embodiment mode, a semiconductor device capable of inputting and outputting data without contact will be described. The nonvolatile semiconductor memory device is used for the semiconductor device. The semiconductor device which is described in this embodiment mode is referred to as an RFID tag, an ID tag, an IC tag, an IC chip, an RF tag, a wireless tag, an electronic tag, or a wireless chip depending on the usage pattern.

Figure 50:
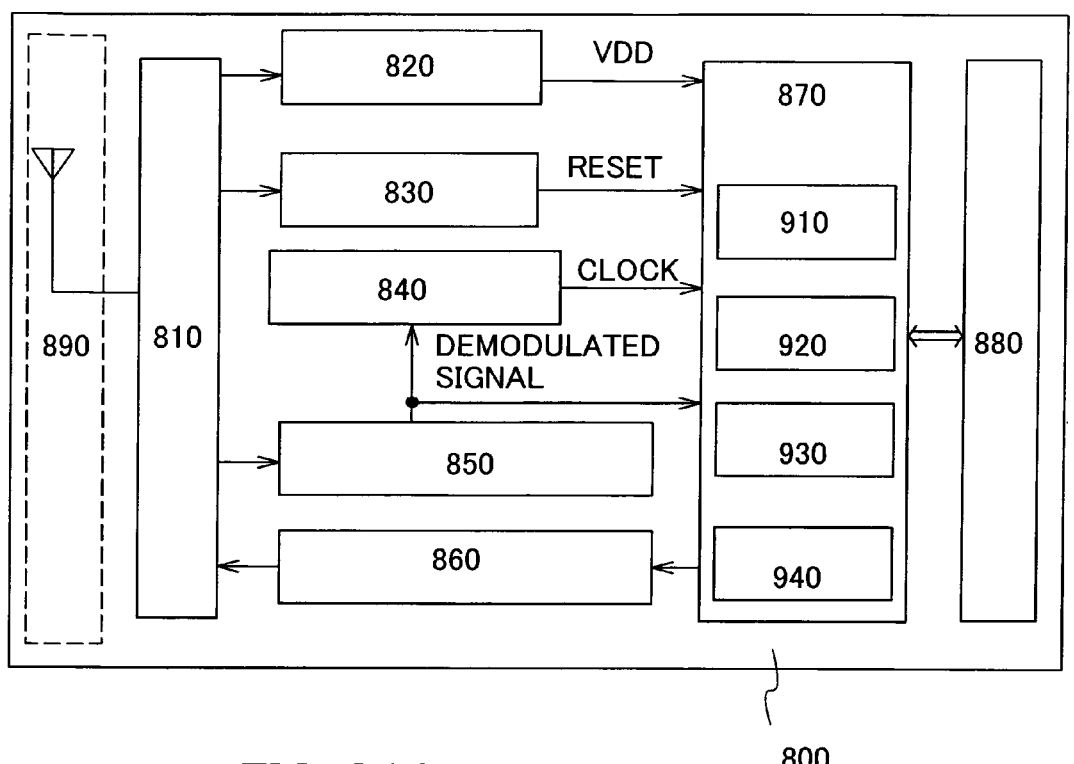
FIG. 50 is a block diagram illustrating a structural example of a semiconductor device that can transmit data without contact.

FIG. 50 is a block diagram showing a structural example of the semiconductor device capable of inputting and outputting data without contact. As shown in FIGS. 44A and 44B, a semiconductor device 800 has a function of exchanging data without contact, and includes a high-frequency circuit 810, a power supply circuit 820, a reset circuit 830, a clock generating circuit 840, a data demodulating circuit 850, a data modulating circuit 860, a control circuit 870 for controlling other circuits included in the semiconductor device 800, a memory device 880, and an antenna 890.

The high-frequency circuit 810 receives a signal from the antenna 890 and outputs a signal, which is received from the data modulating circuit 860, from the antenna 890. The power supply circuit 820 generates a power supply potential from a received signal. The reset circuit 830 generates a reset signal. The clock generating circuit 840 generates various clock signals based on a received signal input from the antenna 890. The data demodulating circuit 850 demodulates the received signal and outputs the demodulated signal to the control circuit 870. The data modulating circuit 860 modulates a signal received from the control circuit 870.

As the control circuit 870, for example, a code extracting circuit 910, a code judging circuit 920, a CRC judging circuit 930, and an output unit circuit 940 are provided. Note that the code extracting circuit 910 extracts each of plural codes included in an instruction sent to the control circuit 870. The code judging circuit 920 judges the content of the instruction by comparing the extracted code with a code corresponding to a reference. The CRC judging circuit 930 detects whether or not there is a transmission error or the like based on the judged code.

The memory device 880 includes the nonvolatile semiconductor device described in any of Embodiment Modes 1 to 8 and a ROM which is unable to be rewritten. The nonvolatile semiconductor memory device of the present invention can lower drive voltage; therefore, a communication distance extends and communication with high quality is possible.

A signal is sent from a communication device such as a reader/writer to the semiconductor device 800, and a signal sent from the semiconductor device 800 is received by the communication device, whereby data of the semiconductor device 800 can be read. Next, a communication operation of the semiconductor device 800 is described. A wireless signal is received by the antenna 890 and then sent to the power supply circuit 820 through the high-frequency circuit 810, whereby a high power supply potential (hereinafter referred to as VDD) is generated. The VDD is supplied to each circuit in the semiconductor device 800. Note that a low power supply potential (hereinafter referred to as VSS) is common in the plural circuits included in the semiconductor device 800 and the VSS can be a ground potential (GND).

A signal sent to the data demodulating circuit 850 through the high-frequency circuit 810 is demodulated (hereinafter this signal is referred to as a demodulated signal). Moreover, signals and the demodulated signals passed through the reset circuit 830 and the clock generating circuit 840 via the high-frequency circuit 810 are sent to the control circuit 870. The signals sent to the control circuit 870 are analyzed by the code extracting circuit 910, the code judging circuit 920, the CRC judging circuit 930, and the like. Then, based on the analyzed signals, information of the semiconductor device 800 stored in the memory device 880 is output. The information of the semiconductor device 800 which has been output is encoded through the output unit circuit 940. Furthermore, the encoded information of the semiconductor device 800 passes through the data modulating circuit 860 and then is sent as a wireless signal by the antenna 890.

Figure 51A:
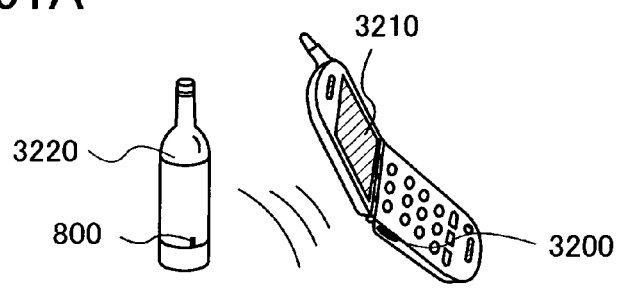
FIGS. 51A and 51B are diagrams each illustrating a usage mode of a semiconductor device that can transmit data without contact.

An example of usage of the semiconductor device 800 will be described with reference to FIGS. 51A and 51B. As shown in FIG. 51A, a side surface of a mobile terminal such as a cellular phone including a display portion 3210 is provided with a reader/writer 3200. Meanwhile, a side surface of a product 3220 is provided with the semiconductor device 800 (FIG. 51A). When the reader/writer 3200 is held over the semiconductor device 800, information stored in the semiconductor device 800 is sent and received by the reader/writer. As a result, the display portion 3210 of the mobile terminal displays information on the product, such as a material, a place of origin, an inspection result for each production step, a history of the distribution process, and a description of the product.

Figure 51B:
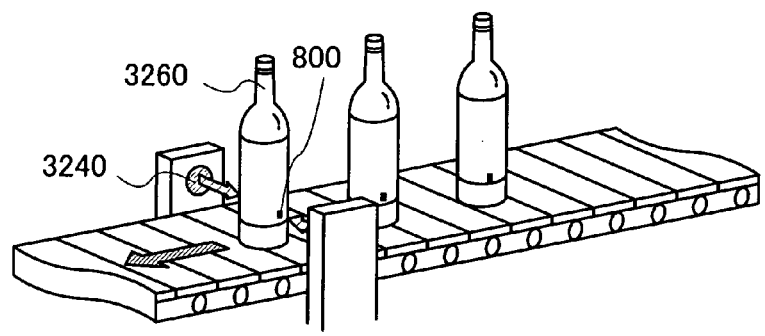

As shown in FIG. 51B, when a product 3260 is transferred by a conveyer belt, the product 3260 can be inspected with the use of the semiconductor device 800 attached to the product 3260 and a reader/writer 3240. With the use of the semiconductor device 800 capable of wireless communication in such an inspection system, a variety of information that cannot be directly displayed on the product 3260 can be obtained easily.

Embodiment Mode 10

In this embodiment mode, as a semiconductor device, electronic devices provided with a nonvolatile semiconductor memory device will be described. The present invention can be used for electronic devices provided with a nonvolatile semiconductor memory device as a memory device of all fields. For example, the following can be given: a camera such as a video camera or a digital camera, a goggle type display (a head mounted display), a navigation system, an audio reproducing device (car audio set, audio component set, or the like), a computer, a game machine, a portable information terminal (mobile computer, mobile phone, portable game machine, e-book reader, or the like), and an image reproducing device provided with a recording medium (specifically, a device provided with a display device that can reproduce a recording medium such as a digital versatile disc (DVD) and display the image), and the like. Specific examples of these electronic devices are shown in FIGS. 52A to 52E.

Figure 52A:
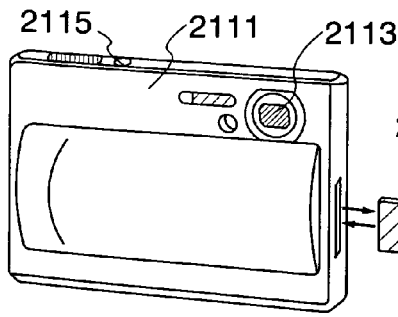
FIGS. 52A to 52E are outside views of electronic devices having a nonvolatile semiconductor memory device.
Figure 52B:
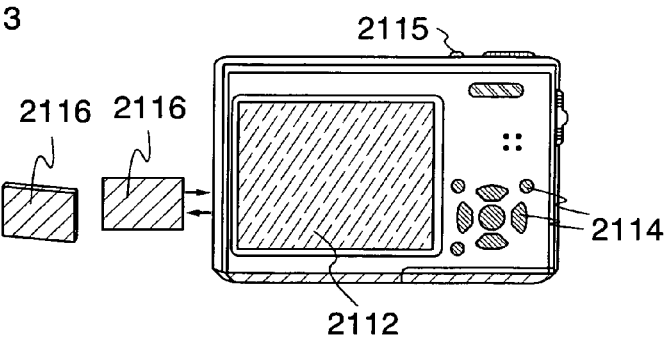

FIGS. 52A and 52B show a digital camera. FIG. 52B is a view showing the back of the digital camera shown in FIG. 52A. This digital camera shown in FIGS. 52A and 52B includes a chassis 2111, a display portion 2112, a lens 2113, operation keys 2114, a shutter button 2115, a storage medium 2116 provided with a nonvolatile semiconductor memory device, and the like. The chassis 2111 has a structure in which users can take out the storage medium 2116. In the digital camera, a still image or a dynamic image which is taken, or audio data which is recorded can be stored in the storage medium 2116. The nonvolatile semiconductor memory device described in any of Embodiment Modes 2 to 8 is applied to the storage medium 2116.

Figure 52C:
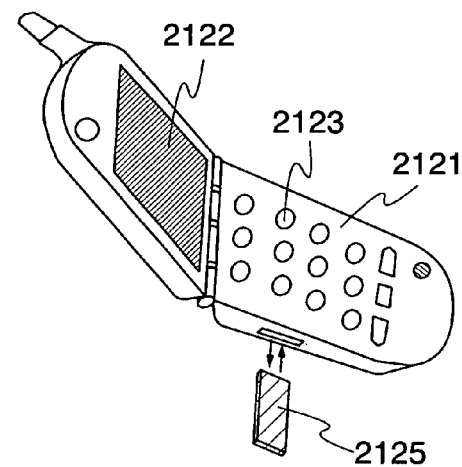

FIG. 52C is an outside view of a cellular phone. The cellular phone is a typical example of a mobile terminal. The cellular phone includes a chassis 2121, a display portion 2122, operation keys 2123, and the like. The cellular phone is provided with a storage medium 2125 including a nonvolatile semiconductor memory device. The chassis 2121 has a structure in which the storage medium 2125 can be taken out. Data such as phone numbers, image data, music data, audio data, or the like included in the cellular phone can be stored in the storage medium 2125, and the image data, music data, or audio data stored in the storage medium 2125 can be reproduced by the cellular phone. The nonvolatile semiconductor memory device described in any of Embodiment Modes 2 to 8 is applied to the storage medium 2125.

Figure 52D:
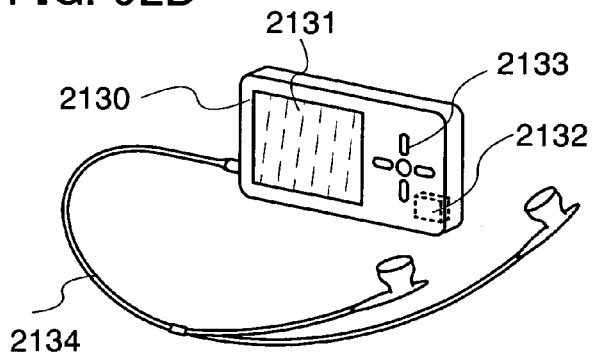

FIG. 52D is an outside view of a digital player. The digital player is a typical example of an audio device. The digital player includes a main body 2130, a display portion 2131, an operation portion 2133, earphones 2134, and the like. Note that, headphones or wireless earphones can be used instead of the earphone 2134. A storage medium 2132 provided with a nonvolatile semiconductor memory device is incorporated in the main body 2130 of the digital player. The nonvolatile semiconductor memory device described in any of Embodiment Modes 2 to 8 is applied to the storage medium 2132. The main body 2130 may have a structure in which users can take out the storage medium 2132.

For example, a NAND type nonvolatile semiconductor memory device with a memory capacity of 20 to 200 gigabytes (GB) can be used for the storage medium 2132. The operation portion 2133 is operated, whereby a still image, a dynamic image, audio data, or music data can be stored in the storage medium 2132, and the stored data can be reproduced.

Figure 52E:
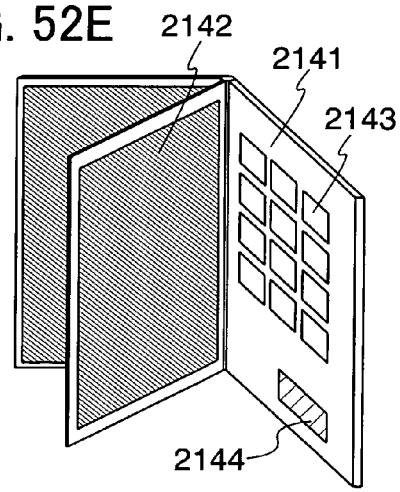

FIG. 52E is an outside view of an e-book reader (also referred to as electronic paper). This e-book reader includes a main body 2141, a display portion 2142, operation keys 2143, and a storage medium 2144. A modem may be built in the main body 2141, or a structure in which information can be sent and received wirelessly may be employed. The nonvolatile semiconductor memory device described in any of Embodiment Modes 2 to 8 can be applied to the storage medium 2144. For example, a NAND type nonvolatile semiconductor memory device with a memory capacity of 20 to 200 gigabytes (GB) can be used. The operation keys 2143 are operated, whereby a still image, a dynamic image, audio data, or music data can be recorded in the storage medium 2144, and stored data can be reproduced. The main body 2141 may have a structure in which users can take out the storage medium 2144.

As described above, an application range of the semiconductor device of the present invention is extremely wide, and the semiconductor device of the present invention can be applied to electronic devices of all fields as long as the electronic devices have a storage medium. A nonvolatile storage medium in which a charge retention characteristic is improved is provided so that reliability of memory performance of the electronic devices can be improved.

Embodiment 1

Figure 53:
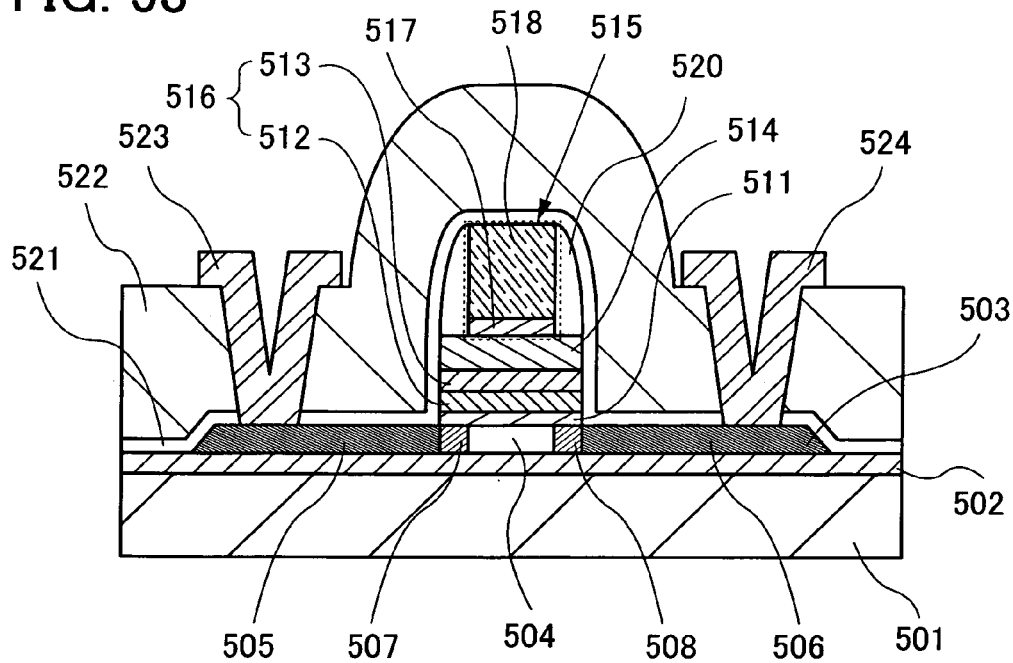
FIG. 53 is a cross-sectional view illustrating a structure of a nonvolatile memory transistor of an embodiment.

In this embodiment, a charge retention characteristic of a memory transistor of the present invention will be described. FIG. 53 is a cross-sectional view of a nonvolatile memory transistor of the present invention. This nonvolatile memory transistor is referred to as a "Memory Transistor TM-1".

The Memory Transistor TM-1 is formed over a glass substrate 501. A base insulating film 502 is formed over the glass substrate 501. A silicon film 503 that forms a semiconductor region is formed over the base insulating film 502. In the silicon film 503, a channel formation region 504, a source region 505, a drain region 506, a low concentration impurity region 507, and a low concentration impurity region 508 are formed. The regions 505 to 508 are n-type impurity regions, and the Memory Transistor TM-1 is an n-channel transistor.

A first insulating film 511, a first silicon nitride film 512, a second silicon nitride film 513, a second insulating film 514, and a gate electrode 515 are stacked over the silicon film 503. A stacked film of the first silicon nitride film 512 and the second silicon nitride film 513 forms a charge storage layer 516. The gate electrode 515 is formed of a conductive film having a two-layer structure including a tantalum nitride film 517 and a tungsten film 518.

In the Memory Transistor TM-1, each side surface of the gate electrode 515 is provided with a spacer 520 formed of an insulating film. An insulating film 521 and an insulating film 522 which cover the silicon film 503, the first insulating film 511, the charge storage layer 516, the second insulating film 514, the gate electrode 515, and the spacer 520 are formed over the glass substrate 501. A source electrode 523 which is connected to the source region 505 and a drain electrode 524 which is connected to the drain region 506 are formed over the insulating film 522.

In the Memory Transistor TM-1, the first silicon nitride film 512 is a film which is formed using $NH_3$ as a nitrogen source gas by a plasma CVD method, and the second silicon nitride film 513 is a film which is formed using $N_2$ as a source gas by a plasma CVD method. That is, the first silicon nitride film 512 is a film that contains a larger number of N—H bonds, and the second silicon nitride film 513 is a film that contains a smaller number of N—H bonds.

As comparative examples, three kinds of nonvolatile memory transistors each having a different charge storage layer 516 are formed. One is a nonvolatile memory transistor in which the charge storage layer 516 is formed only of the first silicon nitride film 512. This memory transistor is referred to as a "Comparative Memory Transistor TM-A". Another is a nonvolatile memory transistor in which the charge storage layer 516 is formed only of the second silicon nitride film 513. This memory transistor is referred to as a "Comparative Memory Transistor TM-B". The other is a nonvolatile memory transistor in which the second silicon nitride film 513 and the first silicon nitride film 512 are stacked in this order as the charge storage layer 516. This memory transistor is referred to as a "Comparative Memory Transistor TM-C".

Figure 54A:
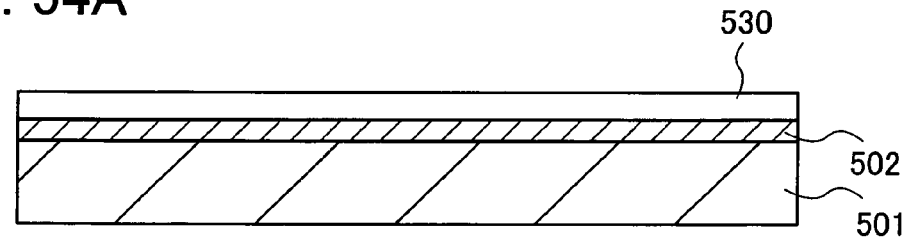
FIGS. 54A to 54C are cross-sectional views illustrating a method for manufacturing a nonvolatile memory transistor.
Figure 54B:
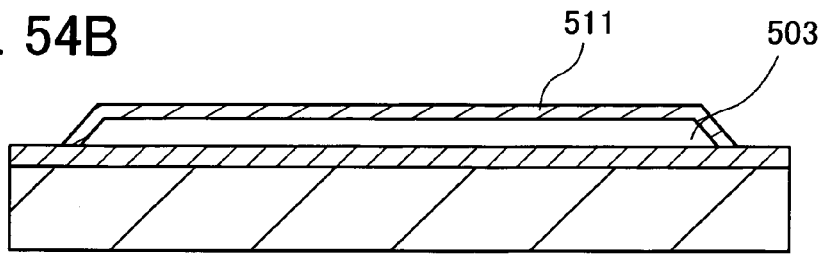

Next, a method for manufacturing the Memory Transistor TM-1 will be described with reference to FIGS. 54A to 54C, 55A to 55C, 56A to 56C, and 57A to 57D. First, as shown in FIG. 54A, the base insulating film 502 is formed over the glass substrate 501, and a crystalline silicon film 530 is formed over the base insulating film 502. Here, the base insulating film 502 has a two-layer structure. A silicon oxynitride film having a thickness of 50 nm is formed as the first layer using $SiH_4$, $NH_3$, and $N_2O$ as a process gas by a plasma CVD method, and a silicon oxynitride film having a thickness of 100 nm is formed as the second layer using $SiH_4$ and $N_2O$ as a process gas. The first silicon oxynitride film contains more nitrogen than oxygen, and the second silicon oxynitride film contains more oxygen than nitrogen.

The crystalline silicon film 530 is a film obtained by crystallizing an amorphous silicon film. First, an amorphous silicon film having a thickness of 66 nm is formed over the base insulating film 502 by a plasma CVD method using $SiH_4$ as a process gas. Next, by irradiation with the second harmonic (532 nm) of a continuous-wave Nd:$YVO_4$ laser (fundamental wave of 1064 nm), the amorphous silicon film is crystallized to form the crystalline silicon film 530. Next, in order to control the threshold voltage of the Memory Transistor TM-1, the crystalline silicon film 530 is doped with boron by an ion doping apparatus.

A resist mask is formed over the crystalline silicon film 530. By use of this resist mask, the crystalline silicon film 530 is etched into a desired shape to form the silicon film 503. After the resist mask is removed, the first insulating film 511 is formed (see FIG. 54B). In a high density plasma processing apparatus which generates plasma by a microwave, the solid-phase oxidation treatment and the solid-phase nitridation treatment are performed on the silicon film 503, whereby the first insulating film 511 is formed.

Figure 54C:
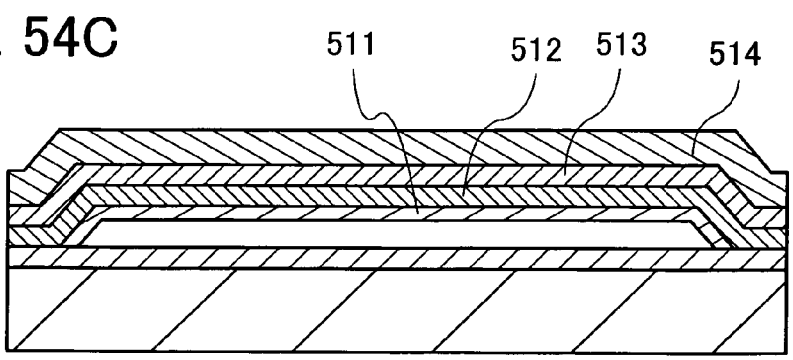

Next, the first silicon nitride film 512 having a thickness of 5 µm, the second silicon nitride film 513 having a thickness of 5 nm, and the second insulating film 514 having a thickness of 10 nm are formed in succession over the first insulating film 511, in the same plasma CVD apparatus (see FIG. 54C).

For the formation of the first silicon nitride film 512, $NH_3$ is used as a nitrogen source gas and $SiH_4$ is used as a silicon source gas. $SiH_4$ at a flow rate of 2 sccm and $NH_3$ at a flow rate of 400 sccm are supplied to a reaction chamber. In addition, the substrate temperature is set at 400° C., the reaction pressure is set at 40 Pa, the distance between electrodes is set at 30 mm, and the RF power is set at 100 W.

For the formation of the second silicon nitride film 513, $N_2$ is used as a nitrogen source gas, $SiH_4$ is used as a silicon source gas, and Ar is added to a process gas. $SiH_4$ at a flow rate of 2 sccm, $N_2$ at a flow rate of 400 sccm, and Ar at a flow rate of 50 sccm are supplied to a reaction chamber. Similarly to when the first silicon nitride film 512 is formed, the substrate temperature is set at 400° C., the reaction pressure is set at 40 Pa, the distance between electrodes is set at 30 mm, and the RF power is set at 100 W.

The second insulating film 514 is a silicon oxynitride film which has a thickness of 10 nm and contains more oxygen than nitrogen in all the memory transistors, and $SiH_4$ and $N_2O$ are used as a process gas. $SiH_4$ at a flow rate of 1 sccm and $N_2O$ at a flow rate of 800 sccm are supplied to a reaction chamber. In addition, the substrate temperature is set at 400° C., the reaction pressure is set at 40 Pa, the distance between electrodes is set at 28 mm, and the RF power is set at 150 W.

In a process of FIG. 54C, in the Comparative Memory Transistor TM-A, the first silicon nitride film 512 having a thickness of 10 nm and the second insulating film 514 are formed in succession, and in the Comparative Memory Transistor TM-B, the second silicon nitride film 513 having a thickness of 10 nm and the second insulating film 514 are formed in succession. In the Comparative Memory Transistor TM-C, the second silicon nitride film 513 having a thickness of 5 nm, the first silicon nitride film 512 having a thickness of 5 nm, and the second insulating film 514 having a thickness of 10 nm are formed in succession. Each of the comparative memory transistors TM-A, TM-B, and TM-C are formed by a process similar to the manufacturing process of the Memory Transistor TM-1 other than the process of FIG. 54C.

In the Comparative Memory Transistor TM-A and the Comparative Memory Transistor TM-C, the film formation conditions of the first silicon nitride film 512 are common to those of the Memory Transistor TM-1. In the Comparative Memory Transistor TM-B and the Comparative Memory Transistor TM-C, the film formation conditions of the second silicon nitride film 513 are common to those of the Memory Transistor TM-1. Table 5 shows a structure of the charge storage layer 516 of each memory transistor.

TABLE 5

| | Process gases and Flow rate thereof [sccm] | Memory Transistor | | | |
|---|---|---|---|---|---|
| | | TM-1 | TM-A | TM-B | TM-C |
| First SiN film 512 | SiH$_4$/NH$_3$ = 2/400 | 5 nm (Lower layer) | 10 nm | | 5 nm (Upper layer) |
| Second SiN film 513 | SiH$_4$/N$_2$/Ar = 2/400/50 | 5 nm (Upper layer) | | 10 nm | 5 nm (Lower layer) |

Figure 55A:
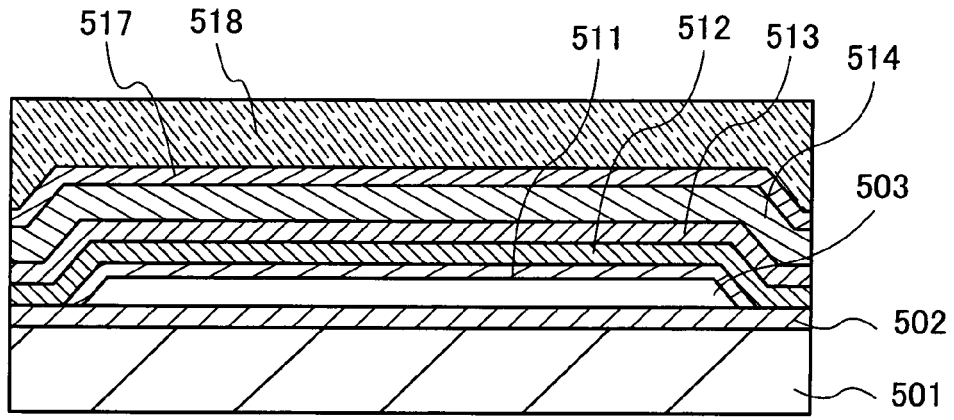
FIGS. 55A to 55C are cross-sectional views illustrating a method for manufacturing a nonvolatile memory transistor.
Figure 55B:
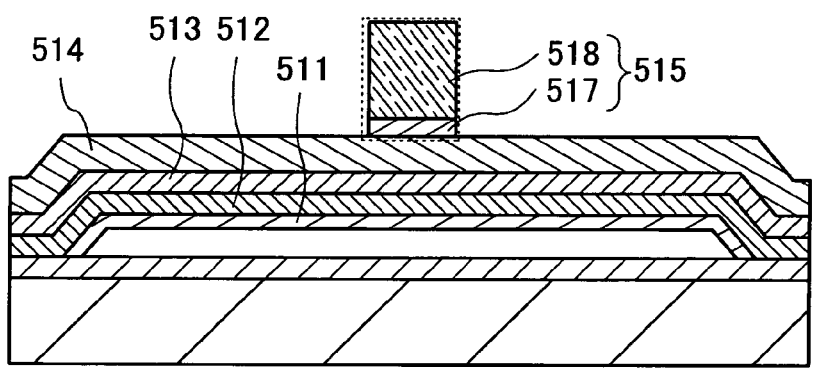

Next, the tantalum nitride film 517 having a thickness of 30 nm is formed over the second insulating film 514, and then, the tungsten film 518 having a thickness of 370 nm is formed (see FIG. 55A). The tantalum nitride film 517 and the tungsten film 518 are formed by a sputtering apparatus.

Next, a stacked film of the tantalum nitride film 517 and the tungsten film 518 is etched, and the gate electrode 515 is formed. First, a resist mask is formed over the tungsten film 518. By use of this resist mask, the tungsten film 518 is etched. The tungsten film 518 is etched by a plasma etching apparatus, and CF$_4$, Cl$_2$ and O$_2$ are used as an etching gas. After the resist mask is removed, the etched tungsten film 518 is used as a mask, and the tantalum nitride film 517 is etched. The tantalum nitride film 517 is etched by a plasma etching apparatus, and Cl$_2$ is used as an etching gas. As described above, the gate electrode 515 is formed (see FIG. 55B).

Figure 55C:
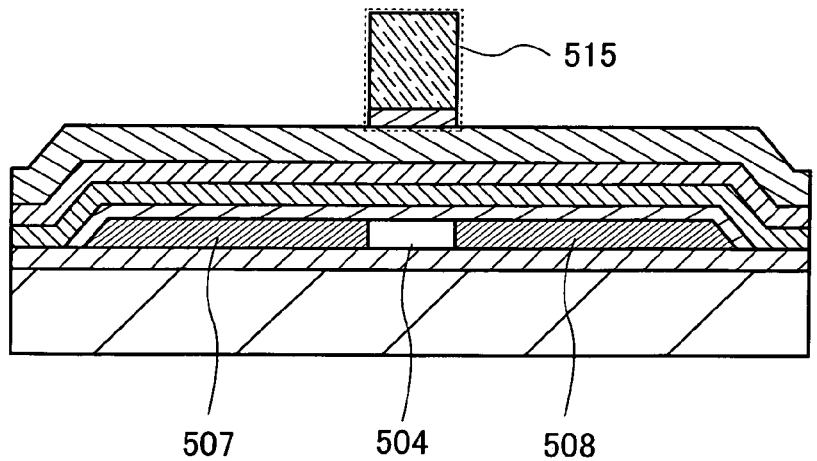

Next, in order to form a high-resistance impurity region in the Memory Transistor TM-1, the gate electrode 515 is used as a mask, and the silicon film 503 is doped with phosphorus. This process is performed by a plasma doping apparatus. A process gas is PH$_3$, and a dose is $1 \times 10^{13}$ ions/cm$^2$. In this process, the channel formation region 504, the low concentration impurity region 507, and the low concentration impurity region 508 are formed in a self-aligned manner in the silicon film 503 (FIG. 55C).

Figure 56A:
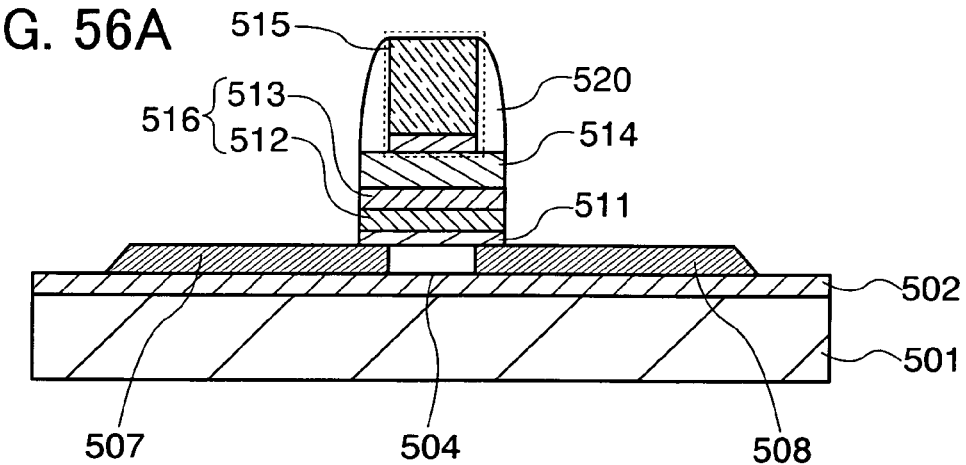
FIGS. 56A to 56C are cross-sectional views illustrating a method for manufacturing a nonvolatile memory transistor.
Figure 56B:
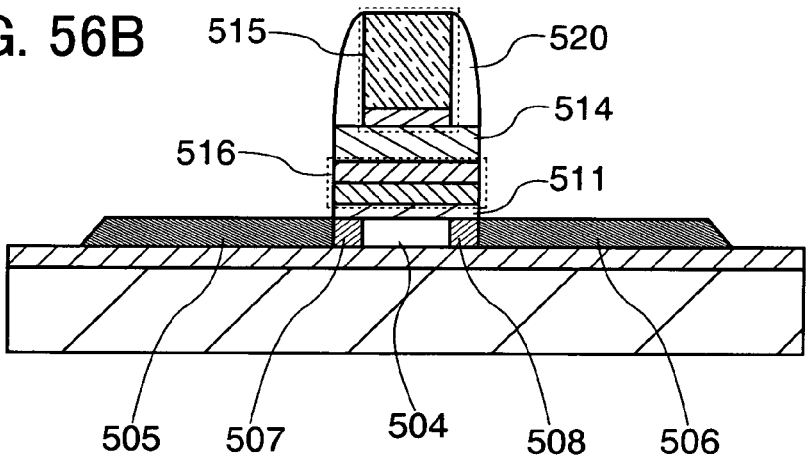

Next, as shown in FIG. 56A, each side surface of the gate electrode 515 is provided with the spacer 520. The spacer 520 is formed in such a way that an insulating film that forms the spacer 520 is formed to cover the gate electrode 515, the second insulating film 514, the charge storage layer 516, the first insulating film 511, and the silicon film 503, and this insulating film is etched. Here, two insulating films that form the spacer 520 are formed. A silicon oxynitride film having a thickness of 100 nm is formed by a plasma CVD method as the first layer, and a silicon oxide film having a thickness of 200 nm is formed by a low-pressure CVD method as the second layer. The second insulating film 514, the second silicon nitride film 513, and the first silicon nitride film 512 are also etched by the etching treatment by which the spacer 520 is formed. As shown in FIG. 56A, the charge storage layer 516 formed of the first silicon nitride film 512 and the second silicon nitride film 513 is formed.

Next, in order to form the source region 505 and the drain region 506, the silicon film 503 is doped with phosphorus using the gate electrode 515 and the spacer 520 as masks. In this process, a plasma doping apparatus is used, PH$_3$ is used as a process gas, and a dose is $3 \times 10^{15}$ ions/cm$^2$. In this process, the source region 505 and the drain region 506 are formed in a self-aligned manner in the silicon film 503 (see FIG. 56B).

Figure 56C:
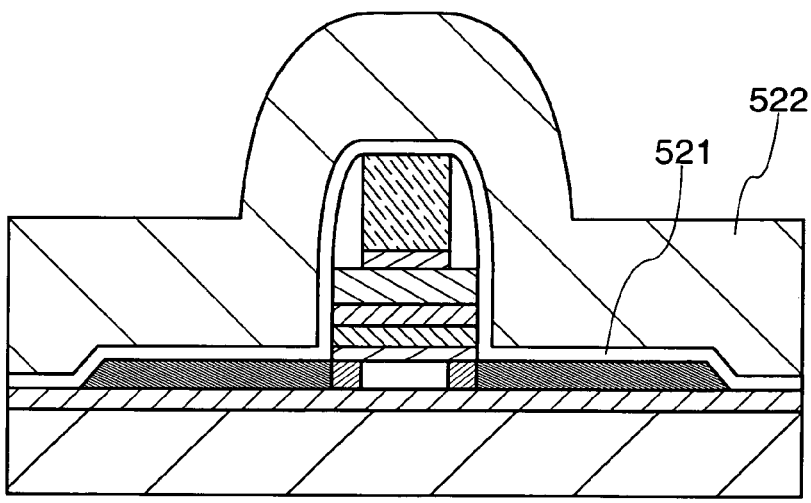

Next, the insulating film 521 and the insulating film 522 are formed over the entire surface of the glass substrate 501 (FIG. 56C). As the insulating film 521, a silicon oxynitride film which has a thickness of 100 nm and contains hydrogen is formed. This silicon oxynitride film is formed by a plasma CVD apparatus, and SiH$_4$, NH$_3$, and N$_2$O are used as a process gas. As the insulating film 522, a silicon oxynitride film having a thickness of 600 nm is formed by a plasma CVD method. For the process gas of this silicon oxynitride film, SiH$_4$ and N$_2$O are used.

After the insulating film 522 is formed, heat treatment is performed on the silicon film 503 by a heating furnace. This heat treatment is treatment to activate boron and phosphorus added to the silicon film 503, and to hydrogenate the silicon film 503 with hydrogen contained in the insulating film 521.

Next, contact holes to reach the source region 505 and the drain region 506 are formed in the insulating film 521 and the insulating film 522. A conductive film that forms the source electrode 523 and the drain electrode 524 is formed over the insulating film 522. Here, the conductive film has a four-layer structure. The first layer is a titanium film having a thickness of 60 nm, the second layer is a titanium nitride film having a thickness of 40 nm, the third layer is a pure aluminum film having a thickness of 300 nm, and the fourth layer is a titanium nitride film having a thickness of 100 nm. This conductive film is etched, and the source electrode 523 and the drain electrode 524 are formed (FIG. 53). As described above, the Memory Transistor TM-1 is completed. In addition, the comparative memory transistors TM-A, TM-B, and TM-C are formed similarly.

Figure 57A:
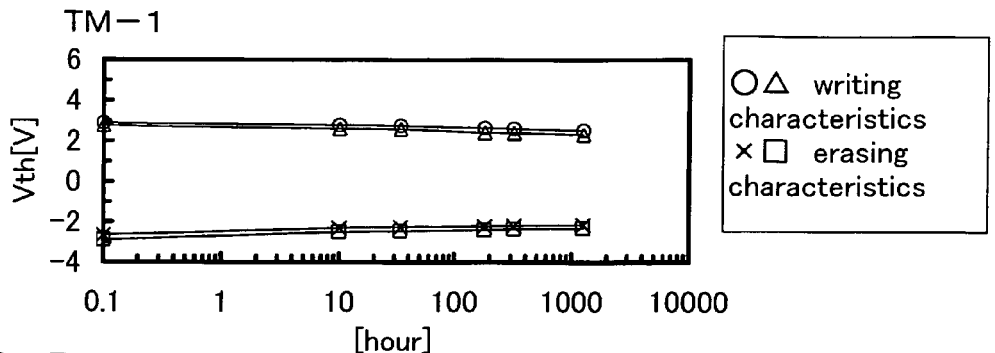
FIGS. 57A to 57D are graphs showing retention characteristics of memory transistors of an embodiment and comparative examples.
Figure 57B:
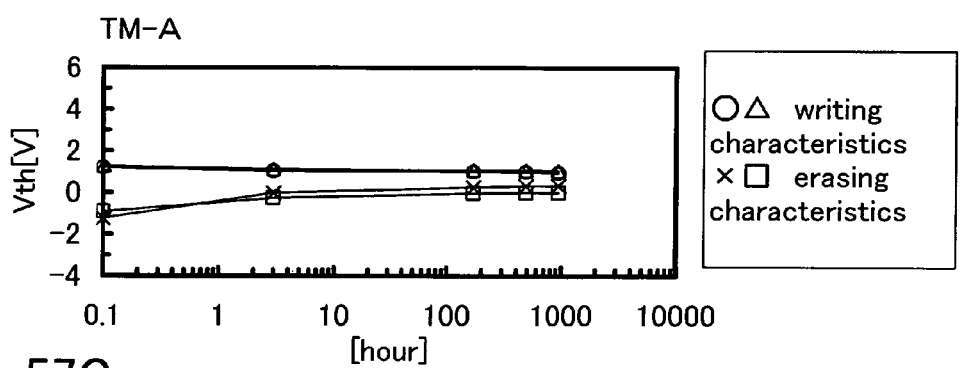
Figure 57C:
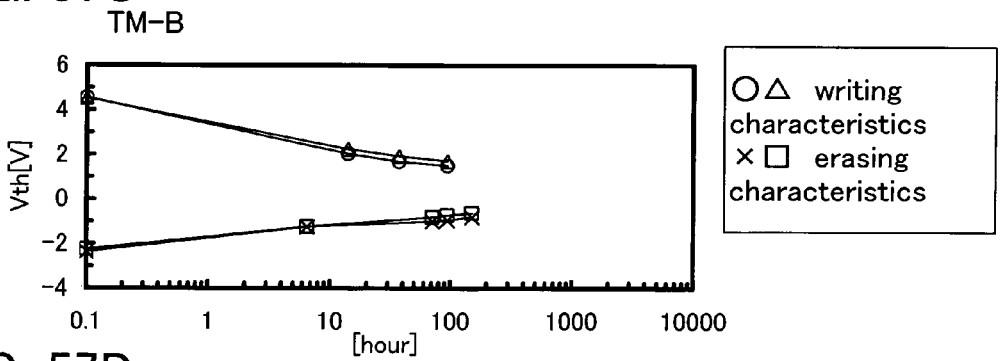
Figure 57D:
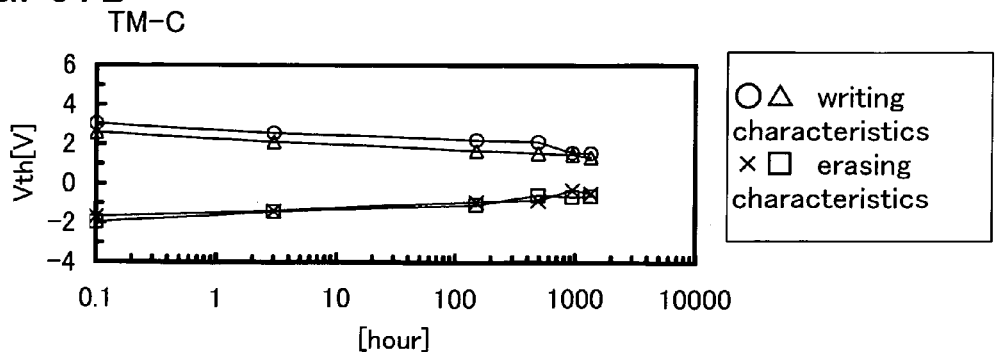

In order to evaluate a charge retention characteristic of each memory transistor, the characteristic of drain/source current $I_{DS}$-gate/source voltage $V_{GS}$ (hereinafter referred to as an $I_{DS}$-$V_{GS}$ characteristic) after the writing operation, and the $I_{DS}$-$V_{GS}$ characteristic after the erasing operation are measured. From this measurement results, each retention characteristic is obtained. FIG. 57A is a graph of a retention characteristic of the Memory Transistor TM-1. FIGS. 57B to 57D are graphs of retention characteristics of the comparative examples. FIG. 57B is a graph of a retention characteristic of the Comparative Memory Transistor TM-A. FIG. 57C is a graph of a retention characteristic of the Comparative Memory Transistor TM-B. FIG. 57D is a graph of a retention characteristic of the Comparative Memory Transistor TM-C. The horizontal axis of each graph shows the elapsed time from the writing operation and the erasing operation. Note that because the horizontal axis is a log scale, a point when the writing operation is performed and a point when the erasing operation is performed are expressed as 0.1 hour. The vertical axis is threshold voltage Vth of each memory transistor calculated from the measurement results of the $I_{DS}$-$V_{GS}$ characteristics.

The writing operation is performed in such a way that the potential of the source electrode 523 and the potential of the drain electrode 524 are set at 0 V, a writing voltage Wr is applied to the gate electrode 515 at 1 millisecond, and electrons are injected into the charge storage layer 516. The erasing operation is performed in the memory transistor in such a way that the potential of the source electrode 523 and the potential of the drain electrode 524 are set at 0 V, an erasing voltage Er is applied to the gate electrode 515 at 1 millisecond. The writing voltage Wr and the erasing voltage Er to each memory transistor are applied using a pulse generator expander made by Agilent Technologies Inc. (SMU and Pulse Generator Expander, model: 41501B). In addition, the writing voltage Wr and the erasing voltage Er of each memory transistor are set as follows: for the Memory Transistor TM-1, Wr=18 V and Er=−18 V; for the Comparative Memory Transistor TM-A, Wr=18 V and Er=−18 V; for the Comparative Memory Transistor TM-B, Wr=18.5 V and Er=−18.5 V; and for the Comparative Memory Transistor TM-C, Wr=17 V and Er=−17V.

The measurement of $I_{DS}$-$V_{GS}$ characteristics after the writing operation of the memory transistor was performed as follows. First, the writing operation in which data was written to the memory transistor is performed. Next, a state that the memory transistor which was in a writing state is heated at 85° C. by a hot plate was kept, and after predetermined time passed from the writing operation, the $I_{DS}$-$V_{GS}$ characteristics of each memory transistor were measured. In addition, the measurement of the $I_{DS}$-$V_{GS}$ characteristics after the erasing operation was performed as follows. After data was written to the memory transistor by the writing operation, the erasing operation was performed. A state that the memory transistor which was in an erasing state was heated at 85° C. by a hot plate was kept, and after a predetermined time passed from the erasing operation, the $I_{DS}$-$V_{GS}$ characteristics of each memory transistor were measured.

The measurement of the $I_{DS}$-$V_{GS}$ characteristics was performed using a semiconductor parameter analyzer made by Agilent Technologies Inc. (Semiconductor Parameter Analyzer, model: 4155C). At the time of measurement, the potential of the source electrode 523 was held at 0 V and the potential of the drain electrode 524 was held at 1 V, the potential of the gate electrode 515 was changed from −6 V to +6 V, and a change of drain/source current $I_{DS}$ with respect to the gate/source voltage $V_{GS}$ was measured. Note that the Memory Transistor TM-1 has a channel length L of 4 µm and a channel width W of 8 µm. The comparative memory transistors TM-A, TM-B, and TM-C each have a channel length L of 4 µm and a channel width W of 4 µm.

The graphs shown in FIGS. 57A to 57D show that the Memory Transistor TM-1 has the widest Vth window. That is, a charge storage layer in which a silicon nitride film in which $NH_3$ is used as a nitrogen source gas and a silicon nitride film in which $N_2$ is used as a nitrogen source gas are stacked is provided so that a charge retention characteristic of a nonvolatile memory transistor can be improved. In other words, the charge storage layer in which the silicon nitride film that contains a larger number of N—H bonds and the silicon nitride film that contains a smaller number of N—H bonds are stacked is provided so that the charge retention characteristic of the nonvolatile memory transistor can be improved.

This application is based on Japanese Patent Application serial No. 2007-077930 filed with Japan Patent Office on Mar. 23, 2007, the entire contents of which are hereby incorporated by reference.

What is claimed is:

1. A method for manufacturing a semiconductor device including a nonvolatile semiconductor memory element, comprising steps of:

forming a semiconductor region including a source region, a drain region, and a channel formation region;

forming a first insulating film over the semiconductor region;

forming a first silicon nitride film over the first insulating film by using a first silicon source gas and a first nitrogen source gas comprising hydronitrogen as source materials by a first chemical vapor deposition method;

forming the second silicon nitride film over the first silicon nitride film by using a second silicon source gas and a second nitrogen source gas which does not contain hydrogen in a composition as source materials by a second chemical vapor deposition method; and forming a conductive film formed over the second silicon nitride film.

2. The method for manufacturing the semiconductor device according to claim 1, further comprising a step of forming a second insulating film over the second silicon nitride film before forming the conductive film.

3. The method for manufacturing the semiconductor device according to claim 1, wherein an $NH_2H_2N$ gas is used during forming the first silicon nitride film.

4. The method for manufacturing the semiconductor device according to claim 1, wherein the first silicon nitride film and the second silicon nitride film are formed in succession in a same reaction chamber.

5. The method for manufacturing the semiconductor device according to claim 1, wherein the first silicon nitride film is formed by a plasma CVD method.

6. The method for manufacturing the semiconductor device according to claim 1, wherein the second silicon nitride film is formed by a plasma CVD method.

7. The method for manufacturing the semiconductor device according to claim 1, wherein when the first silicon nitride film is formed by a plasma CVD method, a temperature of a surface over which the first silicon nitride film is formed is set at less than or equal to 600° C.

8. The method for manufacturing the semiconductor device according to claim 1, wherein when the second silicon nitride film is formed by a plasma CVD method, a temperature of a surface over which the second silicon nitride film is formed is set at less than or equal to 600° C.

9. The method for manufacturing the semiconductor device according to claim 1, wherein each of the first and second silicon source gases is a gas selected from $SiH_4$, $Si_2H_6$, $SiCl_4$, $SiHCl_3$, $SiH_2Cl_2$, $SiH_3Cl_3$, and $SiF_4$.

10. The method for manufacturing the semiconductor device according to claim 1, wherein the semiconductor region is formed over one of a glass substrate and a quartz substrate.

11. The method for manufacturing the semiconductor device according to claim 1, wherein the semiconductor region is formed in a semiconductor substrate.

12. The method for manufacturing the semiconductor device according to claim 11, wherein the semiconductor substrate is any one of a single-crystal silicon substrate, a polycrystalline silicon substrate, a single-crystal silicon germanium substrate, a polycrystalline silicon germanium substrate, a single-crystal germanium substrate, and a polycrystalline germanium substrate.

13. The method for manufacturing the semiconductor device according to claim 11, wherein the semiconductor substrate is any one of an SOI (silicon on insulator) substrate, an SGOI (silicon-germanium on insulator) substrate, and a GOI (germanium on insulator) substrate.

14. A method for manufacturing a semiconductor device including a nonvolatile semiconductor memory element, comprising steps of:

forming a semiconductor region including a source region, a drain region, and a channel formation region;

forming a first insulating film over the semiconductor region;

forming a first silicon nitride film over the first insulating film by using a first silicon source gas and $NH_3$ gas as source materials by a first chemical vapor deposition method;

forming the second silicon nitride film over the first silicon nitride film by using a second silicon source gas and $N_2$ gas as source materials by a second chemical vapor deposition method; and forming a conductive film formed over the second silicon nitride film.

15. The method for manufacturing the semiconductor device according to claim 14, further comprising a step of forming a second insulating film over the second silicon nitride film before forming the conductive film.

16. The method for manufacturing the semiconductor device according to claim 14, wherein the first silicon nitride film and the second silicon nitride film are formed in succession in a same reaction chamber.

17. The method for manufacturing the semiconductor device according to claim 14, wherein the first silicon nitride film is formed by a plasma CVD method.

18. The method for manufacturing the semiconductor device according to claim 14, wherein the second silicon nitride film is formed by a plasma CVD method.

19. The method for manufacturing the semiconductor device according to claim 14, wherein when the first silicon nitride film is formed by a plasma CVD method, a temperature of a surface over which the first silicon nitride film is formed is set at less than or equal to 600° C.

20. The method for manufacturing the semiconductor device according to claim 14, wherein when the second silicon nitride film is formed by a plasma CVD method, a temperature of a surface over which the second silicon nitride film is formed is set at less than or equal to 600° C.

21. The method for manufacturing the semiconductor device according to claim 14, wherein each of the first and second silicon source gases is a gas selected from $SiH_4$, $Si_2H_6$, $SiCl_4$, $SiHCl_3$, $SiH_2Cl_2$, $SiH_3Cl_3$, and $SiF_4$.

22. The method for manufacturing the semiconductor device according to claim 14, wherein the semiconductor region is formed over one of a glass substrate and a quartz substrate.

23. The method for manufacturing the semiconductor device according to claim 14, wherein the semiconductor region is formed in a semiconductor substrate.

24. The method for manufacturing the semiconductor device according to claim 23, wherein the semiconductor substrate is any one of a single-crystal silicon substrate, a polycrystalline silicon substrate, a single-crystal silicon germanium substrate, a polycrystalline silicon germanium substrate, a single-crystal germanium substrate, and a polycrystalline germanium substrate.

25. The method for manufacturing the semiconductor device according to claim 23, wherein the semiconductor substrate is any one of an SOI (silicon on insulator) substrate, an SGOI (silicon-germanium on insulator) substrate, and a GOI (germanium on insulator) substrate.

* * * * *

UNITED STATES PATENT AND TRADEMARK OFFICE
CERTIFICATE OF CORRECTION

| | | |
|---|---|---|
| PATENT NO. | : 7,851,296 B2 | Page 1 of 1 |
| APPLICATION NO. | : 12/076522 | |
| DATED | : December 14, 2010 | |
| INVENTOR(S) | : Kosei Noda et al. | |

It is certified that error appears in the above-identified patent and that said Letters Patent is hereby corrected as shown below:

At column 44, line 5, "the second silicon nitride film" should be -- a second silicon nitride film --;

At column 45, line 7, "the second silicon nitride film" should be -- a second silicon nitride film --.

Signed and Sealed this
Twenty-sixth Day of July, 2011

David J. Kappos
*Director of the United States Patent and Trademark Office*